US012243929B2

(12) United States Patent
Shen et al.

(10) Patent No.: US 12,243,929 B2
(45) Date of Patent: Mar. 4, 2025

(54) FORMING A DUMMY GATE STRUCTURE

(71) Applicant: Taiwan Semiconductor Manufacturing Company, Ltd., Hsinchu (TW)

(72) Inventors: Yan-Ting Shen, Hsinchu (TW); Yu-Li Lin, Kaohsiung (TW); Jui Fu Hsieh, Zhubei (TW); Chih-Teng Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 373 days.

(21) Appl. No.: 17/661,130

(22) Filed: Apr. 28, 2022

(65) Prior Publication Data

US 2023/0352559 A1 Nov. 2, 2023

(51) Int. Cl.
*H01L 29/66* (2006.01)
(52) U.S. Cl.
CPC .. *H01L 29/66545* (2013.01); *H01L 29/66795* (2013.01)
(58) Field of Classification Search
CPC ......... H01L 29/66545; H01L 29/66795; H01L 29/785–7856; H01L 21/3065–30655; H01L 21/308–3088
See application file for complete search history.

(56) References Cited

U.S. PATENT DOCUMENTS

| | | | |
|---|---|---|---|
| 11,211,470 B2 | 12/2021 | Chen et al. | |
| 2004/0175950 A1 | 9/2004 | Puppo et al. | |
| 2013/0023064 A1 | 1/2013 | Marakhtanov et al. | |
| 2016/0380082 A1 | 12/2016 | Yu et al. | |
| 2018/0358232 A1 | 12/2018 | Bi et al. | |
| 2019/0198333 A1* | 6/2019 | Tokashiki | H01L 21/67109 |
| 2021/0202475 A1* | 7/2021 | Hu | H01L 27/1203 |
| 2021/0313212 A1* | 10/2021 | Lin | H01J 37/32082 |

FOREIGN PATENT DOCUMENTS

TW 202117814 A 5/2021

OTHER PUBLICATIONS

English machine translation of KR 10-0908823 (Year: 2009).*

* cited by examiner

*Primary Examiner* — Laura M Menz
*Assistant Examiner* — Candice Chan
(74) *Attorney, Agent, or Firm* — Harrity & Harrity, LLP

(57) ABSTRACT

A dummy gate structure may be formed for a semiconductor device. The dummy gate structure may be formed from an amorphous polysilicon layer. The amorphous polysilicon layer may be deposited in a blanket deposition operation. An annealing operation is performed for the semiconductor device to remove voids, seams, and/or other defects from the amorphous polysilicon layer. The annealing operation may cause the amorphous polysilicon layer to crystallize, thereby resulting in the amorphous polysilicon layer transitioning into a crystallized polysilicon layer. A dual radio frequency (RF) source etch technique may be performed to increase the directionality of ions and radicals in a plasma that is used to etch the crystallized polysilicon layer to form the dummy gate structure. The increased directionality of the ions increases the effectiveness of the ions in etching through the different crystal grain boundaries which increases the etch rate uniformity across the crystallized polysilicon layer.

20 Claims, 44 Drawing Sheets

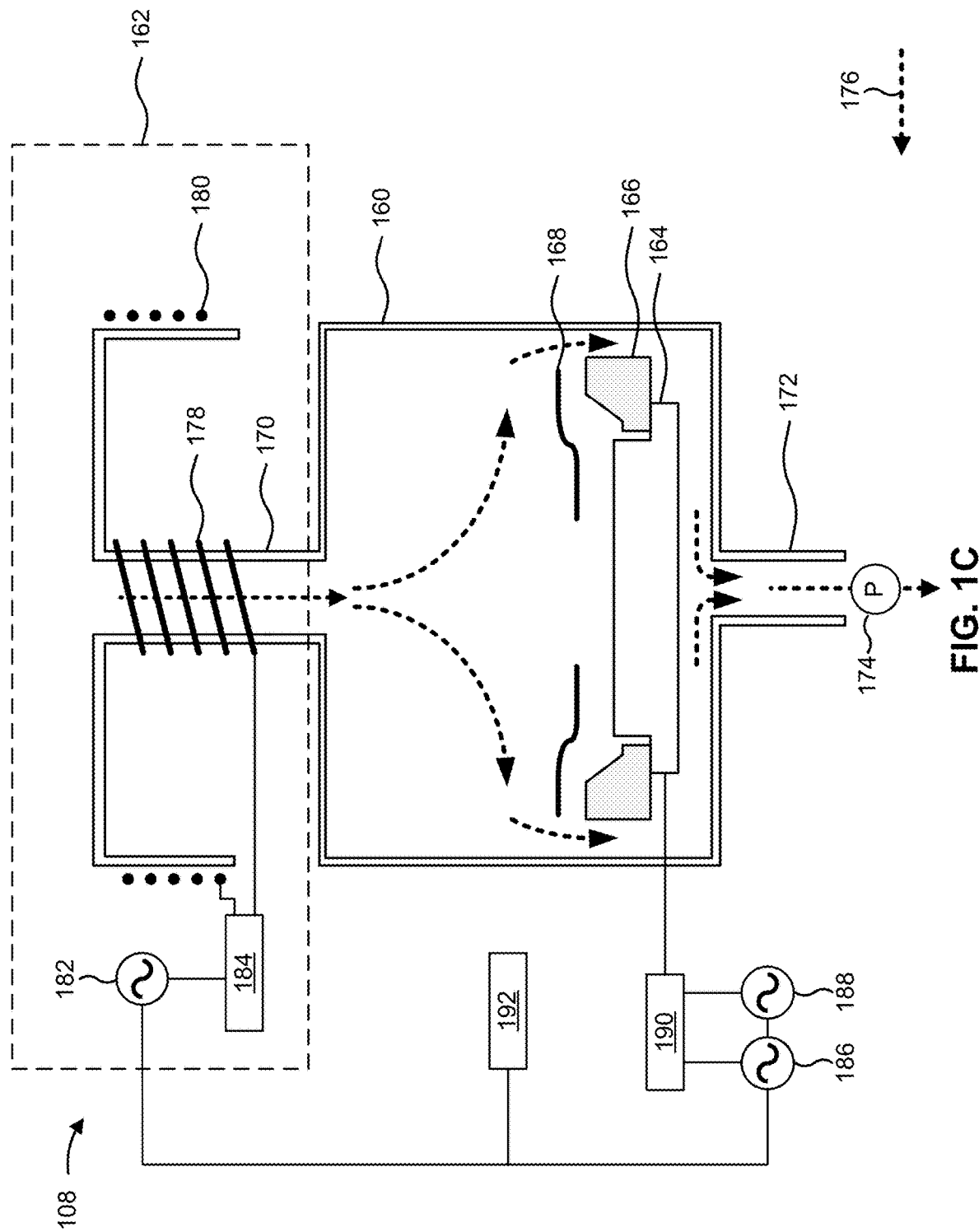

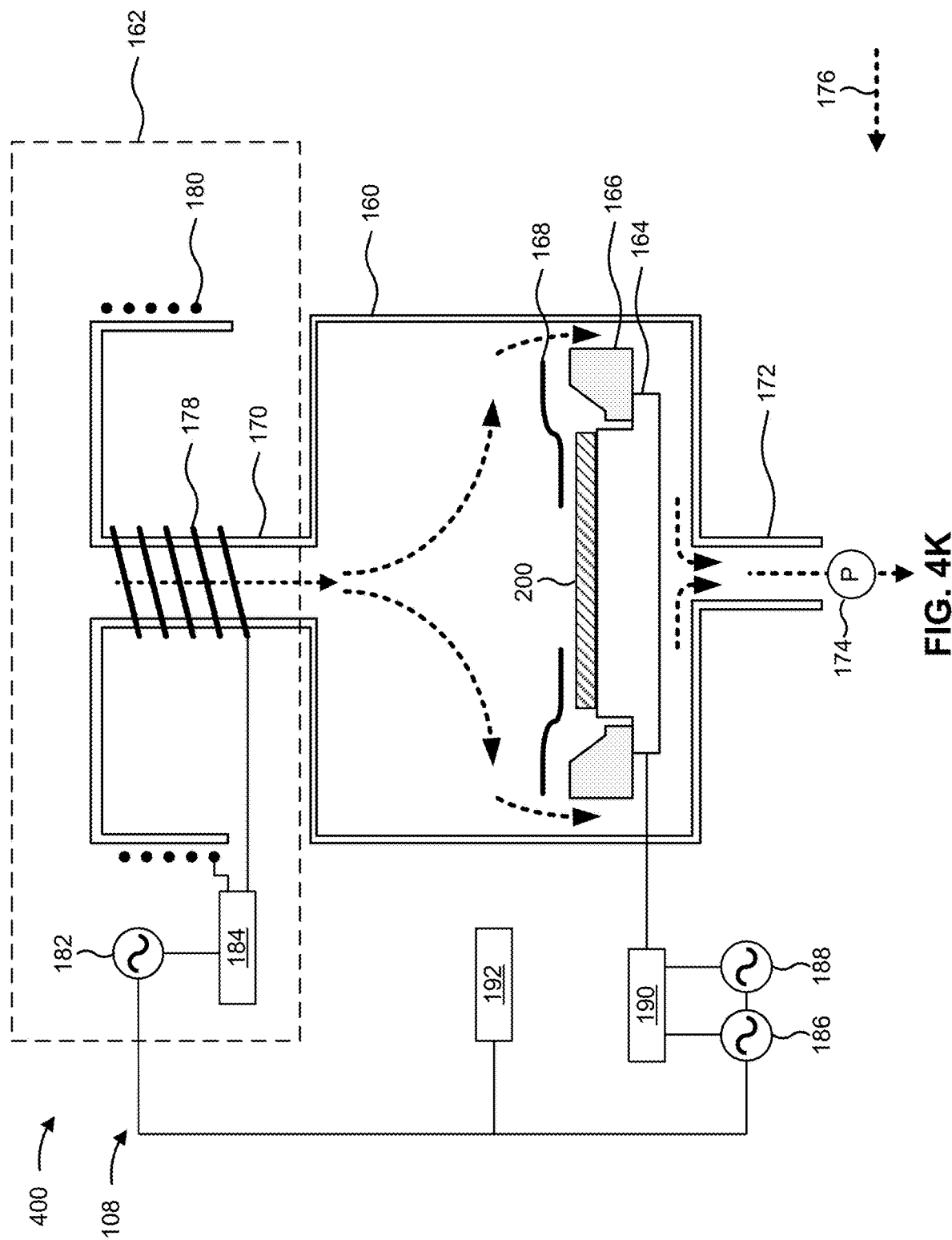

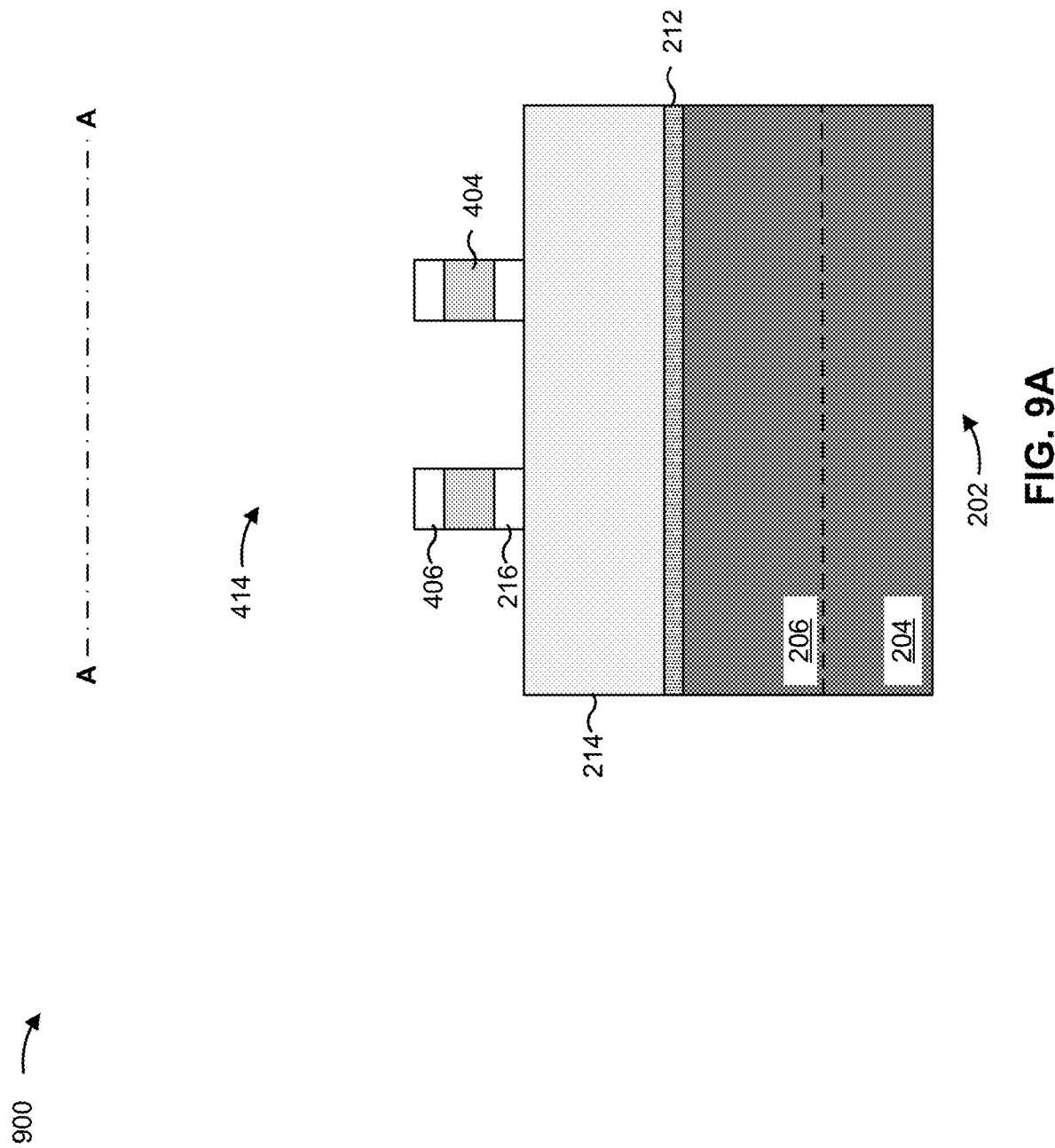

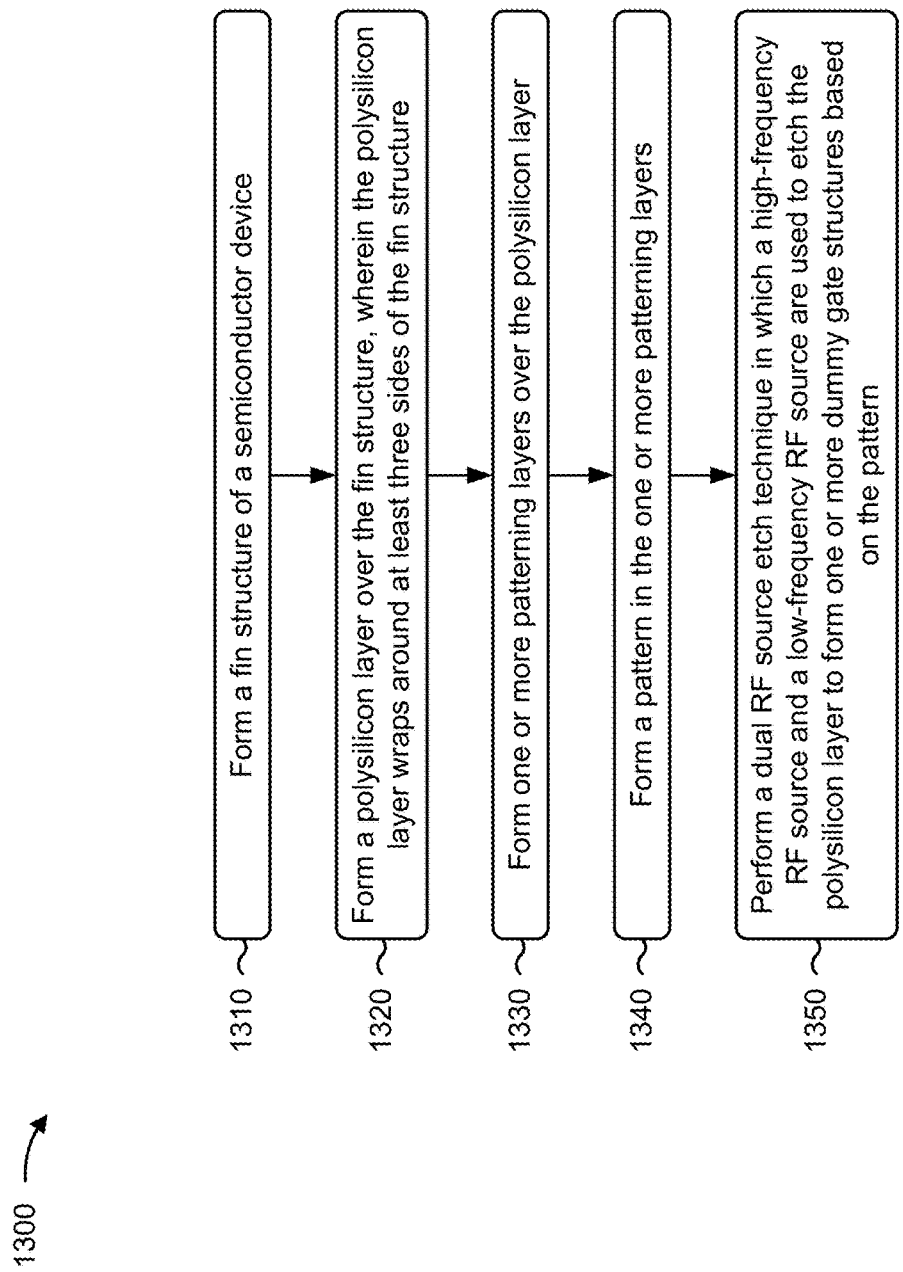

FORMING A DUMMY GATE STRUCTURE

BACKGROUND

Fin-based transistors, such as fin field effect transistors (finFETs) and nanostructure transistors (e.g., nanowire transistors, nanosheet transistors, gate-all-around (GAA) transistors, multi-bridge channel transistors, nanoribbon transistors), are three-dimensional structures that include a channel region in a fin (or a portion thereof) that extends above a semiconductor substrate as a three-dimensional structure. A gate structure, configured to control a flow of charge carriers within the channel region, wraps around the fin of semiconductor material. As an example, in a finFET, the gate structure wraps around three sides of the fin (and thus the channel region), thereby enabling increased control over the channel region (and therefore switching of the finFET). As another example, in a nanostructure transistor, the gate structure wraps around a plurality of channel regions in a fin structure such that the gate structure surrounds each of the plurality of channel regions. Source/drain regions (e.g., epitaxial regions) are located on opposing sides of the gate structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1C are diagrams of an example environment in which systems and/or methods described herein may be implemented.

FIGS. 9A-9C are diagrams of an example implementation described herein.

FIGS. 11-13 are flowcharts of example processes associated with forming a semiconductor device.

DETAILED DESCRIPTION

Figure 1A:
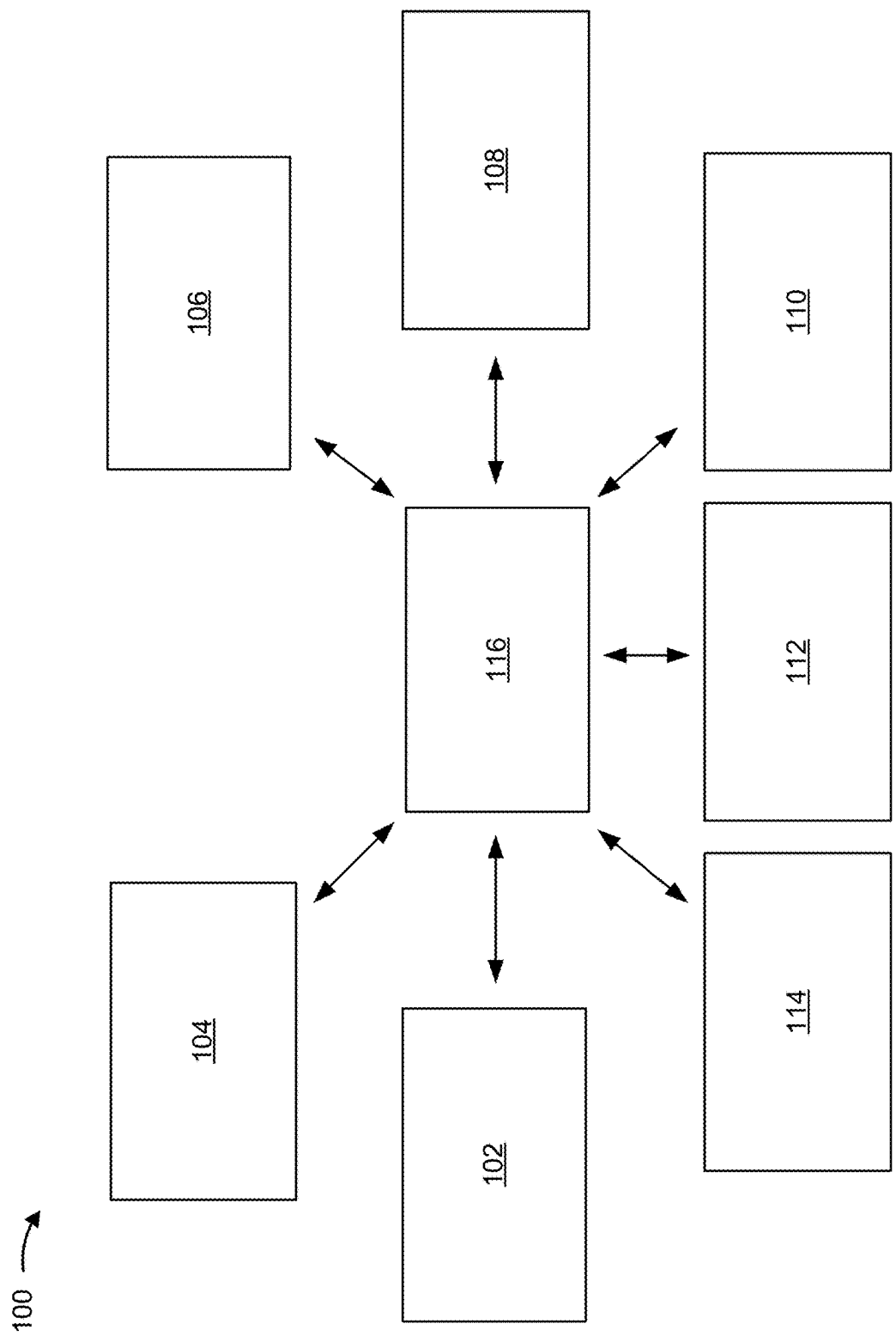

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a dummy gate structure (also referred to as a placeholder gate or a polysilicon gate) is formed in place of a metal gate structure during formation of a fin-based transistor (e.g., a fin field effect (finFET) transistor, a nanostructure transistor). The dummy gate structure functions as a sacrificial structure that enables other structures of the fin-based transistor to be formed prior to formation of the metal gate structure. Delaying the formation of the metal gate structure using the dummy gate structure reduces damage to the metal gate structure that might otherwise occur due to etching and plasma usage during formation of the other structures of the fin-based transistor.

However, defects can occur in a dummy gate structure, and these defects may transfer over to a metal gate structure after the dummy gate structure is removed and the metal gate structure is formed in place of the dummy gate structure. These defects may include, for example, seams in the dummy gate structure, voids in the dummy gate structure, necking in the dummy gate structure, and/other another type of defect in the dummy gate structure. These defects, when transferred to the profile of the metal gate structure, may result in reduced performance (e.g., leakage, reduced gate control) for the fin-based transistor and/or may cause device failures in the fin-based transistor (e.g., shorting, open circuits) that can reduce the yield of fin-based transistors of a semiconductor device.

Some implementations, described herein, provide techniques for forming a dummy gate structure in a manner that reduces the likelihood of defect formation in the dummy gate structure. The reduced likelihood of defect formation in the dummy gate structure, in turn, reduces the likelihood of defect formation in a metal gate structure that replaces the dummy gate structure. As described herein, a dummy gate structure may be formed for a semiconductor device. The dummy gate structure may be formed from an amorphous polysilicon (PO) layer. The amorphous polysilicon layer may be deposited in a blanket deposition operation. An annealing operation is performed for the semiconductor device to remove voids, seams, and/or other defects from the amorphous polysilicon layer.

The annealing operation may cause the amorphous polysilicon layer to crystallize, thereby resulting in the amorphous polysilicon layer transitioning into a crystallized polysilicon layer. The crystal structure of the crystallized polysilicon layer may include a plurality of crystal grain orientations and, therefore, a plurality of crystal grain boundaries between portions of different crystal grain orientations in the crystallized polysilicon layer. Etching through different crystal grain orientations and/or different crystal grain boundaries can be difficult to control. For example, etch rates may be different in portions of the crystallized polysilicon layer having different crystal grain orientations (e.g., due to different grain sizes), which may lead to uneven etching of the crystallized polysilicon layer. This may result in increased difficulty in controlling the profile and/or shape formation of a dummy gate structure that is formed from the crystallized polysilicon layer. The resulting dummy gate structure may have poor line width roughness (LWR), which may result in shorting (e.g., gate-to-source/drain shorting) and reduced semiconductor device yield.

Accordingly, a dual radio frequency (RF) source etch technique may be performed to increase the directionality of ions and radicals in a plasma that is used to etch the crystallized polysilicon layer to form a dummy gate structure. The increased directionality of the ions increases the effectiveness of the ions in etching through the different crystal grain boundaries which increases the etch rate uniformity across the crystallized polysilicon layer. The increased etch rate uniformity enables the dummy gate structure to be formed with a low LWR, which reduces the likelihood of defect formation (e.g., gate-to-source/drain shorts) in a metal gate structure that replaces the dummy gate structure.

Figure 1B:
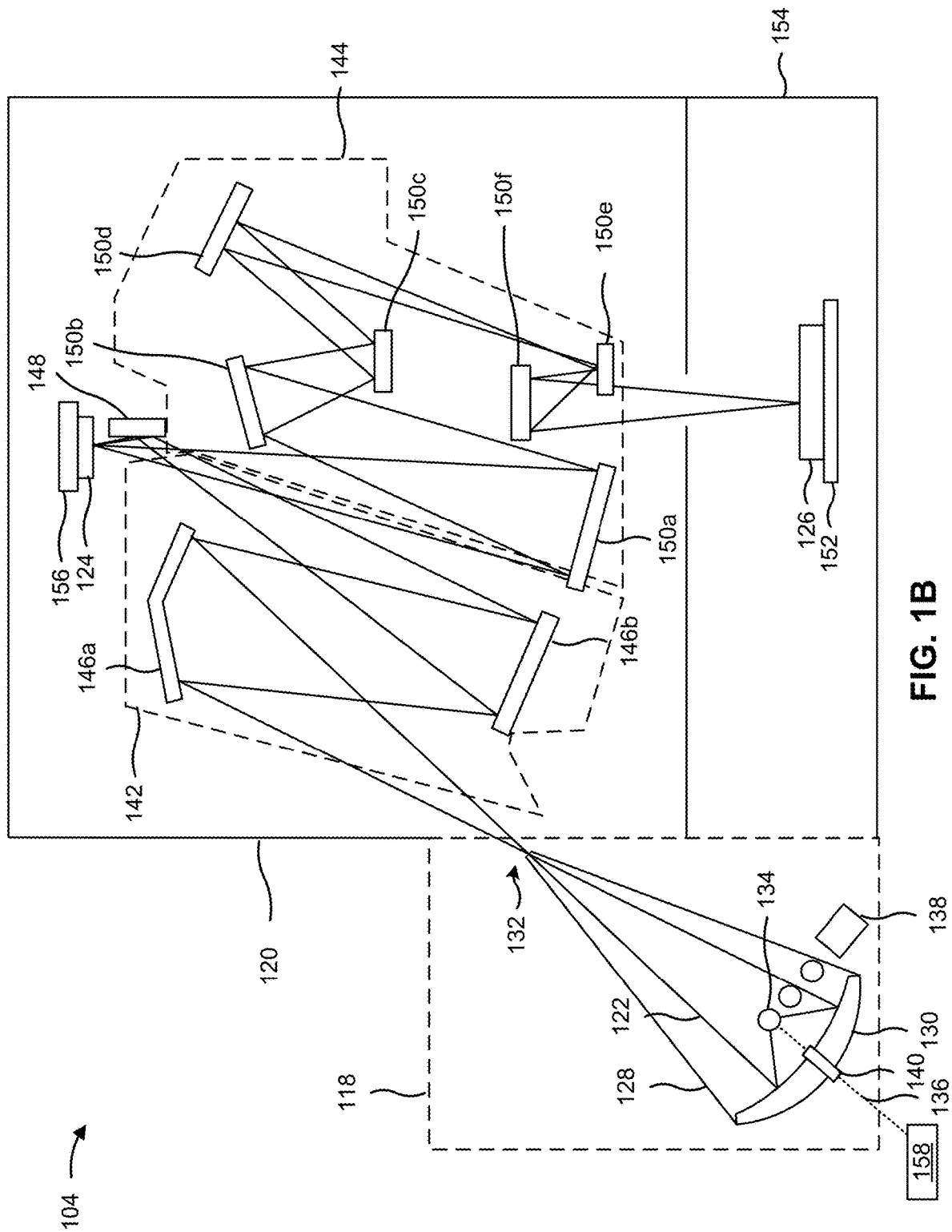

FIGS. 1A-1C are diagrams of an example environment 100 in which systems and/or methods described herein may be implemented. As shown in FIG. 1A, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an annealing tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The annealing tool 114 is a semiconductor processing tool that includes a semiconductor processing chamber and one or more devices capable of heating a semiconductor substrate or semiconductor device. For example, the annealing tool 114 may include a rapid thermal annealing (RTA) tool or another type of annealing tool that is capable of heating a semiconductor substrate to cause a reaction between two or more materials or gasses, to cause a material to decompose. As another example, the annealing tool 114 may be configured to heat (e.g., raise or elevate the temperature of) a structure or a layer (or portions thereof) to re-flow the structure or the layer, or to crystallize the structure or the layer, to remove defects such as voids or seams. As another example, the annealing tool 114 may be configured to heat (e.g., raise or elevate the temperature of) a layer (or portions thereof) to enable bonding of two or more semiconductor devices.

Wafer/die transport tool 116 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-114, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 116 may be a programmed device that is configured to travel a particular path and/or may operate semi-autonomously or autonomously. In some implementations, the environment 100 includes a plurality of wafer/die transport tools 116.

The wafer/die transport tool 116 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 116 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 116 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

FIG. 1B is a diagram of an example exposure tool 104 described herein. The example exposure tool 104 of FIG. 1B includes an EUV lithography system or another type of lithography system that is configured to transfer a pattern to a semiconductor substrate using mirror-based optics. The exposure tool 104 may be configured for use in a semiconductor processing environment such as a semiconductor foundry or a semiconductor fabrication facility.

As shown in FIG. 1B, the exposure tool 104 includes a radiation source 118 and an illumination system 120. The radiation source 118 (e.g., an EUV radiation source or another type of radiation source) is configured to generate radiation 122 such as EUV radiation and/or another type of electromagnetic radiation (e.g., light). The illumination system 120 (e.g., an EUV scanner or another type of illumination system) is configured to focus the radiation 122 onto a reflective reticle 124 (or a photomask) such that a pattern is transferred from the reticle 124 onto a semiconductor substrate 126 using the radiation 122.

The radiation source 118 includes a vessel 128 and a collector 130 in the vessel 128. The collector 130, includes a curved mirror that is configured to collect the radiation 122 generated by the radiation source 118 and to focus the radiation 122 toward an intermediate focus 132. The radiation 122 is produced from a plasma that is generated from droplets 134 (e.g., tin (Sn) droplets or another type of droplets) being exposed to a laser beam 136. The droplets 134 are provided across the front of the collector 130 by a droplet generator (DG) head 138. The DG head 138 is pressurized to provide a fine and controlled output of the droplets 134.

A laser source, such as a pulse carbon dioxide ($CO_2$) laser, generates the laser beam 136. The laser beam 136 is provided (e.g., by a beam delivery system to a focus lens) such that the laser beam 136 is focused through a window 140 of the collector 130. The laser beam 136 is focused onto the droplets 134 which generates the plasma. The plasma produces a plasma emission, some of which is the radiation 122. The laser 136 is pulsed at a timing that is synchronized with the flow of the droplets 134 from the DG head 138.

The illumination system 120 includes an illuminator 142 and a projection optics box (POB) 144. The illuminator 142 includes a plurality of reflective mirrors that are configured to focus and/or direct the radiation 122 onto the reticle 124 so as to illuminate the pattern on the reticle 124. The plurality of mirrors include, for example, a mirror 146a and a mirror 146b. The mirror 146a includes a field facet mirror (FFM) or another type of mirror that includes a plurality of field facets. The mirror 146b includes a pupil facet mirror (PFM) or another type of mirror that also includes a plurality of pupil facets. The facets of the mirrors 146a and 146b are arranged to focus, polarize, and/or otherwise tune the radiation 122 from the radiation source 118 to increase the uniformity of the radiation 122 and/or to increase particular types of radiation components (e.g., transverse electric (TE) polarized radiation, transverse magnetic (TM) polarized radiation). Another mirror 148 (e.g., a relay mirror) is included to direct radiation 122 from the illuminator 142 onto the reticle 124.

The projection optics box 144 includes a plurality of mirrors that are configured to project the radiation 122 onto the semiconductor substrate 126 after the radiation 122 is modified based on the pattern of the reticle 124. The plurality of reflective mirrors include, for example, mirrors 150a-150f. In some implementations, the mirrors 150a-150f are configured to focus or reduce the radiation 122 into an exposure field, which may include one or more die areas on the semiconductor substrate 126.

A wafer stage 152 (e.g., a substrate stage) is included in a bottom module 154 of the exposure tool 104. The wafer stage 152 is configured to support the semiconductor substrate 126. Moreover, the wafer stage 152 is configured to move (or step) the semiconductor substrate 126 through a plurality of exposure fields as the radiation 122 transfers the pattern from the reticle 124 onto the semiconductor substrate 126. The bottom module 154 includes a removable subsystem of the exposure tool 104. The bottom module 154 may slide out of the exposure tool 104 and/or otherwise may be removed from the exposure tool 104 to enable cleaning and inspection of the wafer stage 152 and/or the components of the wafer stage 152. The bottom module 154 isolates the wafer stage 152 from other areas in the illumination system 120 to reduce and/or minimize contamination of the semiconductor substrate 126. Moreover, the bottom module 154 may provide physical isolation for the wafer stage 152 by reducing the transfer of vibrations (e.g., vibrations in the environment 100, vibrations in the exposure tool 104 during operation of the exposure tool 104) to the wafer stage 152 and, therefore, the semiconductor substrate 126. This reduces movement and/or disturbance of the semiconductor substrate 126, which reduces the likelihood that the vibrations may cause a pattern misalignment.

The illumination system 120 also includes a reticle stage 156 that configured to support and/or secure the reticle 124. Moreover, the reticle stage 156 is configured to move or slide the reticle through the radiation 122 such that the reticle 124 is scanned by the radiation 122. In this way, a pattern that is larger than the field or beam of the radiation 122 may be transferred to the semiconductor substrate 126.

The exposure tool 104 includes a laser source 158. The laser source 158 is configured to generate the laser beam 136. The laser source 158 may include a CO2-based laser source or another type of laser source. Due to the wavelength of the laser beams generated by a CO2-based laser source in an infrared (IR) region, the laser beams may be highly absorbed by tin, which enables the CO2-based laser source to achieve high power and energy for pumping tin-based plasma. In some implementations, the laser beam 136 includes a plurality of types of laser beams that the laser source 158 generates using a multi-pulse technique (or a multi-stage pumping technique), in which the laser source 158 generates a pre-pulse laser beam and main-pulse laser beam to achieve greater heating efficiency of tin (Sn)-based plasma to increase conversion efficiency.

In an example exposure operation (e.g., an EUV exposure operation), the DG head 138 provides the stream of the droplets 134 across the front of the collector 130. The laser beam 136 contacts the droplets 134, which causes a plasma to be generated. The laser source 158 generates and provides a pre-pulse laser beam toward a target material droplet in the stream of the droplets 134, and the pre-pulse laser beam is absorbed by the target material droplet. This transforms the target material droplet into disc shape or a mist. Subsequently, the laser source 158 provides a main-pulse laser beam with large intensity and energy toward the disc-shaped target material or target material mist. Here, the atoms of the target material are neutralized, and ions are generated through thermal flux and shock wave. The main-pulse laser beam pumps ions to a higher charge state, which causes the ions to radiate the radiation 122 (e.g., EUV light).

The radiation 122 is collected by the collector 130 and directed out of the vessel 128 and into the illumination system 120 toward the mirror 146a of the illuminator 142. The mirror 146a reflects the radiation 122 onto the mirror 146b, which reflects the radiation 122 onto the mirror 148 toward the reticle 124. The radiation 122 is modified by the pattern in the reticle 124. In other words, the radiation 122 reflects off of the reticle 124 based on the pattern of the reticle 124. The reflective reticle 124 directs the radiation 122 toward the mirror 150a in the projection optics box 144, which reflects the radiation 122 onto the mirror 150b. The radiation 122 continues to be reflected and reduced in the projection optics box 144 by the mirrors 150c-150f. The mirror 150f reflects the radiation 122 onto the semiconductor substrate 126 such that the pattern of the reticle 124 is transferred to the semiconductor substrate 126. The above-described exposure operation is an example, and the exposure tool 104 may operate according to other EUV techniques and radiation paths that include a greater quantity of mirrors, a lesser quantity of mirrors, and/or a different configuration of mirrors.

FIG. 1C is a cross-sectional view of a plasma-based etch tool 108. The plasma-based etch tool 108 includes a type of dry etch tool that uses plasma ions to etch or remove portions of a semiconductor wafer or layers/structures formed thereon. In some implementations, the plasma-based etch tool 108 is a plasma etch tool for etching metals on a semiconductor wafer. In some implementations, the plasma-based etch tool 108 is a decoupled plasma source (DPS) tool, an inductively coupled plasma (ICP) tool, a transformer coupled plasma (TCP) tool, or another type of plasma etch tool.

As shown in FIG. 1C the plasma-based etch tool 108 includes a processing chamber 160. The processing chamber 160 includes a chamber that is capable of being hermitically sealed so that the processing chamber 160 can be pressurized (e.g., to a vacuum or a partial vacuum). In some implementations, the processing chamber 160 is sized to accommodate a particular size of wafer such as a 200 millimeter wafer. In some implementations, the processing chamber 160 is sized to accommodate various sizes of semiconductor wafers, such as a 150 millimeter semiconductor wafer, a 200 millimeter semiconductor wafer, a 300 millimeter wafer, and/or another sized semiconductor wafer. The plasma-based etch tool 108 includes a plasma supply system 162 that is configured to generate a plasma and provide or supply the plasma to the processing chamber 160.

A chuck 164 is included in the processing chamber 160. The chuck 164 is configured to support and secure a semiconductor wafer in the processing chamber 160. The chuck 164 includes an electrostatic chuck (e-chuck or ESC) or another type of chuck (e.g., a vacuum chuck) that is configured to hold and/or secure a semiconductor wafer in the processing chamber 160 during processing (e.g., plasma etching) of the semiconductor wafer. In implementations in which the chuck 164 includes an electrostatic chuck, the chuck 164 is configured to generate an electrostatic attracting force between the chuck 164 and the semiconductor wafer based on a voltage applied to the chuck 164. Moreover, a voltage may be provided to the chuck 164 from a power supply. The voltage may generate the electrostatic attracting force that secures the semiconductor wafer to the chuck 164.

The chuck 164 may be sized and shaped depending on a size and a shape of semiconductor wafer to be processed in the plasma-based etch tool 108. For example, the chuck 164 may be circular shaped and may support all or a portion of a circular shaped semiconductor wafer. In some implementations, the chuck 164 is constructed of a material or materials that are resistant to abrasion and/or corrosion caused by materials used to generate the plasma, and that can generate the attractive force between the chuck 164 and a semiconductor wafer. For example, the chuck 164 may be constructed of a metal, such as aluminum, stainless steel, or another suitable material.

A focus ring 166 is included in the processing chamber 160. The focus ring 166 (also referred to as an edge ring or a single ring) includes a ring-shaped structure that is positioned around a portion of the chuck 164. The focus ring 166 is configured to focus the plasma in the processing chamber 160 toward a semiconductor wafer on the chuck 164 by directing (or redirecting) at least a portion of the plasma toward the semiconductor wafer. In this way, the focus ring 166 may increase electrical and plasma fluid uniformity in the processing chamber 160. In some implementations, a voltage is applied to the focus ring 166 (e.g., from a power supply) so that the focus ring 166 provides the electrical and plasma uniformity. The focus ring 166 may be sized and shaped depending on a size and a shape of semiconductor wafer to be processed in the plasma-based etch tool 108. For example, the focus ring 166 may be circular shaped and may include an opening to enable the focus ring 166 to surround a semiconductor wafer on the chuck 164. In some implementations, the focus ring 166 is constructed of a material or materials that are resistant to abrasion and/or corrosion caused by materials used to generate the plasma, and that can provide the electrical and plasma uniformity for a semiconductor wafer. For example, the focus ring 166 may be constructed of a metal, such as aluminum, stainless steel, and/or another suitable material.

During a plasma operation of a semiconductor wafer in the plasma-based etch tool 108, a bias voltage may be applied to the chuck 164 such that an electric field is generated between the semiconductor wafer and the plasma in the processing chamber 160. The bias voltage may include a negative bias voltage, which results in an excess of positively charged ions in a layer of the plasma above the semiconductor wafer. This dense layer of positively charged ions is referred to as a sheath 168, which may also be referred to as a plasma sheath, an electrostatic sheath, or a Debye sheath. The bias voltage may be used to control the flow rate and direction of ions in the plasma processing chamber 160 to adjust the etching properties of the plasma.

The plasma supply system 162 may include a process gas source to provide a gas flow (e.g., argon or another type of gas flow) to the processing chamber 160. The plasma supply system 162 may provide the plasma and the gas flow to the processing chamber 160 through an inlet port 170 in a first side (e.g., a top side) of the processing chamber 160. The plasma and the gas flow are removed from the processing chamber 160 through an exhaust port 172 (or outlet port) at an opposing side (e.g., a bottom side) of the processing chamber 160. The plasma-based etch tool 108 includes a vacuum pump 174 to facilitate the generation of a flow path 176 of the plasma and the gas flow between the inlet port 170 and the exhaust port 172. For example, and as shown in the example in FIG. 1C, the flow path 176 originates at the inlet port 170, the flow path 176 expands outward in the processing chamber 160 and flows around the chuck 164 and the focus ring 166, and downward under the chuck 164 toward the exhaust port 172. The vacuum pump 174 may be further configured to control the pressure in the processing chamber 160 and to generate a vacuum (or partial vacuum) in the processing chamber 160.

As further shown in FIG. 1C, the plasma supply system 162 includes an inner plasma source 178 and an outer plasma source 180. The inner plasma source 178 and the outer plasma source 180 include independently controllable plasma sources that, in combination, are configured to control and shape the plasma in the processing chamber 160. For example, the power, voltage, and/or other parameters may be independently configurable for inner plasma source 178 and the outer plasma source 180 to provide a plasma to the processing chamber 160 such that the plasma includes a particular electric field distribution, a particular ion composition and/or distribution, and/or a particular ion bombardment direction or angle, among other examples such that the intensity of the plasma is greater in particular areas in the processing chamber 160 relative to other areas of the processing chamber 160.

The inner plasma source 178 and the outer plasma source 180 are both coupled to a radio frequency (RF) source 182 through a matching network 184. The RF source 182 may be referred to as an upper RF source in that the RF source 182 is configured to provide or supply an RF or alternating current to the inner plasma source 178 and the outer plasma source 180, respectively, to facilitate the generation of a plasma in the plasma supply system 162. The RF source 182 and the matching network 184 may be used to selectively increase or decrease the rate of plasma generation in the plasma supply system 162, to selectively increase or decrease the density of the plasma (e.g., the density of ions in the plasma), and/or to control one or more other parameters of the plasma. The RF source 182 may also be referred to as a high-frequency RF source in that the RF source 182 may be configured to operate in a frequency range such as approximately 10 MHz to approximately 30 MHz or approximately 300 MHz to approximately 300 GHz, among other examples.

The matching network 184 includes one or more electrical circuits that are configured to provide impedance matching for the inner plasma source 178 and for the outer plasma source 180. The matching network 184 may be configured to match impedances of the RF source 182, the inner plasma source 178, and/or the outer plasma source 180 to reduce and/or prevent standing waves and to provide efficient transfer of power from the RF source 182 to the inner plasma source 178 and/or the outer plasma source 180.

To generate the plasma, the RF source 182 may provide RF or alternating current to the inner plasma source 178 and the outer plasma source 180 through the matching network 184. The RF or alternating current may traverse through and/or along the coiled conductors of the inner plasma source 178 and the outer plasma source 180, which generates a time-varying electromagnetic field through electromagnetic induction. The time-varying electromagnetic field may create an electromotive force, which energizes a gas flow into the processing chamber 160 with electrons, thereby forming the plasma.

As further shown in FIG. 1C, the plasma-based etch tool 108 includes additional RF sources 186 and 188, which are coupled to the chuck 164 through another matching network 190. The RF sources 186 and 188 may be referred to as lower RF sources in that the RF sources 186 and 188 are each configured to provide or supply an RF or alternating current to the chuck 164 to facilitate the bombardment of ions in the plasma onto a semiconductor substrate or device that is positioned on the chuck 164. The plasma-based etch tool 108 may be referred to as a dual bias power etch tool in that the plasma-based etch tool 108 includes two lower RF sources (e.g., the RF sources 186 and 188). However, the plasma-based etch tool 108 may include a greater quantity of lower RF sources.

The RF sources 186 and/or 188 may be used to control one or more parameters of ion bombardment onto a semiconductor substrate or device that is positioned on the chuck 164. For example, the RF sources 186 and/or 188 may be used to selectively increase or decrease the ion energy of the ions in the plasma. As another example, the RF sources 186 and/or 188 may be used to selectively increase or decrease the ion angle distribution function (IADF) of the ions in the plasma. The IADF may be a function of the energy and bombardment angle of the ions in the plasma. The RF source 186 may be referred to as a high-frequency RF source in that the RF source 186 may be configured to operate in a frequency range such as approximately 10 MHz to approximately 30 MHz, among other examples. The RF source 188 may be referred to as a low-frequency RF source in that the RF source 188 may be configured to operate in a frequency range such as approximately 400 kilohertz (kHz) to approximately 2 MHz, among other examples.

As described herein, the plasma-based etch tool 108 may perform a dual RF source etch technique to etch one or more structures and/or one or more layers of a semiconductor device. The dual RF source etch technique may include selectively operating the RF sources 186 and/or 188 in a manner that enables the plasma-based etch tool 108 to form a recess having a particular shape or profile and/or to etch a layer to form a structure that has a particular shape or profile, among other examples. The inclusion of the RF sources 186 and/or 188, and the use of the dual RF source etch technique (e.g., which includes the use of a high-frequency RF source and a low-frequency RF source) enables increased control over profile shaping for dummy gate structures, metal gate structures, and/or another type of structures described herein. Accordingly, the inclusion of the RF sources 186 and/or 188, and the use of the dual RF source etch technique (e.g., which includes the use of a high-frequency RF source and a low-frequency RF source) enables formation of a dummy gate structure of a semiconductor device (and thus, a metal gate structure that replaces the dummy gate structure) to a greater aspect ratio (e.g., a ratio of the height to the width of the dummy gate structure) relative to the use of a single lower RF source. This may provide increased transistor performance for the semiconductor device in that the increased aspect ratio may provide increased gate control, reduced defect rate formation, and/or increased yield, among other examples.

As further shown in FIG. 1C, the plasma-based etch tool 108 may include a controller 192. The controller 192 may be communicatively coupled with the RF sources 182, 186, and 188 by one or more communication links (e.g., one or more wireless-communication links, one or more wired-communication links, or a combination of one or more wireless-communication links and one or more wired-communication links, among other examples). The controller 192 may include a processor, a combination of a processor and memory, or a transceiver that transmits and receives signals, among other examples. The controller 192 may transmit signals to and receive the signals from the RF sources 182, 186, and 188 using the one or more communication links to cause the plasma-based etch tool 108 to perform the dual RF source etch technique described herein.

The number and arrangement of devices shown in FIGS. 1A-1C are provided as one or more examples. In practice, there may be additional devices, fewer devices, different devices, or differently arranged devices than those shown in FIGS. 1A-1C. Furthermore, two or more devices shown in FIGS. 1A-1C may be implemented within a single device, or a single device shown in FIGS. 1A-1C may be implemented as multiple, distributed devices. Additionally, or alternatively, a set of devices (e.g., one or more devices) of environment 100 may perform one or more functions described as being performed by another set of devices of environment 100.

Figure 2:
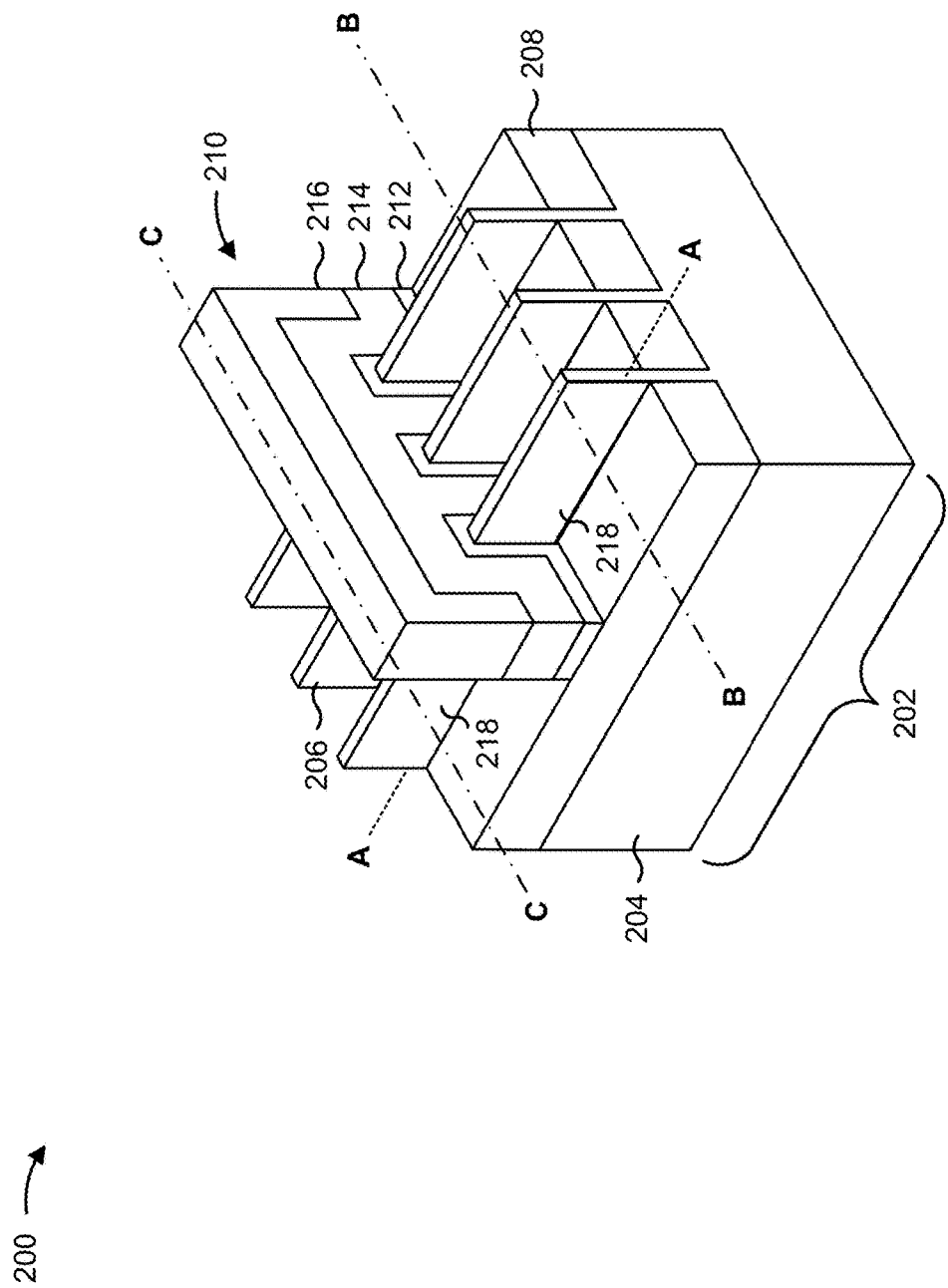
FIG. 2 is a diagram of an example semiconductor device described herein.

FIG. 2 is a diagram of example regions of a semiconductor device 200 described herein. In particular, FIG. 2 illustrates an example device region 202 of the semiconductor device 200 in which one or more transistors or other devices are included. The transistors may include fin-based transistors, such as fin field effect transistors (finFETs), nanostructure transistors, and/or other types of transistors. In some implementations, the device region 202 includes a p-type metal oxide semiconductor (PMOS) region, an n-type metal oxide semiconductor (NMOS) region, a complementary metal oxide semiconductor (CMOS) region, and/or another type of device region. FIGS. 3A-7C and 9A-9C are schematic cross-sectional views of various portions of the device region 202 of the semiconductor device 200 illustrated in FIG. 2, and correspond to various processing stages of forming fin-based transistors in the device region 202 of the semiconductor device 200.

The semiconductor device 200 includes a substrate 204. The substrate 204 includes a silicon (Si) substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, or another type of semiconductor substrate. The substrate 204 may include a round/circular substrate having an approximately 200 mm diameter, an approximately 300 mm diameter, or another diameter, such as 450 mm, among other examples. The substrate 204 may alternatively be any polygonal, square, rectangular, curved, or otherwise non-circular workpiece, such as a polygonal substrate.

Fin structures 206 are included above (and/or extend above) the substrate 204 for the device region 202. A fin structure 206 may provide an active region where one or more devices (e.g., fin-based transistors) are formed. In some implementations, the fin structures 206 include silicon (Si) materials or another elementary semiconductor material such as germanium (Ge). In some implementations, the fin structures 206 include an alloy semiconductor material such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or a combination thereof. In some implementations, the fin structures 206 are doped using n-type and/or p-type dopants.

The fin structures 206 are fabricated by suitable semiconductor process techniques, such as masking, photolithography, and/or etch processes, among other examples. As an example, the fin structures 206 may be formed by etching a portion of the substrate 204 away to form recesses in the substrate 204. The recesses may then be filled with isolating material that is recessed or etched back to form shallow trench isolation (STI) regions 208 above the substrate 204 and between the fin structures 206. Other fabrication techniques for the STI regions 208 and/or for the fin structures 206 may be used. The STI regions 208 may electrically isolate adjacent active areas in the fin structures 206. The STI regions 208 may include a dielectric material such as a silicon oxide ($SiO_x$), a silicon nitride ($Si_xN_y$), a silicon oxynitride (SiON), fluoride-doped silicate glass (FSG), a low-k dielectric material, and/or other suitable insulating material. The STI regions 208 may include a multi-layer structure, for example, having one or more liner layers.

A dummy gate structure 210 (or a plurality of dummy gate structures 210) is included in the device region 202 over the fin structures 206 (e.g., approximately perpendicular to the fin structures 206). The dummy gate structure 210 engages the fin structures 206 on three or more sides of the fin structures 206. In the example depicted in FIG. 2, the dummy gate structure 210 includes a gate dielectric layer 212, a polysilicon layer 214, and a hard mask layer 216. In some implementations, the dummy gate structure 210 further includes a capping layer, one or more spacer layers, and/or another suitable layer. The various layers of the dummy gate structure 210 may be formed by suitable deposition techniques and patterned by suitable photolithography and etching techniques.

The term, "dummy", as described here, refers to a sacrificial structure which will be removed in a later stage and will be replaced with another structure, such as a high dielectric constant (high-k) dielectric and metal gate structure in a replacement gate process. The replacement gate process refers to manufacturing a gate structure at a later stage of the overall gate manufacturing process. Accordingly, the configuration of the semiconductor device 200 illustrated in FIG. 2 may include an intermediate configuration, and additional semiconductor processing operations may be performed for the semiconductor device 200 to further process the semiconductor device 200.

The gate dielectric layer 212 may include a dielectric oxide layer. The dielectric oxide layer may be formed by chemical oxidation, thermal oxidation, ALD, CVD, and/or other suitable methods. The polysilicon layer 214 may include a polysilicon material or another suitable material. The polysilicon layer 214 may be formed by suitable deposition processes such as LPCVD or PECVD, among other examples. The hard mask layer 216 may include any material suitable to pattern the polysilicon layer 214 with particular features/dimensions on the substrate 204.

In some implementations, the various layers of the dummy gate structure 210 are first deposited as blanket layers. Then, the blanket layers are patterned through a process including photolithography and etching processes, removing portions of the blanket layers and keeping the remaining portions over the STI regions 208 and the fin structures 206 to form the dummy gate structure 210.

Source/drain areas 218 are disposed in opposing regions of the fin structures 206 with respect to the dummy gate structure 210. The source/drain areas 218 include areas in the device region 202 in which source/drain regions are to be formed. The source/drain regions in the device region 202 include silicon (Si) with one or more dopants, such as a p-type material (e.g., boron (B) or germanium (Ge), among other examples), an n-type material (e.g., phosphorous (P) or arsenic (As), among other examples), and/or another type of dopant. Accordingly, the device region 202 may include PMOS transistors that include p-type source/drain regions, NMOS transistors that include n-type source/drain regions, and/or other types of transistors.

Some source/drain regions may be shared between various transistors in the device region 202. In some implementations, various ones of the source/drain regions may be connected or coupled together such that fin-based transistors in the device region 202 are implemented as two functional transistors. For example, if neighboring (e.g., as opposed to opposing) source/drain regions are electrically connected, such as through coalescing the regions by epitaxial growth (e.g., neighboring source/drain regions, as opposed to on opposing sides of the dummy gate structure 210, being coalesced), two functional transistors may be implemented. Other configurations in other examples may implement other numbers of functional transistors.

FIG. 2 further illustrates reference cross-sections that are used in later figures, such as one or more of FIGS. 3A-9C. Cross-section A-A is in a plane along a channel in a fin structure 206 between opposing source/drain areas 218. Cross-section B-B is in a plane perpendicular to cross-section A-A, and is across a source/drain area 218 in fin structure 206. Cross-section C-C is in a plane perpendicular to cross-section A-A, and is along a dummy gate structure 210. Subsequent figures refer to these reference cross-sections for clarity. In some figures, some reference numbers of components or features illustrated therein may be omitted to avoid obscuring other components or features for ease of depicting the figures.

As indicated above, FIG. 2 is provided as an example. Other examples may differ from what is described with regard to FIG. 2.

Figure 3A:
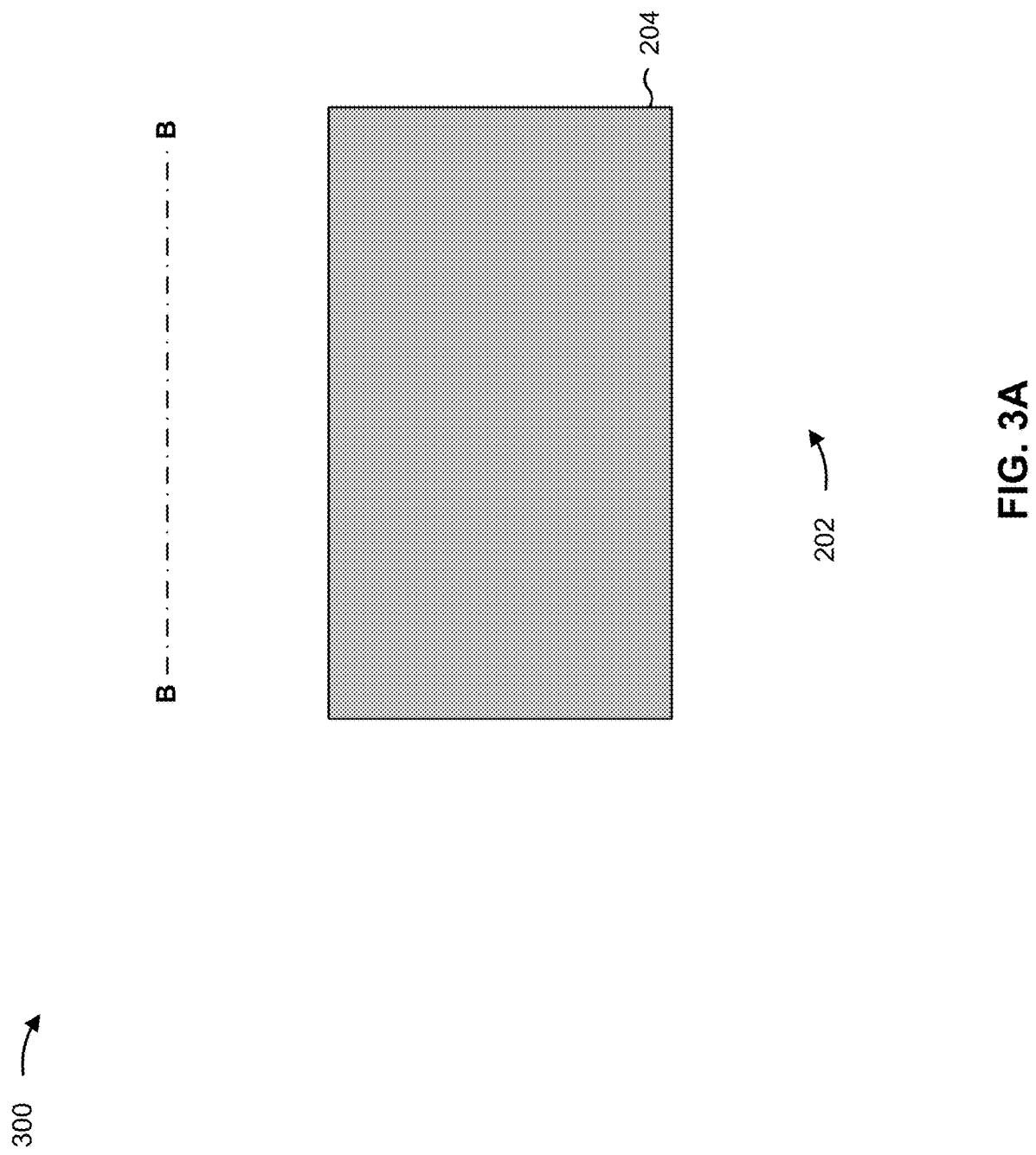
FIGS. 3A-3D, 4A-4N, 5A-5C, 6A-6F, and 7A-7C are diagrams of one or more example implementations described herein.

FIGS. 3A-3D are diagrams of an example implementation 300 described herein. The example implementation 300 includes an example of forming fin structures 206 for transistors in the device region 202 of the semiconductor device 200. FIGS. 3A-3D are illustrated from the perspective of the cross-sectional plane B-B in FIG. 2 for the device region 202. Turning to FIG. 3A, the example implementation 300 includes semiconductor processing operations relating to the substrate 204 in and/or on which transistors are formed in the device region 202.

Figure 3B:
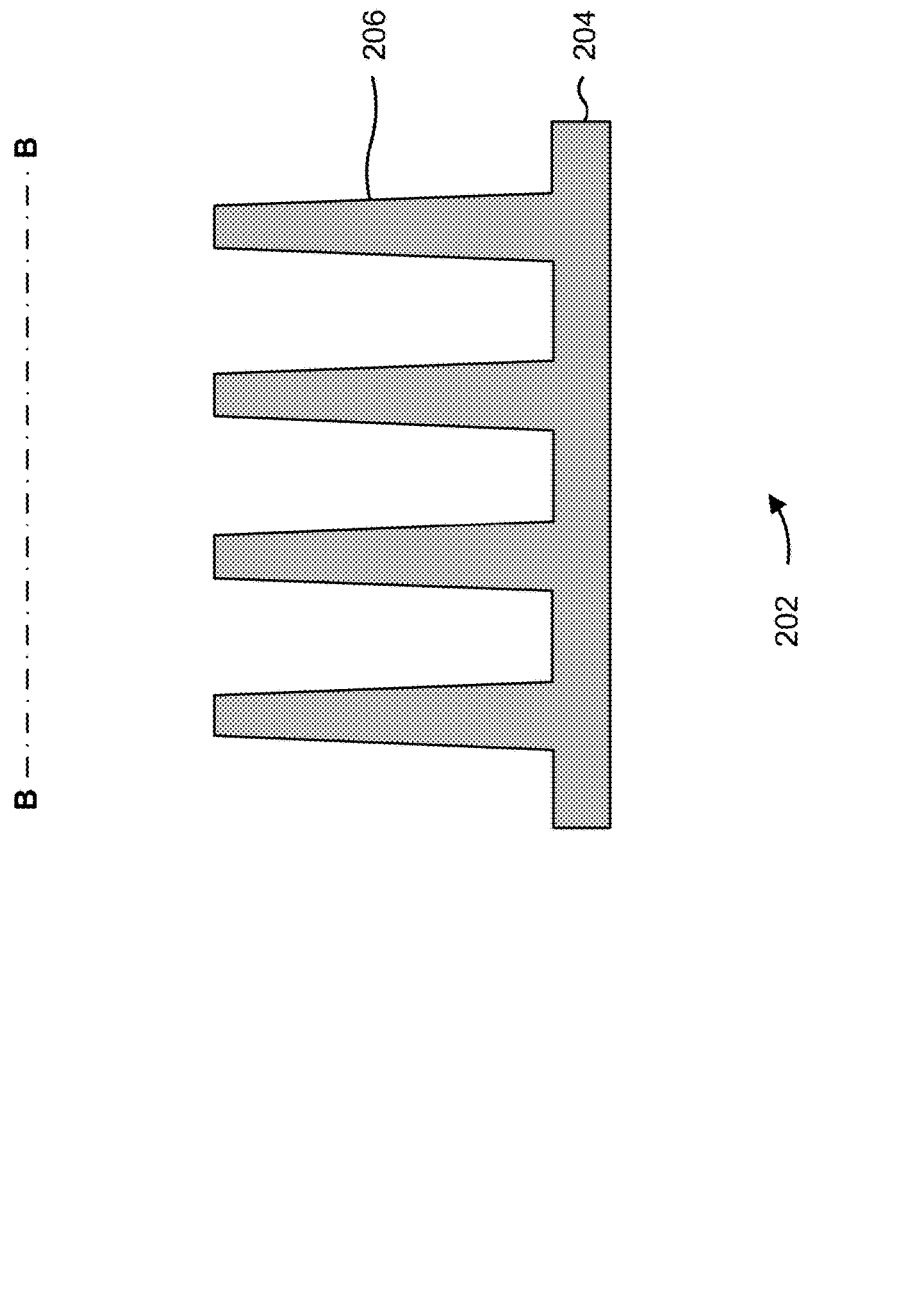

As shown in FIG. 3B, the fin structures 206 are formed in the substrate 204 in the device region 202. In some implementations, a pattern in a photoresist layer is used to form the fin structures 206. In these implementations, the deposition tool 102 forms the photoresist layer on the substrate 204. The exposure tool 104 exposes the photoresist layer to a radiation source to pattern the photoresist layer. The developer tool 106 develops and removes portions of the photoresist layer to expose the pattern. The etch tool 108 etches into the substrate 204 to form the fin structures 206. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the fin structures 206 based on a pattern.

Figure 3C:
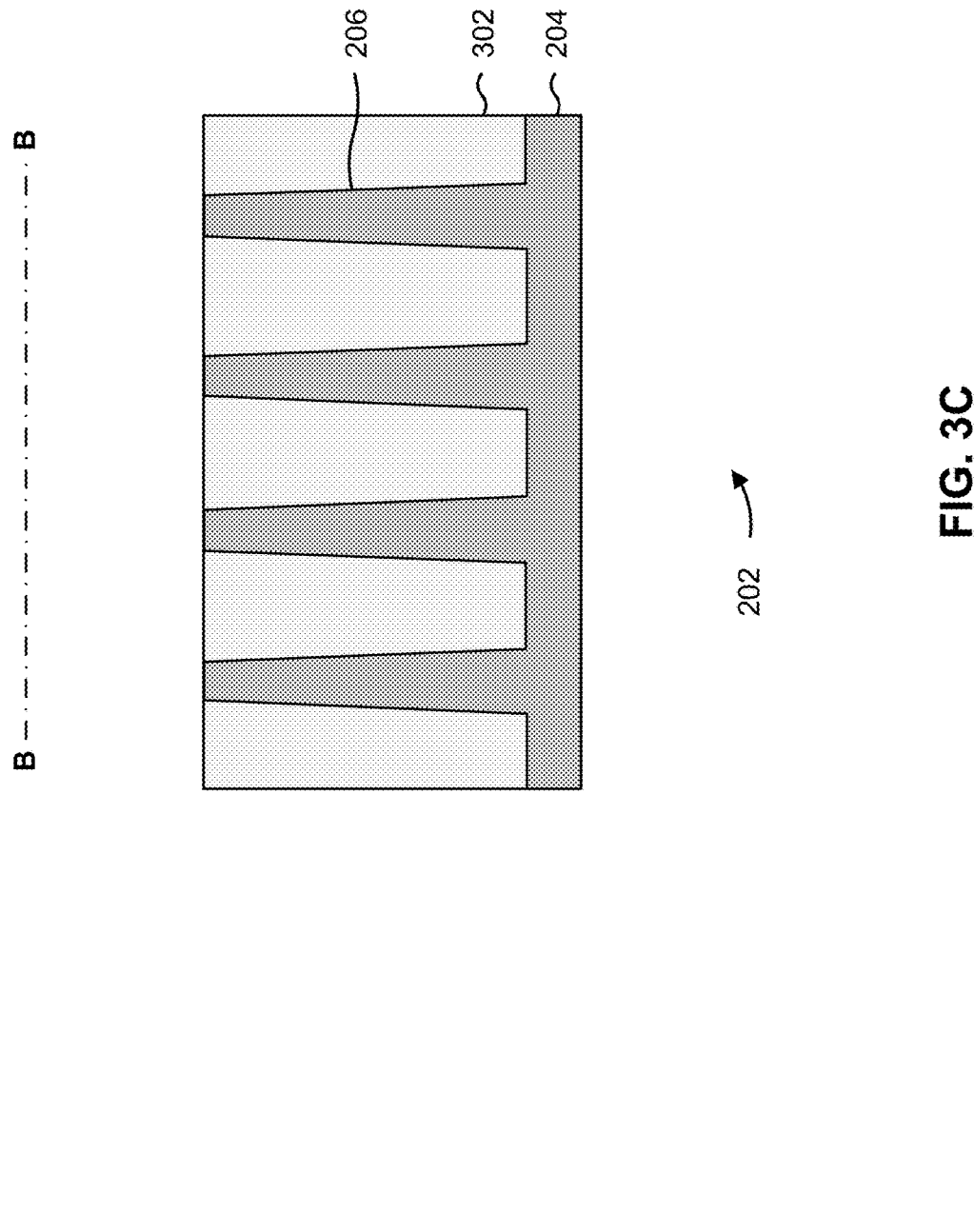

As shown in FIG. 3C, an STI layer 302 is formed in between the fin structures 206. The deposition tool 102 deposits the STI layer 302 using a CVD technique, a PVD technique, an ALD technique, a deposition technique described above in connection with FIG. 1, and/or another deposition technique. In some implementations, the STI layer 302 is formed to a height that is greater than the height of the fin structures 206. In these implementations, the planarization tool 110 performs a planarization (or polishing) operation to planarize the STI layer 302 such that the top surface of the STI layer 302 is substantially flat and smooth, and such that the top surface of the STI layer 302 and the top surface of the fin structures 206 are approximately the same height. The planarization operation may increase uniformity in the STI regions 208 that are formed from the STI layer 302 in a subsequent etch-back operation.

Figure 3D:
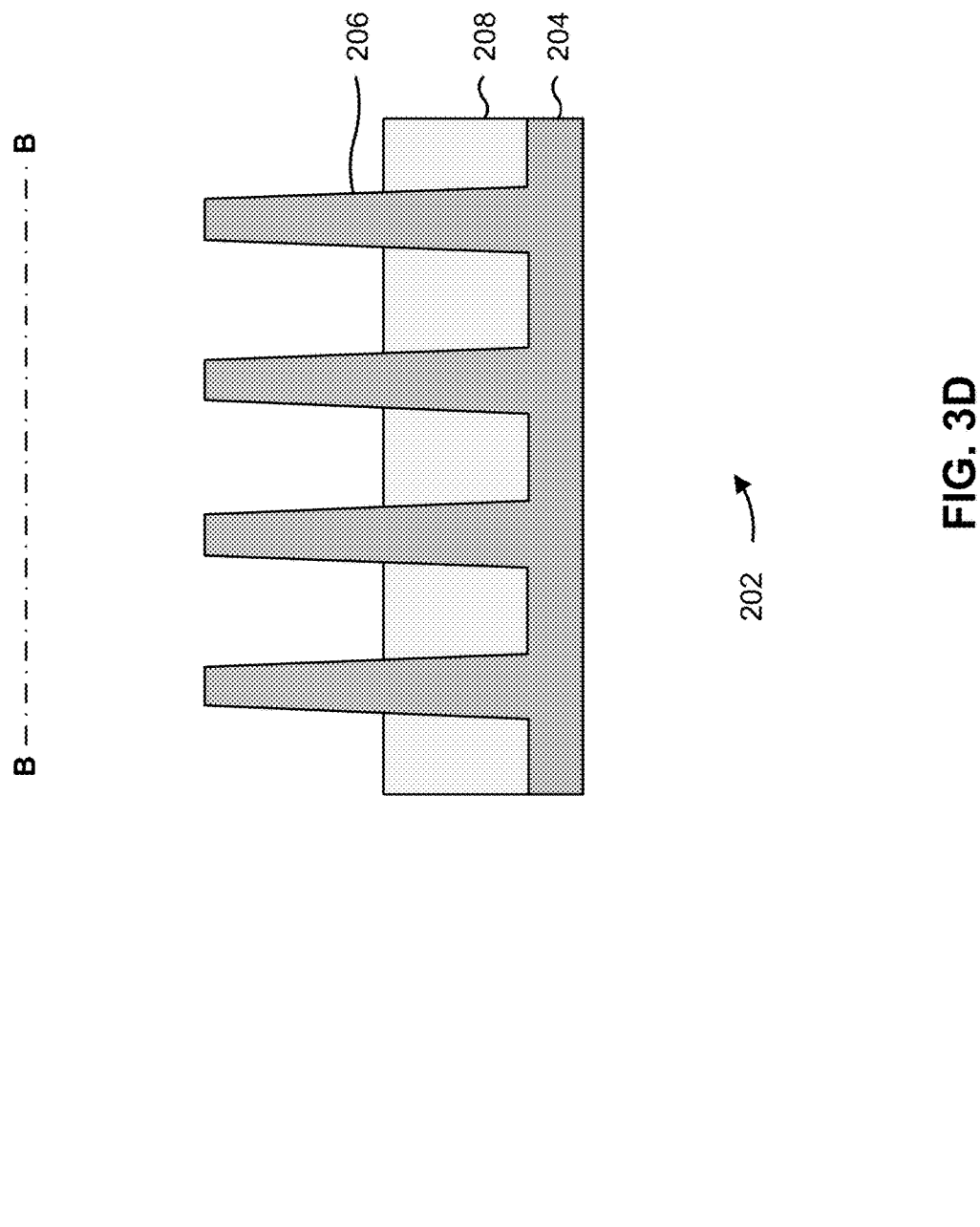

As shown in FIG. 3D, the STI layer 302 is etched in an etch back operation to expose portions of the fin structures 206. The etch tool 108 etches a portion of the STI layer 302 using a plasma etch technique, a wet chemical etch technique, and/or another type of etch technique. The remaining portions of the STI layer 302 between the fin structures 206 include the STI regions 208. In some implementations, the STI layer 302 is etched such that the height of the exposed portions of the fin structures 206 (e.g., the portions of the fin structures 206 that are above the top surface of the STI regions 208) and the same height in the device region 202. In some implementations, a first portion of the STI layer 302 in the device region 202 is etched and a second portion of the STI layer 302 in the device region 202 is etched such that the height of exposed portions of a first subset of the fin structures 206 and the height of the exposed portions of a second subset of the fin structures 206 are different, which enables the fin heights to be tuned to achieve particular performance characteristics for the device region 202.

As indicated above, FIGS. 3A-3D are provided as an example. Other examples may differ from what is described with regard to FIGS. 3A-3D.

Figure 4A:
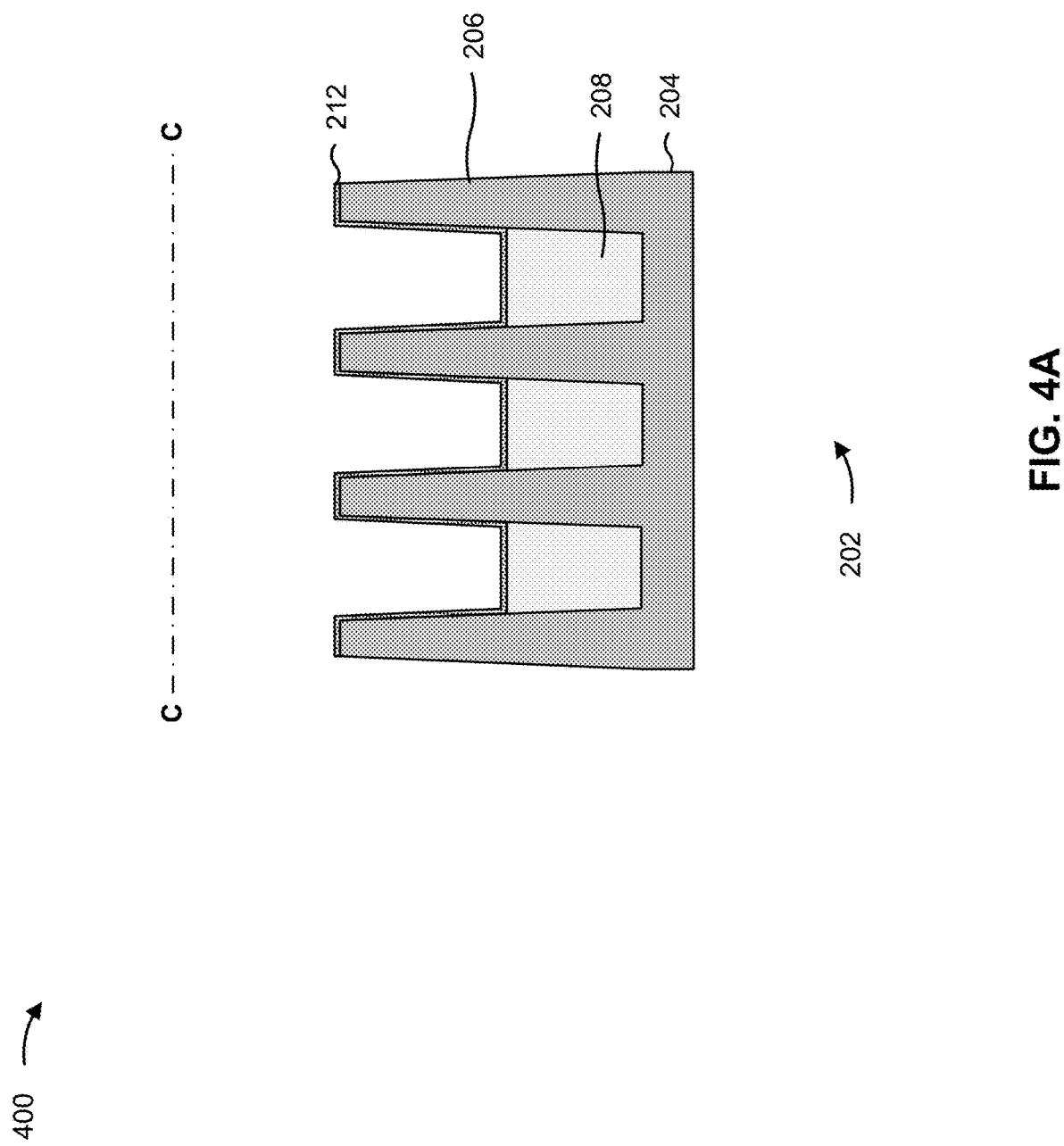
Figure 4B:
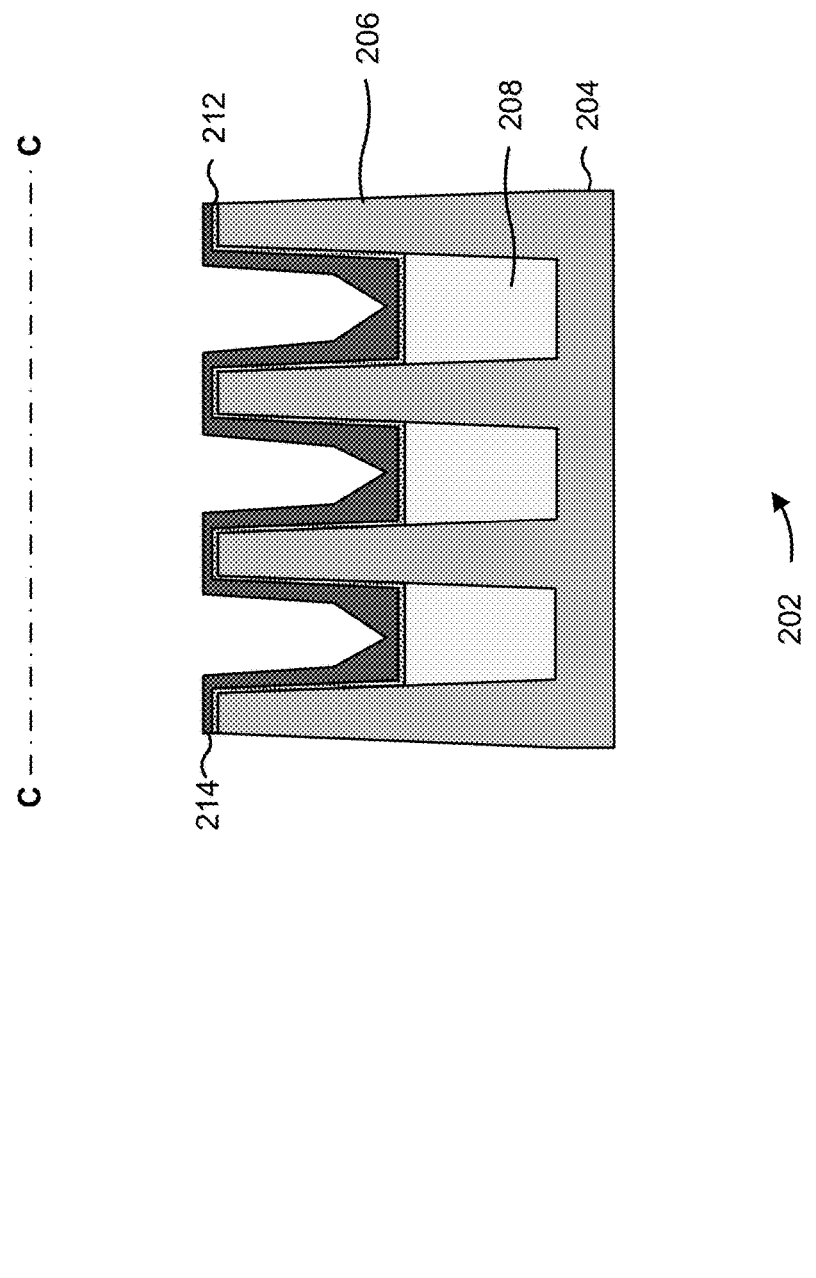
Figure 4C:
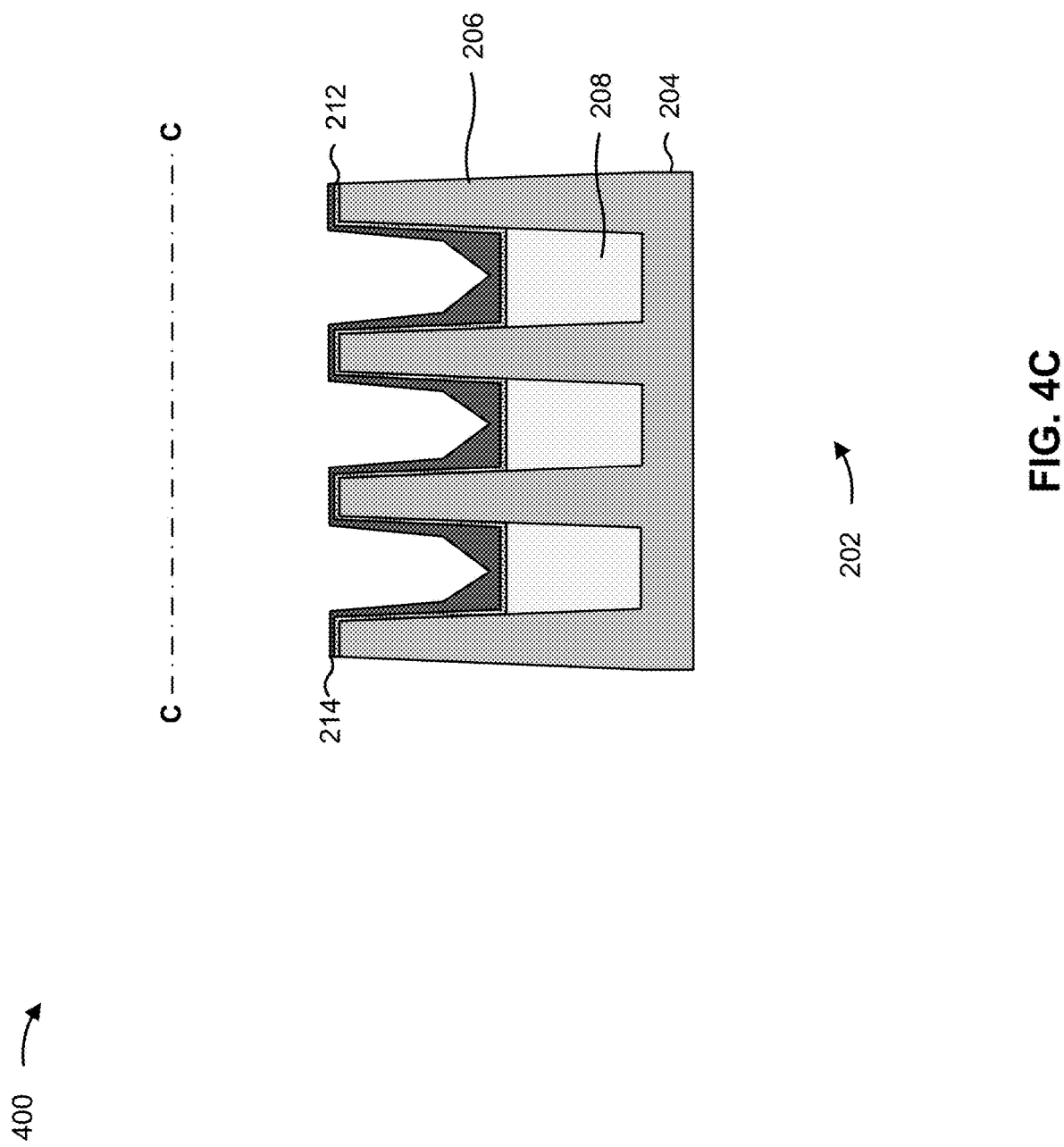
Figure 4D:
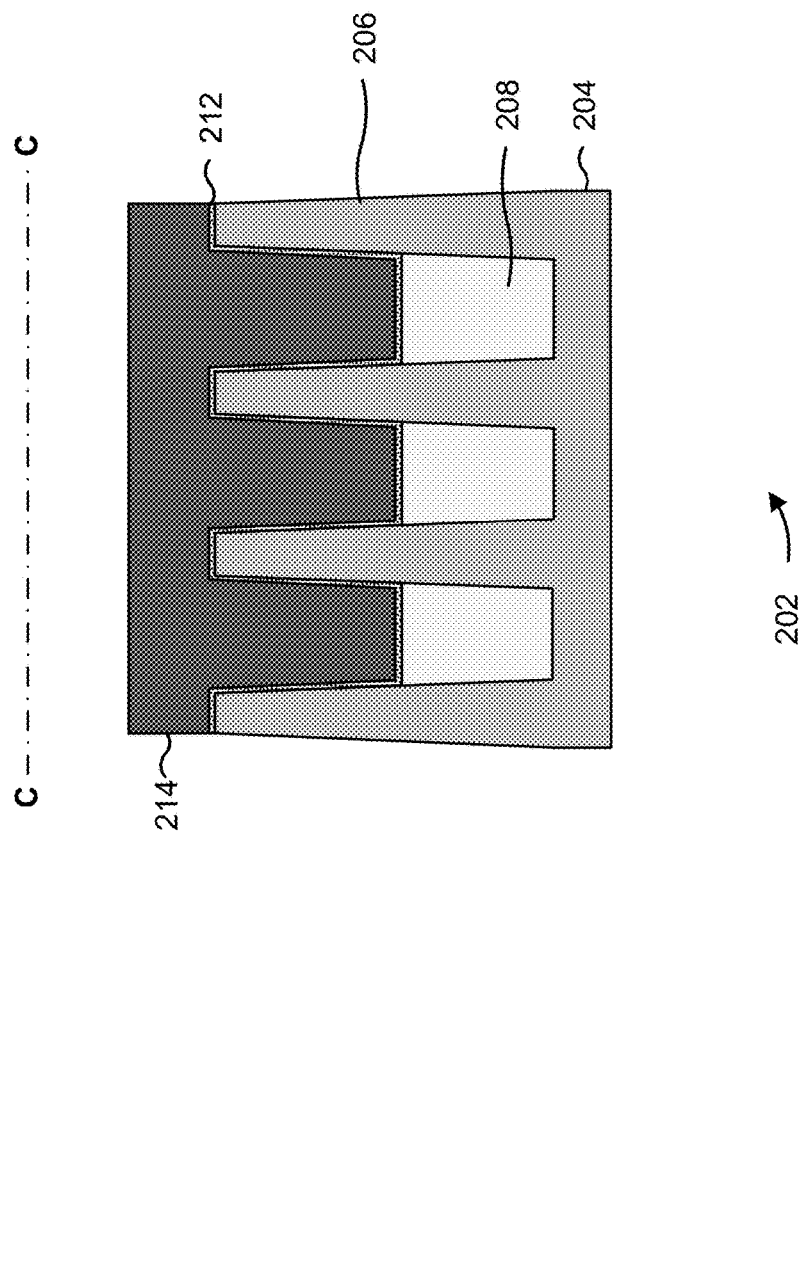
Figure 4E:
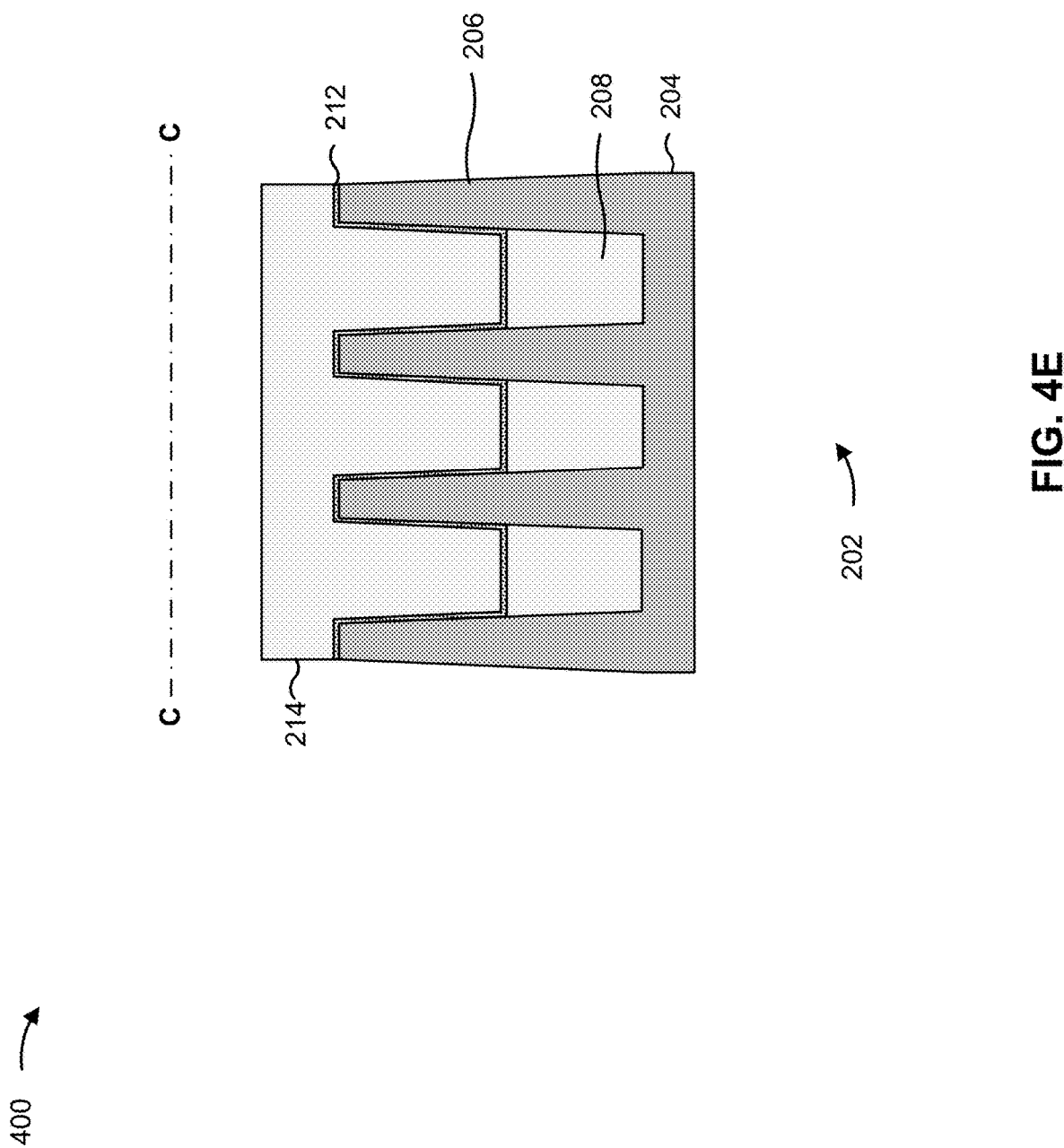
Figure 4F:
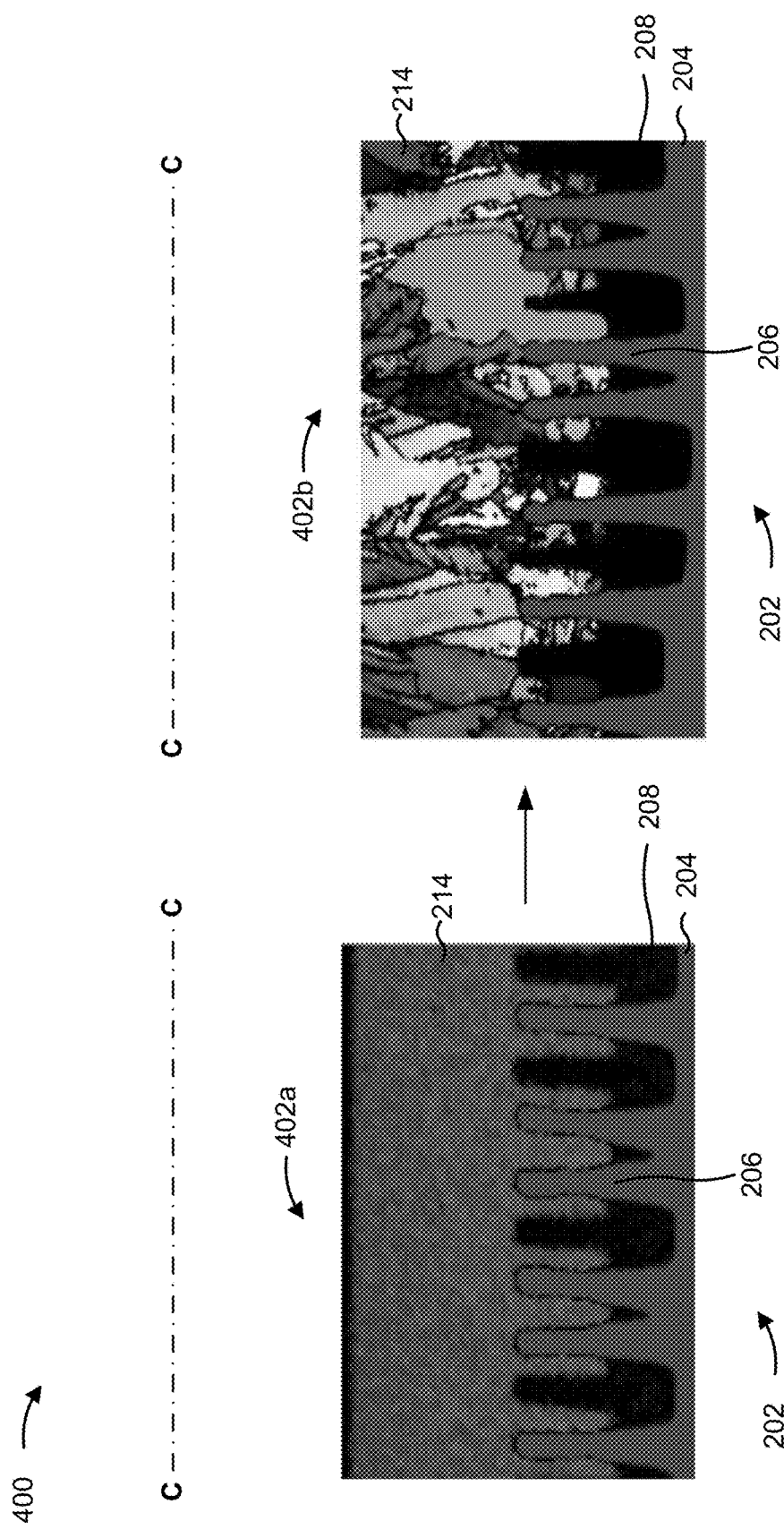
Figure 4G:
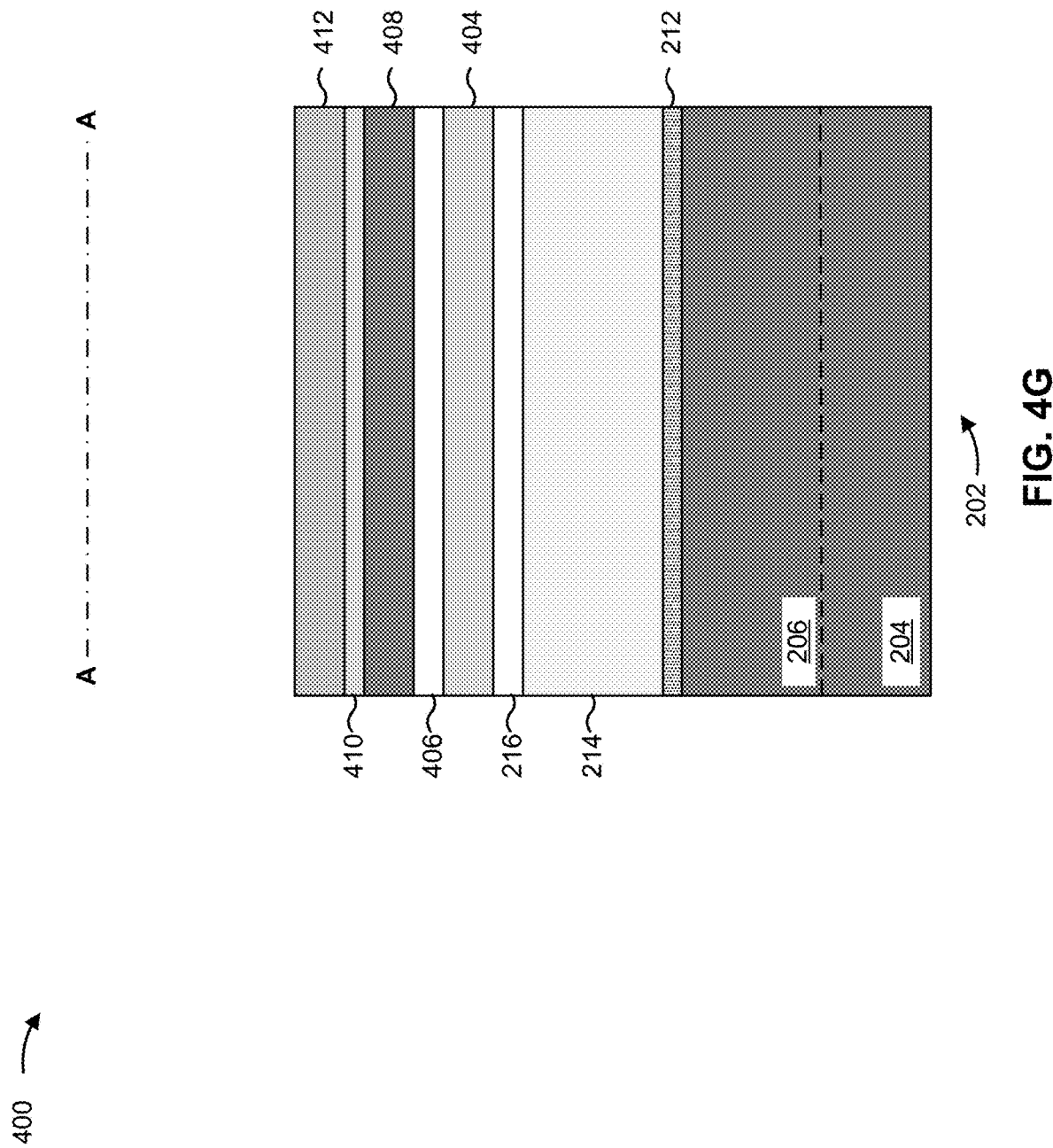
Figure 4H:
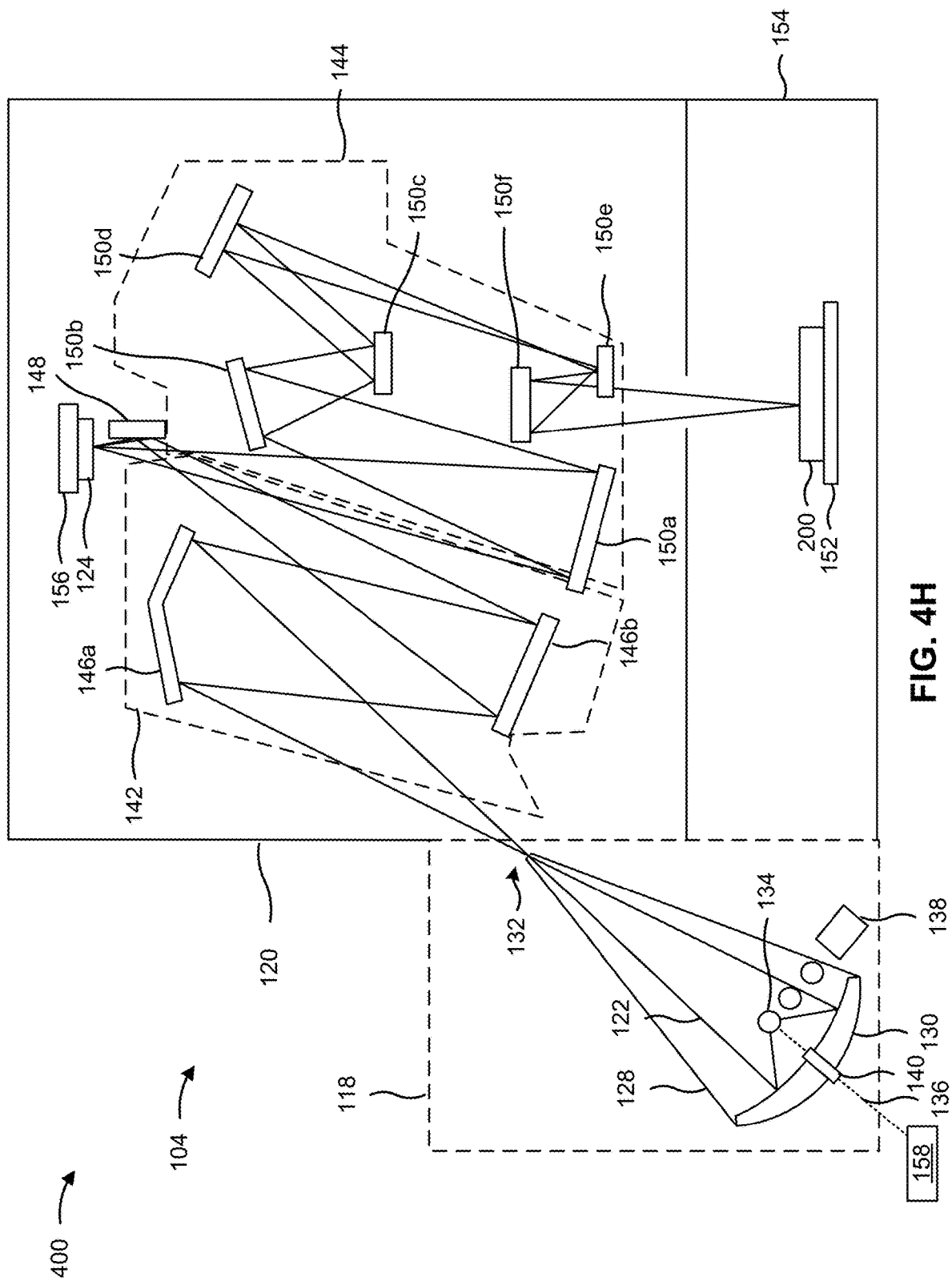
Figure 4I:
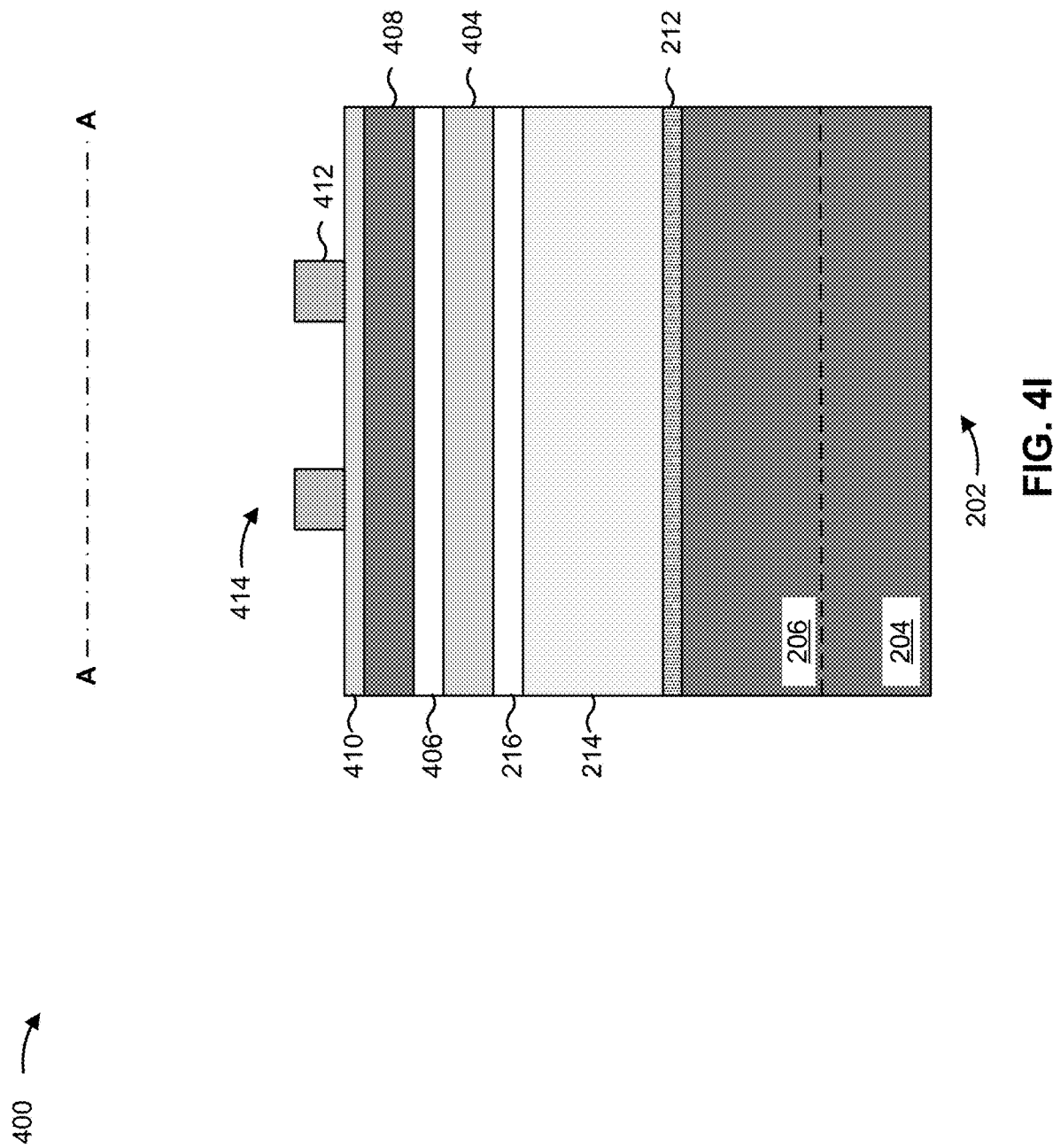
Figure 4J:
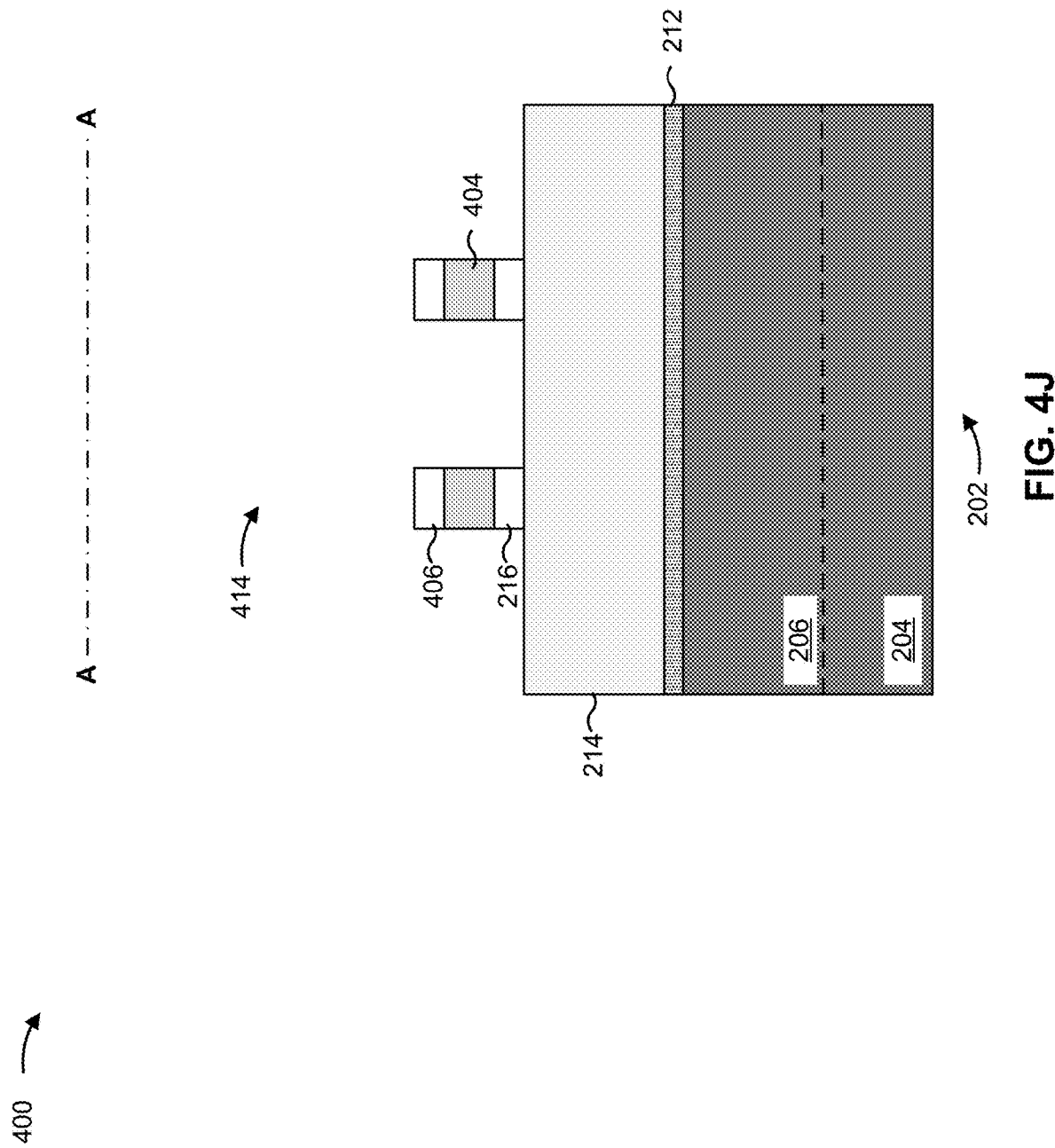
Figure 4L:
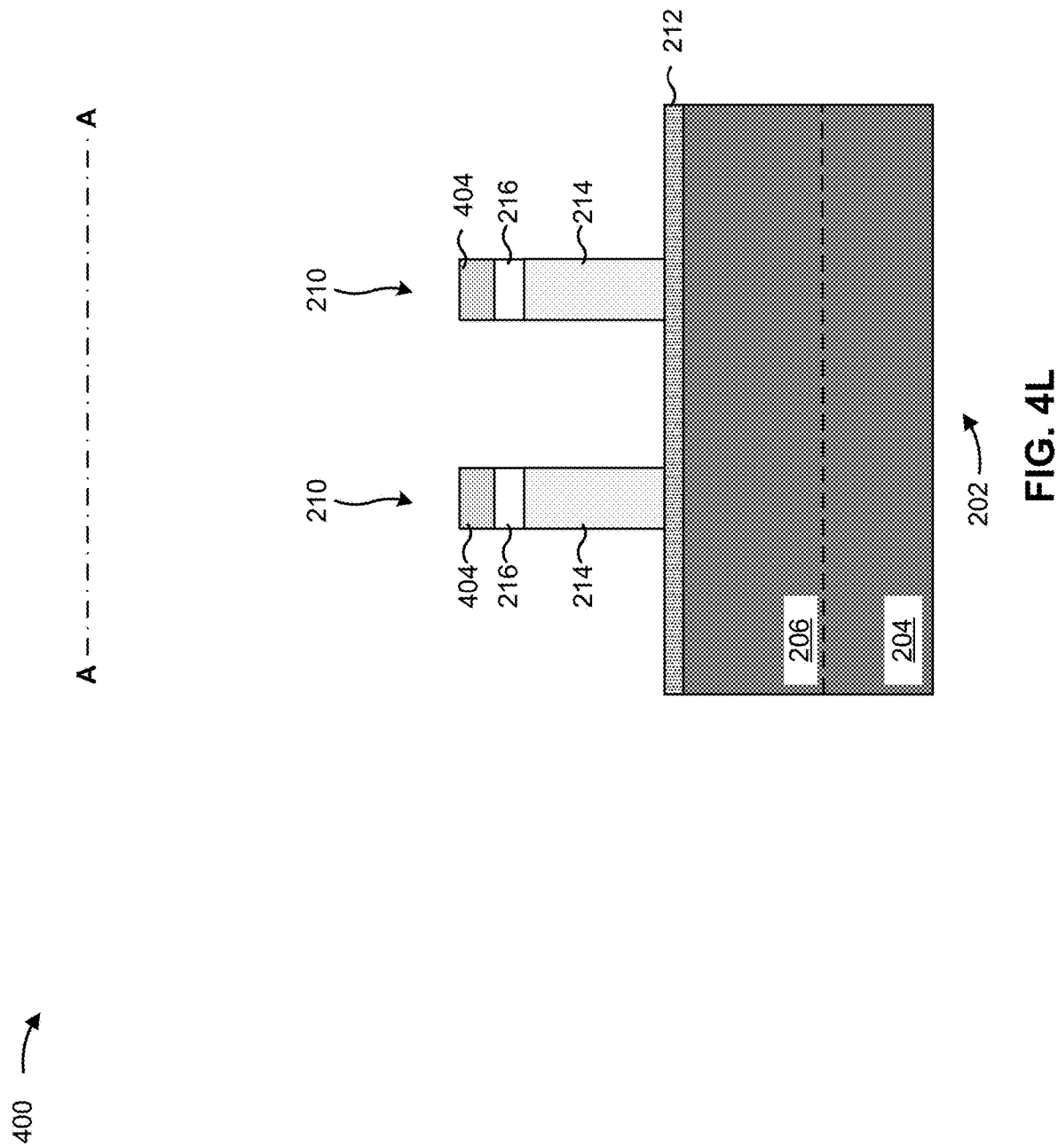
Figure 4M:
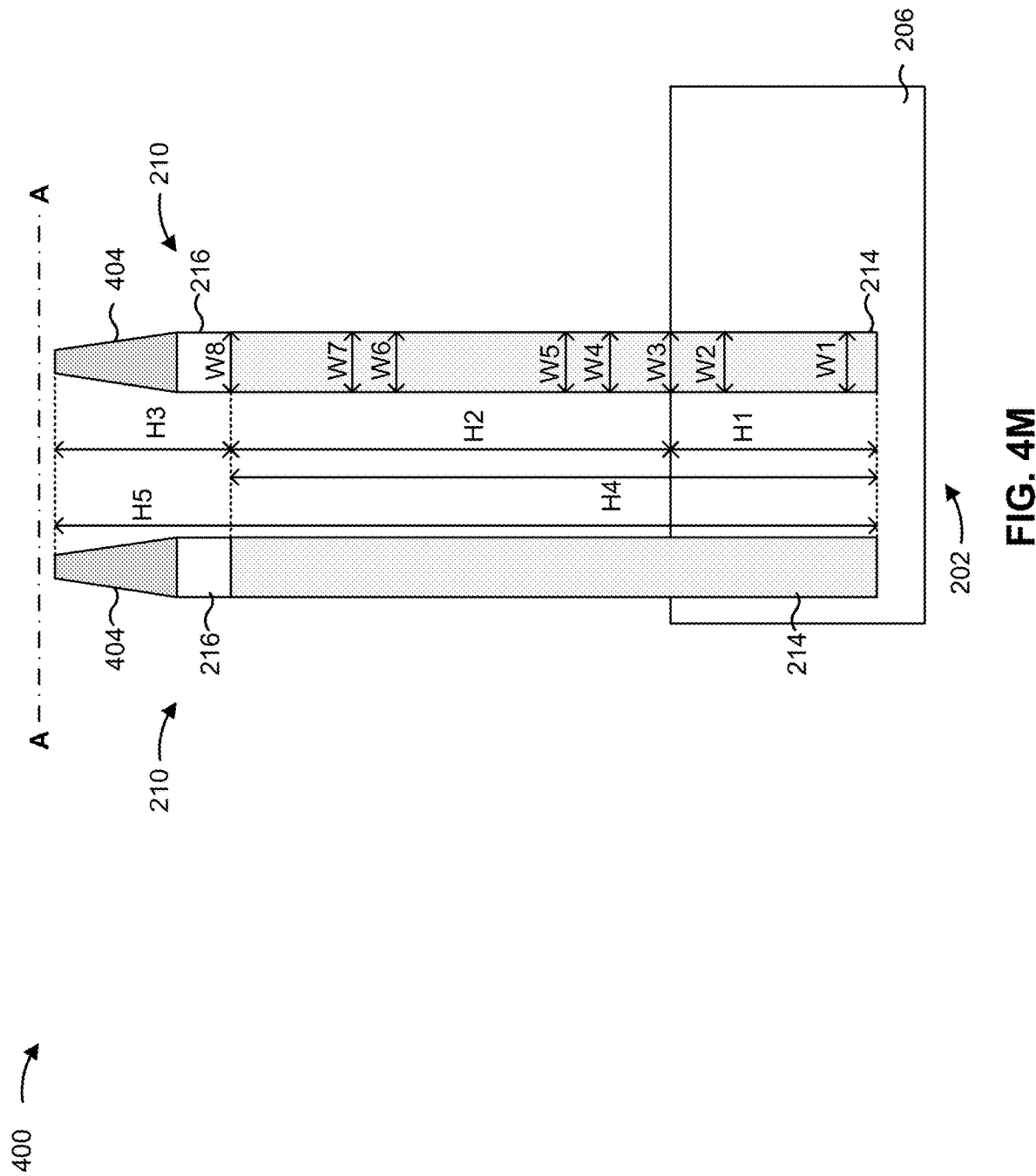
Figure 4N:
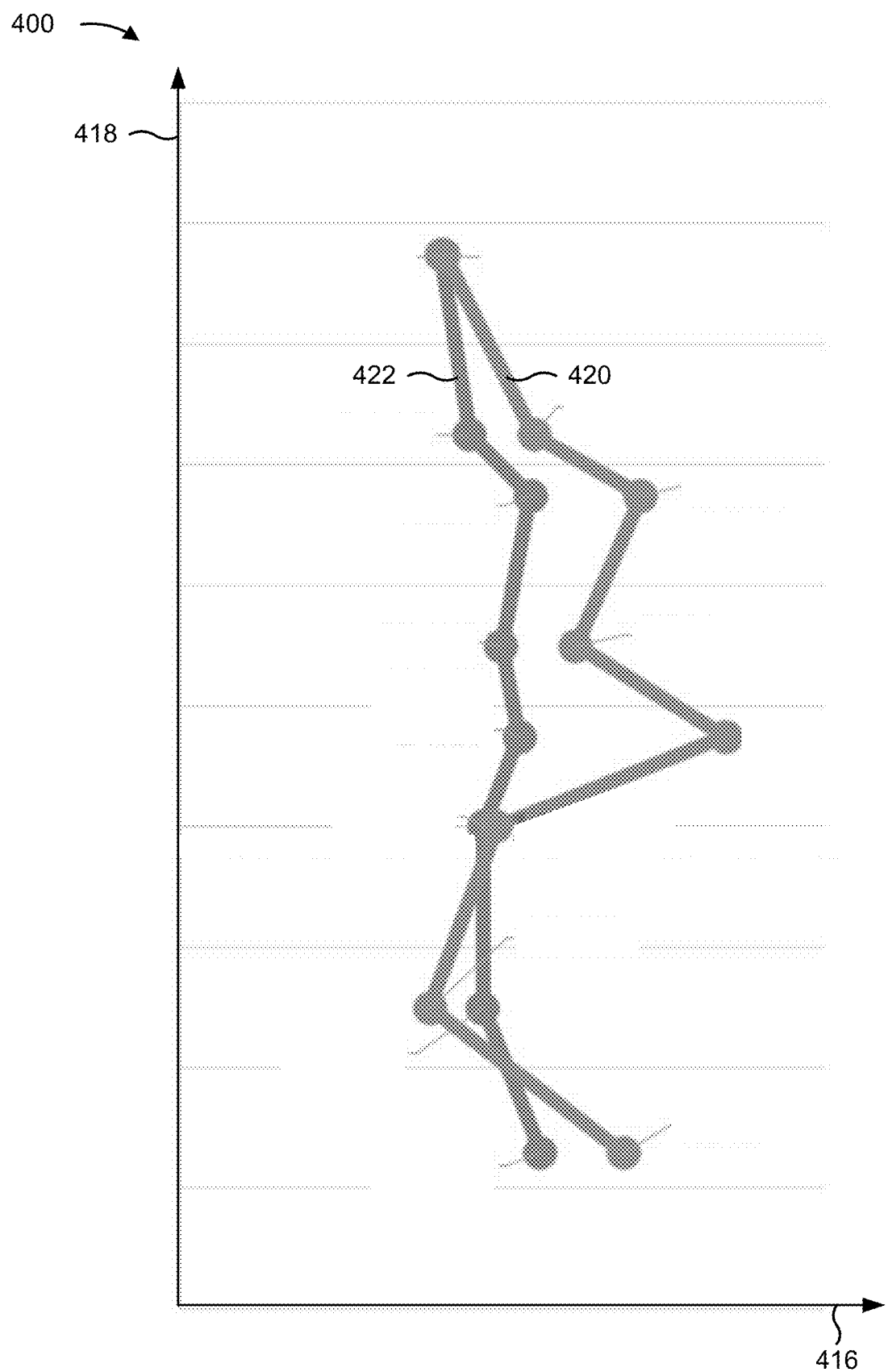

FIGS. 4A-4N are diagrams of an example implementation 400 described herein. The example implementation 400 includes an example dummy gate formation process in the device region 202 of the semiconductor device 200. FIGS. 4A-4N are illustrated from one or more perspectives of the cross-sectional planes in FIG. 2 for the device region 202. In some implementations, the operations described in connection with the example implementation 400 are performed after the fin formation process described in connection with FIGS. 3A-3D.

The dummy gate structures 210 are formed in the device region 202. The dummy gate structures 210 are formed and included over the fin structures 206, and around the sides of the fin structures 206 such that the dummy gate structures 210 surround the fin structure 206 on at least three sides of the fin structure 206. The dummy gate structures 210 are formed as placeholders for the actual gate structures (e.g., replacement high-k gate structures or metal gate structures) that are to be formed for the transistors included in the device region 202. The dummy gate structures 210 may be formed as part of a replacement gate process, which enables other layers and/or structures to be formed prior to formation of the replacement gate structures.

As shown in FIG. 4A, and as part of the dummy gate formation process, a gate dielectric layer 212 is formed. In some implementations, the deposition tool 102 performs a conformal deposition operation to conformally deposit the gate dielectric layer 212 on the fin structures 206 (e.g., on the tops and sidewalls of the fin structures 206) and on the top surfaces of the STI regions 208 between the fin structures 206. The gate dielectric layer 212 may include a dielectric oxide layer. In some implementations, the conformal deposition operation may include chemical oxidation, thermal oxidation, ALD, CVD, and/or other suitable methods.

As shown in FIGS. 4B-4D, a polysilicon layer 214 may be formed over and/or on the gate dielectric layer 212. In some implementations, the deposition tool 102 performs a blanket deposition operation to deposit the polysilicon layer 214 over the fin structures 206 (e.g., over the tops and sidewalls of the fin structures) and over the STI regions 208 between the fin structures 206. The blanket deposition operation may include a suitable deposition process, such as LPCVD or PECVD, among other examples.

As further shown in FIGS. 4B-4D, in some implementations, the deposition tool 102 and the etch tool 108 may perform a deposition-etch-deposition technique to form the polysilicon layer 214. The deposition-etch-deposition technique includes a cyclic technique in which the deposition tool 102 deposits a first layer of polysilicon material (shown in FIG. 4B), the etch tool 108 performs an etch operation to trim or remove some of the first layer polysilicon material, and the deposition tool 102 deposits a second layer of polysilicon material on the first layer of polysilicon material after the etch tool 108 trims the first layer of polysilicon material. In some implementations, the planarization tool 110 may perform a planarization operation after one or more of the deposition operations to planarize a top surface of one or more portions of the polysilicon layer 214 (e.g., that are located on the tops of the fin structures 206). In some implementations, the deposition tool 102 may perform a plurality of deposition operations to deposit a portion of the polysilicon layer 214 prior to the etch tool 108 performing an etch operation to trim the portion of the polysilicon layer 214.

The deposition-etch-deposition technique enables the formation of the polysilicon layer 214 to be precisely controlled to increase the gap-filling performance between the fin structures 206. The etch operation may be performed to remove portions of the first layer of polysilicon material on the sidewalls of the fin structures 206. This widens the opening between the sidewalls of adjacent fin structures 206, which enables the deposition tool 102 to more effectively deposit the polysilicon material at the bottom of the opening between adjacent fin structures 206 before the opening closes near the top of the adjacent fin structures 206. While FIGS. 4B-4D illustrate an example in which a single deposition-etch-deposition cycle is performed to form the polysilicon layer 214, a plurality of deposition-etch-deposition cycles may be performed in some implementations to form the polysilicon layer 214.

As shown in FIG. 4E, an annealing operation may be performed on the device region 202 of the semiconductor device 200 to remove defects from the polysilicon layer 214. The annealing tool 114 may perform the annealing operation to increase or elevate a temperature of the semiconductor device 200 (and thus, the temperature of the polysilicon layer 214) to enable the polysilicon material of the polysilicon layer 214 to flow. This enables the polysilicon layer 214 to be reconstructed to remove voids, seams, and/or other defects that might have been formed during deposition of the polysilicon layer 214.

The annealing operation may result in a reduction in a refractive index of the polysilicon layer 214. For example, the annealing operation may result in a reduction in a refractive index of the polysilicon layer 214 from a refractive index of approximately 4.7 to a refractive index of approximately 4.1. However, other values for the refractive index are within the scope of the present disclosure.

In some implementations, the annealing tool 114 performs the annealing operation at a temperature (e.g., a temperature in a chamber of the annealing tool 114, at a temperature of the semiconductor device 200) that is in a range of approximately 700 degrees Celsius to less than approximately 1410 degrees Celsius. Annealing the semiconductor device 200 at a temperature that is approximately 700 degrees Celsius or greater enables the polysilicon layer 214 to be reconstructed to remove defects from the polysilicon layer 214. Annealing the semiconductor device 200 at a temperature that is less than approximately 1410 degrees Celsius (the melting point of silicon) reduces the likelihood of and/or prevents damage to the polysilicon layer 214 and/or to other layers and/or structures of the semiconductor device 200. However, other values for the range are within the scope of the present disclosure. In some implementations, the annealing operation may be performed for a time duration that is in a range of approximately 1 minute to approximately 10 hours. However, other values for the range are within the scope of the present disclosure.

As shown in FIG. 4F, the annealing operation causes and/or results in a transition of the polysilicon layer 214 from a layer of amorphous polysilicon material 402a to a layer of crystalline polysilicon material 402b. As further shown in FIG. 4F, the crystalline polysilicon material 402b includes a plurality of portions or regions having different crystal grain orientations. Examples of crystal grain orientations include a (001) crystal grain orientation, a (101) crystal grain orientation, or a (111) crystal grain orientation. In some implementations, a portion of the crystalline polysilicon material 402b may include a combination of crystal grain orientations (e.g., a combination of two or more of a (001) crystal grain orientation, a (101) crystal grain orientation, or a (111) crystal grain orientation). Because the crystalline polysilicon material 402b includes a plurality of portions or regions having different crystal grain orientations, the polysilicon layer 214 includes a plurality of crystal grain boundaries. A crystal grain boundary includes an interface between two more regions having different crystal grain orientations.

In some implementations, the annealing tool 114 performs an annealing operation after one or more deposition operations for the polysilicon layer 214. In some implementations, the annealing tool 114 performs an annealing operation after each deposition operation in the deposition-etch-deposition technique described above. For example, the deposition tool 102 may form or deposit a first layer of amorphous polysilicon material. The annealing tool 114 may perform a first annealing operation to remove defects from the first layer amorphous polysilicon. The first annealing operation results in the first layer of amorphous polysilicon being transformed into a first layer of crystallized polysilicon material. The etch tool 108 may trim the first layer of crystallized polysilicon material. Then, the deposition tool 102 forms or deposits a second layer of amorphous polysilicon material on the first layer of crystallized polysilicon material. The annealing tool 114 may perform a second annealing operation to remove defects from the second layer of amorphous polysilicon material. The second annealing operation transforms the second layer of amorphous polysilicon material into a second layer of crystallized polysilicon material. In some implementations, the deposition tool 102, the etch tool 108, and/or the annealing tool 114 perform a greater quantity of operations than described in the example above.

As shown in FIG. 4G, one or more patterning layers may be formed over and/or on the polysilicon layer 214. In some implementations, the deposition tool 102 forms the one or more patterning layers after the polysilicon layer 214 is formed and/or after the annealing operation is performed. The one or more patterning layers may be deposited (e.g., by the deposition tool 102) by CVD, PVD, ALD, or another deposition technique.

The one or more patterning layers may include the hard mask layer 216. In some implementations, the one or more patterning layers include additional patterning layers, such as a hard mask layer 404, a hard mask layer 406, a hard mask layer 408, a hard mask layer 410, and/or a photoresist layer 412.

The hard mask layer 216 may a silicon nitride ($Si_xN_y$) and/or another suitable material. The hard mask layer 404 may include a silicon oxide ($SiO_x$), a plasma enhanced oxide (PEOX), and/or another suitable material. The hard mask layer 406 may include a silicon nitride ($Si_xN_y$) and/or another suitable material. The hard mask layer (BL) 408 and the hard mask layer (ML) 410 may each include a silicon nitride ($Si_xN_y$), a silicon oxide ($SiO_x$), and/or another suitable material. The photoresist layer (PR) 412 may include a photosensitive material that is configured to be patterned by exposure to electromagnetic radiation (e.g., light).

As shown in FIG. 4H, the semiconductor device 200 may be positioned on the wafer stage 152 of the exposure tool 104 (e.g., an EUV exposure tool 104) and exposed to the radiation 122 (e.g., EUV radiation) to form a pattern 414 in the photoresist layer 412 shown in FIG. 4I. The developer tool 106 develops and removes portions of the photoresist layer 412 to expose the pattern 414. As shown in FIG. 4J, the pattern 414 may subsequently be formed in additional layers of the one or more patterning layers by etching (e.g., performed by the etch tool 108) the pattern 414 into the hard mask layers 216, 404-410 based on the pattern 414 in the photoresist layer 412. As further shown in FIG. 4J, a subset of the one or more patterning layers (e.g., the hard mask layers 408 and 410) may be consumed and/or otherwise removed in the process of forming the pattern 414. The photoresist layer 412 may also be stripped and/or otherwise removed by an ashing operation and/or other photoresist removal operation.

The use of EUV lithography in forming the pattern 414 involves fewer processing operations relative to other pattern formation techniques, such as deep UV lithography and multi-patterning (e.g., self-aligned double patterning (SADP), self-aligned quadruple patterning (SAQP)), which reduces the processing complexity and processing time for forming the pattern 414. Moreover, the use of EUV lithography in forming the pattern 414 involves the use of fewer masking materials relative to other pattern formation techniques, which reduces material consumption in forming the pattern 414.

As shown in FIGS. 4K and 4L, the semiconductor device 200 may be positioned on the chuck 164 of the plasma-based etch tool 108 illustrated in FIG. 1C. The plasma-based etch tool 108 may perform a plasma-based etch operation (e.g., a dry etch operation) to etch the polysilicon layer 214 based on the pattern 414. In some implementations, the hard mask layer 406 and a portion of the hard mask layer 404 are consumed during the plasma-based etch operation.

The controller 192 may provide a signal to the RF source 182 to cause the RF source 182 to generate and provide RF power (e.g., through the matching network 184) to the inner plasma source 178 and/or to the outer plasma source 180. The RF power provided to the inner plasma source 178 and/or to the outer plasma source 180 causes the inner plasma source 178 and/or to the outer plasma source 180 to generate a plasma. The plasma may be based on one or more types of gasses, including nitrogen ($N_2$), oxygen ($O_2$), and/or argon (Ar), among other examples.

The controller 192 may provide one or more signals to the RF source 186 and/or the RF source 188 to cause the RF source 186 and/or the RF source 188 to generate and provide RF power to the chuck 164. The chuck 164 functions as a cathode that attracts ions in the plasma toward the semiconductor device 200. The ions bombard the semiconductor device 200, which causes the ions to remove material from the polysilicon layer 214, thereby etching the polysilicon layer 214. The RF power provided to the chuck 164 biases the chuck 164 to control the ion bombardment (e.g., the angle of the ion bombardment, the ion energy, and/or another parameter).

The plasma-based etch tool 108 may perform a dual RF source etch technique to etch the polysilicon layer 214 based on the pattern 414 to form the dummy gate structure(s) 210 in the device region 202 of the semiconductor device 200. The plasma-based etch tool 108 may etch the polysilicon layer 214 to remove portions of the polysilicon layer 214 (e.g., where the etching stops on or near the gate dielectric layer 212), such that remaining portions of the polysilicon layer 214 form parts of the dummy gate structures 210. As described above, the dual RF source etch technique includes the use of dual lower RF sources, including a high-frequency RF source (e.g., the RF source 186) and a low-frequency RF source (e.g., the RF source 188), to etch the polysilicon layer 214 to form the dummy gate structures 210. The controller 192 may control the RF source 186 and the RF source 188 to control the bombardment of ions onto the polysilicon layer 214, which enables precise control of the resulting shape and/or profile of the dummy gate structures 210.

The use of the dual RF source etch technique increases the effectiveness in etching through the plurality of crystal grain boundaries of the crystalline polysilicon material 402b of the polysilicon layer 214. In particular, the use of the dual RF source etch technique increases the directionality of etching to the crystalline polysilicon material 402b of the polysilicon layer 214. In other words, the use of the dual RF source etch technique provides a more vertical etching into the crystalline polysilicon material 402b of the polysilicon layer 214 (e.g., relative to the use of a single lower RF source), which enables the plasma-based etch tool 108 to more easily and effectively break through the plurality of crystal grain boundaries of the crystalline polysilicon material 402b. Accordingly, the use of the dual RF source etch technique increases the control over the etch rate in crystalline polysilicon material 402b of the polysilicon layer 214, which increases etch uniformity for the dummy gate structures 210.

The dual RF source etch technique may include pulsing the RF source 186 and/or the RF source 188 during the etch operation to etch the polysilicon layer 214. Pulsing may refer to a technique by which an RF source (e.g., the RF source 186, the RF source 188) is operated according to an on-and-off duration, in which the RF source is sequentially transitioned between an on duration (in which the RF source is on and performing a "duty" of generating RF power) and an off duration (in which the RF source is off and not generating RF power). The ratio between the time duration of the on duration and the time duration of the off duration in an on-and-off duration is referred to as a duty cycle. As an example, if the time duration of an on duration is 80% of an on-and-off duration and the time duration of an off duration is 20% of the on-and-off duration, the duty cycle of the RF source is 80%.

The RF source 186 and the RF source 188 may each be operated based on a respective duty cycle. This enables synchronized pulsing of the RF source 186 and the RF source 188 such that the RF source 186 and the RF source 188 may be turned off for one or more off durations so that byproducts of the plasma-based etch operation may be removed. This enables deeper and straighter etching into the polysilicon layer 214 (e.g., as opposed to the use of continuous ion bombardment), which enables the dummy gate structures 210 to be formed to a greater aspect ratio (e.g., a greater ratio of a height of the dummy gate structures 210 to a width of the dummy gate structures 210). In some implementations, the controller 192 may provide a synchronization delay signal to the RF source 186 and the RF source 188 to cause the RF source 186 and the RF source 188 to be sequentially pulsed based on a cycle offset such that on durations of the RF source 186 and on durations of the RF source 188 are non-overlapping (or only partially overlapping). In some implementations, the controller 192 may provide a phase delay signal to the RF source 182 and one or more of the RF source 186 or the RF source 188 to cause a phase shift between the upper RF source and the lower RF source(s) of the plasma-based etch tool 108. In other words, the phase delay signal causes a delay or time offset between plasma generation and ion bombardment. The phase delay signal enables the RF source 182, the inner plasma source 178, and the outer plasma source 180 to generate the plasma before the RF source 186 and/or the RF source 188 functions to facilitate ion bombardment. This may lower the instability of the plasma orientation due to the generated ion energy, which might otherwise neutralize first before ion bombardment on the surface of the semiconductor device 200.

Pulsing the RF source 186 and/or the RF source 188 may further enable the plasma-based etch tool 108 to selectively increase or decrease the ion energy of the ions in the plasma and/or to selectively increase or decrease the IADF of the ions in the plasma to achieve a particular shape and/or profile for the dummy gate structures 210. As described above, the RF source 186 may be referred to as a high-frequency RF source in that the RF source 186 may be configured to operate in a frequency range such as approximately 10 MHz to approximately 30 MHz, among other examples. This relatively high frequency range for the RF source 186 may provide a wide IADF, which enables the plasma-based etch tool 108 to increase the width of recesses etched into the polysilicon layer 214 to form the dummy gate structures 210. As also described above, the RF source 188 may be referred to as a low-frequency RF source in that the RF source 188 may be configured to operate in a frequency range such as approximately 400 kHz to approximately 2 MHz, among other examples. This relatively low frequency range for the RF source 188 enables the RF source 188 to provide sufficient ion bombardment energy to etch the polysilicon layer 214 while providing a high directionality (e.g., vertical directionality) to enable the ions to break through the plurality of crystal grain boundaries of the crystalline polysilicon material 402b to etch through the crystalline structure of the polysilicon layer 214. However, other values for the frequency ranges of the RF source 186 and the RF source 188 are within the scope of the present disclosure.

In some implementations, the controller 192 may determine one or more parameters for the dual RF source etch technique using a machine learning model. In some implementations, the controller 192 uses the machine learning model to determine the one or more parameters by providing candidate parameters (e.g., candidate frequencies for the RF source 186 and/or for the RF source 188, candidate duty cycles for the RF source 186 and/or for the RF source 188, candidate cycle offsets for the RF source 186 and/or for the RF source 188, a quantity of etch operations) as input to the machine learning model, and using the machine learning model to determine a likelihood, probability, or confidence that a particular outcome (e.g., a particular shape or profile for the dummy gate structures 210, a particular LWR for the dummy gate structures 210, a particular aspect ratio for the dummy gate structures 210) for the plasma-based etch operation will be achieved using the candidate parameters. In some implementations, the controller 192 provides a particular outcome (e.g., a particular shape or profile for the dummy gate structures 210, a particular LWR for the dummy gate structures 210, a particular aspect ratio for the dummy gate structures 210) as input to the machine learning model, and the controller 192 uses the machine learning model to determine or identify a particular combination of parameters (e.g., a frequency for the RF source 186, a frequency for the RF source 188, a duty cycle for the RF source 186, a duty cycle for the RF source 188, a cycle offset for the RF source 186 and the RF source 188, a quantity of etch operations) for the dual RF source etch technique that are likely to achieve the particular outcome.

The controller 192 (or another system) may train, update, and/or refine the machine learning model to increase the accuracy of the outcomes and/or parameters determined using the machine learning model. The controller 192 may train, update, and/or refine the machine learning model based on feedback and/or results from the plasma-based etch operation in which the dual RF source etch technique is used, as well as from historical or related plasma-based etch operations in which the dual RF source etch technique is used operations (e.g., from hundreds, thousands, or more historical or related plasma-based etch operations in which the dual RF source etch technique is used) performed by the plasma-based etch tool 108.

FIG. 4M illustrates example dimensions for the dummy gate structures 210 that are formed using EUV lithography and the dual RF source etch technique described herein. As described herein, the use of EUV lithography and the dual RF source etch technique may enable the aspect ratio of the dummy gate structures 210 to be increased (e.g., relative to the use of other lithography techniques and/or relative to the use of a single RF source).

As shown in FIG. 4M, an example dimension includes a fin height (H1) from a bottom of a dummy gate structure 210 to a top of a fin structure 206. In some implementations, the fin height (H1) is in a range of approximately 48 nanometers to approximately 60 nanometers. However, other values for the range are within the scope of the present disclosure. Another example dimension includes a gate height (H2) from the top of the fin structure 206 to a top of a polysilicon layer 214 of the dummy gate structure 210. In some implementations, the gate height (H2) is in a range of approximately 80 nanometers to approximately 100 nanometers. However, other values for the range are within the scope of the present disclosure.

Another example dimension includes a hard mask height (H3) from a top of a dummy gate structure 210 to a top of one or more hard mask layers on the dummy gate structure 210 (e.g., a top of the hard mask layer 404). In some implementations, the hard mask height (H3) is in a range of approximately 72 nanometers to approximately 88 nanometers. However, other values for the range are within the scope of the present disclosure. As further shown in FIG. 4M, the hard mask layers 404 may be tapered (e.g., may increase in width from a top of the hard mask layers 404 to a bottom of the hard mask layers 404) after etching of the polysilicon layer 214 based on the pattern 414.

Another example dimension includes a height (H4) from a bottom of a dummy gate structure 210 to a top of a polysilicon layer 214 of the dummy gate structure 210. In some implementations, the height (H4) is in a range of approximately 128 nanometers to approximately 160 nanometers. However, other values for the range are within the scope of the present disclosure. Another example dimension includes a height (H5) from a bottom of a dummy gate structure 210 to a top of one or more hard mask layers on the dummy gate structure 210. In some implementations, the height (H5) is in a range of approximately 200 nanometers to approximately 248 nanometers. However, other values for the range are within the scope of the present disclosure.

As further shown in FIG. 4M, a dummy gate structure 210 may include a plurality of critical dimensions or widths. The use of EUV lithography and/or the dual RF source etch technique may enable the dummy gate structure 210 to be formed in a manner such that variation of the widths is minimized, which decreases the LWR of the dummy gate structure 210. An example width (W1) may be located at a bottom of the dummy gate structure 210 approximately 48 nanometers to approximately 60 nanometers below the top surface of the fin structure 206. Another example width (W2) may be located approximately 27 nanometers to approximately 33 nanometers below the top surface of the fin structure 206. Another example width (W3) may be located approximately at the top surface of the fin structure 206. Another example width (W4) may be located approximately 13 nanometers to approximately 17 nanometers above the top surface of the fin structure 206. Another example width (W5) may be located approximately 27 nanometers to approximately 33 nanometers above the top surface of the fin structure 206. Another example width (W6) may be located approximately 50 nanometers to approximately 60 nanometers above the top surface of the fin structure 206. Another example width (W7) may be located approximately 58 nanometers to approximately 72 nanometers above the top surface of the fin structure 206. Another example width (W8) may be located approximately at the top of the polysilicon layer 214.

In some implementations, the use of EUV lithography and/or the dual RF source etch technique may enable an aspect ratio, of the fin height (H1) to one or more of the widths W1-W8, in a range of approximately 4:1 to approximately 5:1 to be achieved. However, other values for the range are within the scope of the present disclosure. In some implementations, the use of EUV lithography and/or the dual RF source etch technique may enable an aspect ratio, of the height (H4) to one or more of the widths W1-W8, in a range of approximately 11.5:1 to approximately 12.5:1 to be achieved. However, other values for the range are within the scope of the present disclosure. In some implementations, the use of EUV lithography and/or the dual RF source etch technique may enable an aspect ratio, of the height (H5) to one or more of the widths W1-W8, in a range of approximately 18:1 to approximately 19:1 to be achieved, whereas an aspect ratio of approximately 14.5:1 to approximately 16:1 may be achievable using other lithography techniques and/or using a single RF source. However, other values for the range are within the scope of the present disclosure.

As shown in FIG. 4N, the dual RF source etch technique described herein results in reduced LWR for the dummy gate structures 210. An example LWR for a dummy gate structure formed using a single RF source etch technique, and an example LWR for a dummy gate structure 210 formed using the dual RF source etch technique described herein, are illustrated as a function of metal gate critical dimension (CD) (or metal gate width) 416 along a gate height 418. FIG. 4N illustrates dummy gate critical dimension variation for a single RF source etch technique (corresponding to plot line 420 in FIG. 4N) and for the dual RF source etch technique described herein (corresponding to plot line 422). As shown in FIG. 4N, the dummy gate critical dimension variation for the dual RF source etch technique described herein is generally more uniform and consistent along the gate height 418 relative to the dummy gate critical dimension variation for a single RF source etch technique. As an example, the 3-sigma metal gate critical dimension variation (e.g., the average variation in the dummy gate critical dimension 416 per 5 nanometers of gate height 418) for the dual RF source etch technique described herein may be less than approximately 1 nanometer, whereas the 3-sigma metal gate critical dimension variation for a single RF source etch technique may be greater than approximately 2 nanometers.

As indicated above, FIGS. 4A-4N are provided as examples. Other examples may differ from what is described with regard to FIGS. 4A-4N.

Figure 5A:
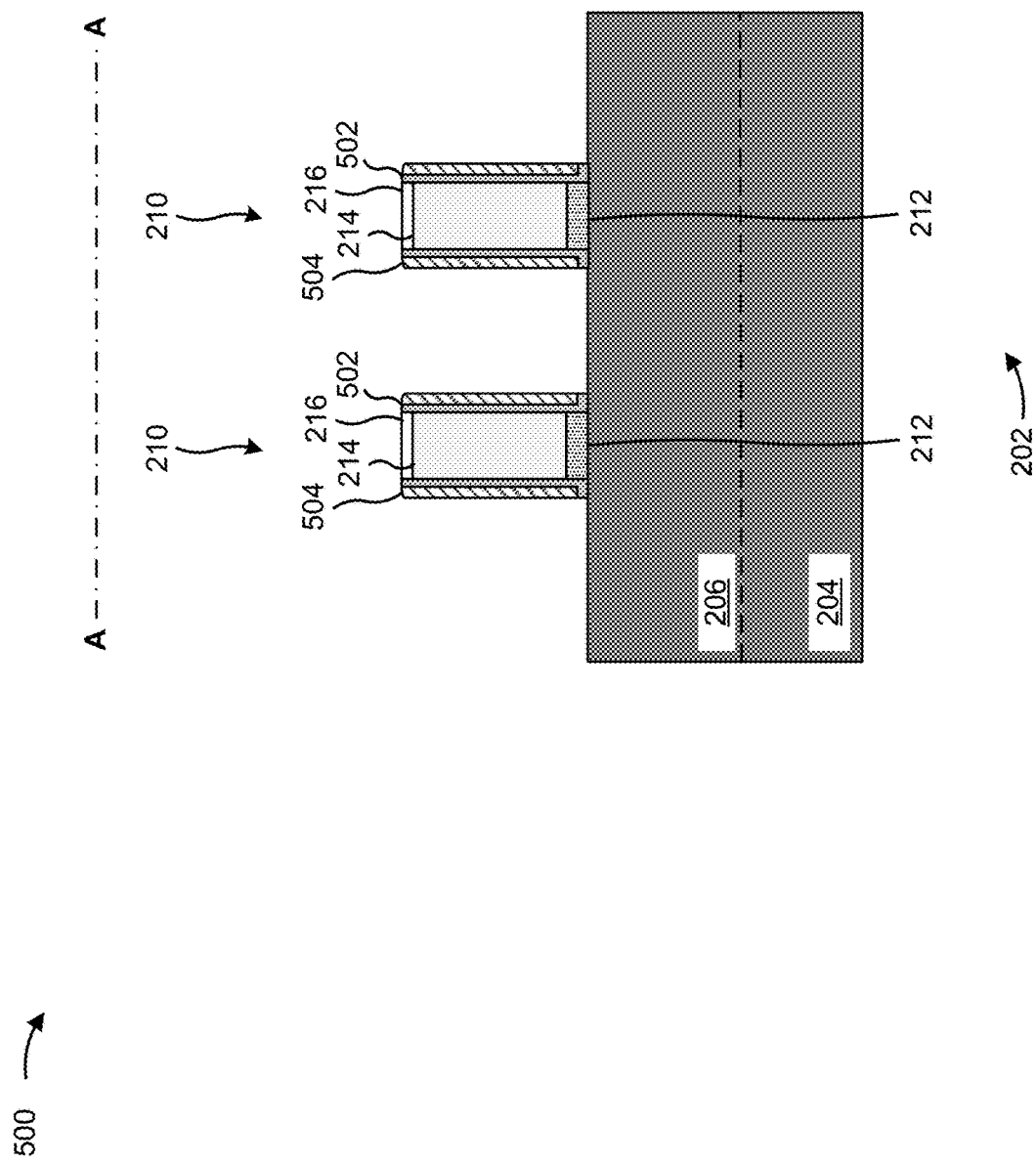
Figure 5B:
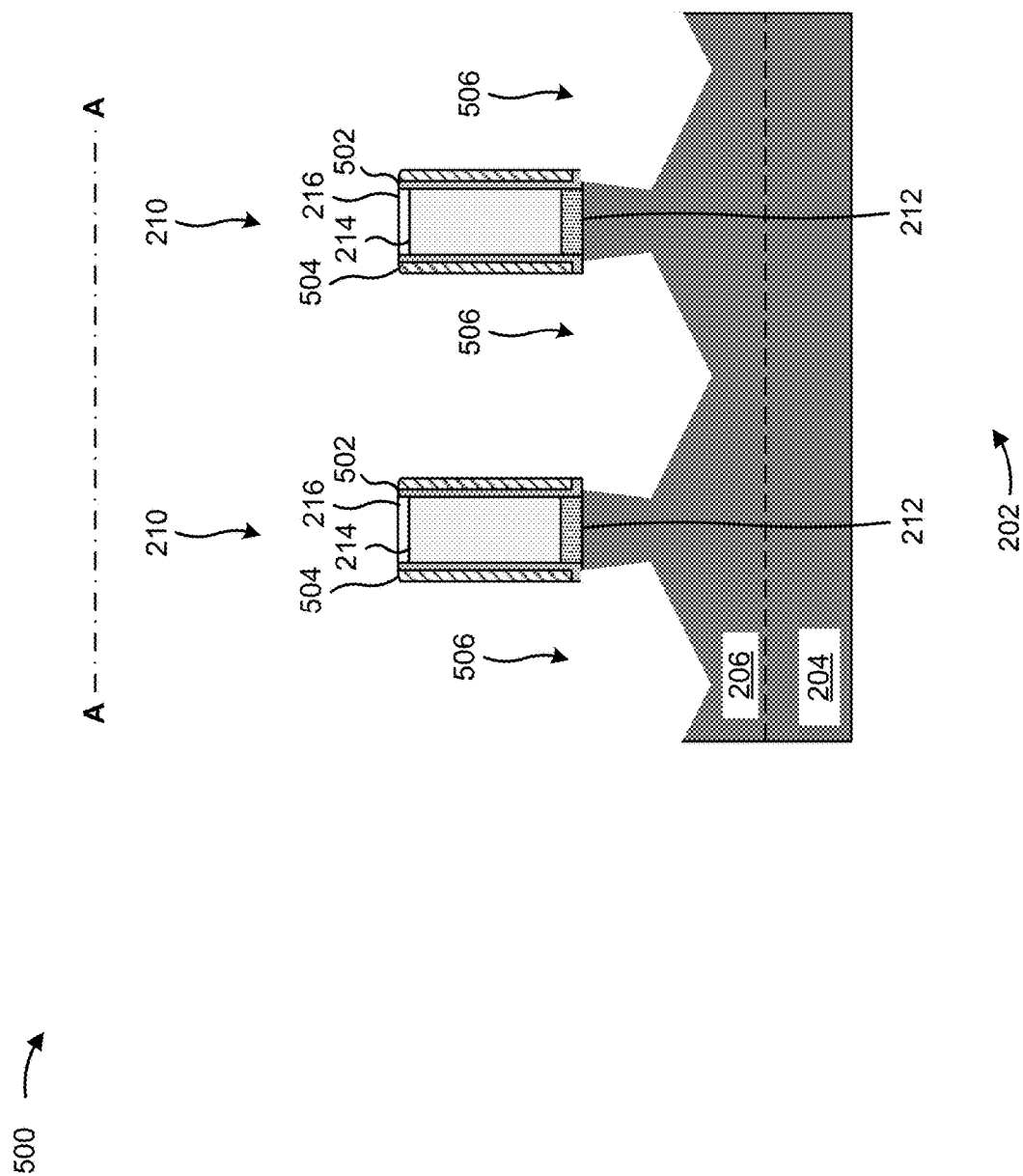
Figure 5C:
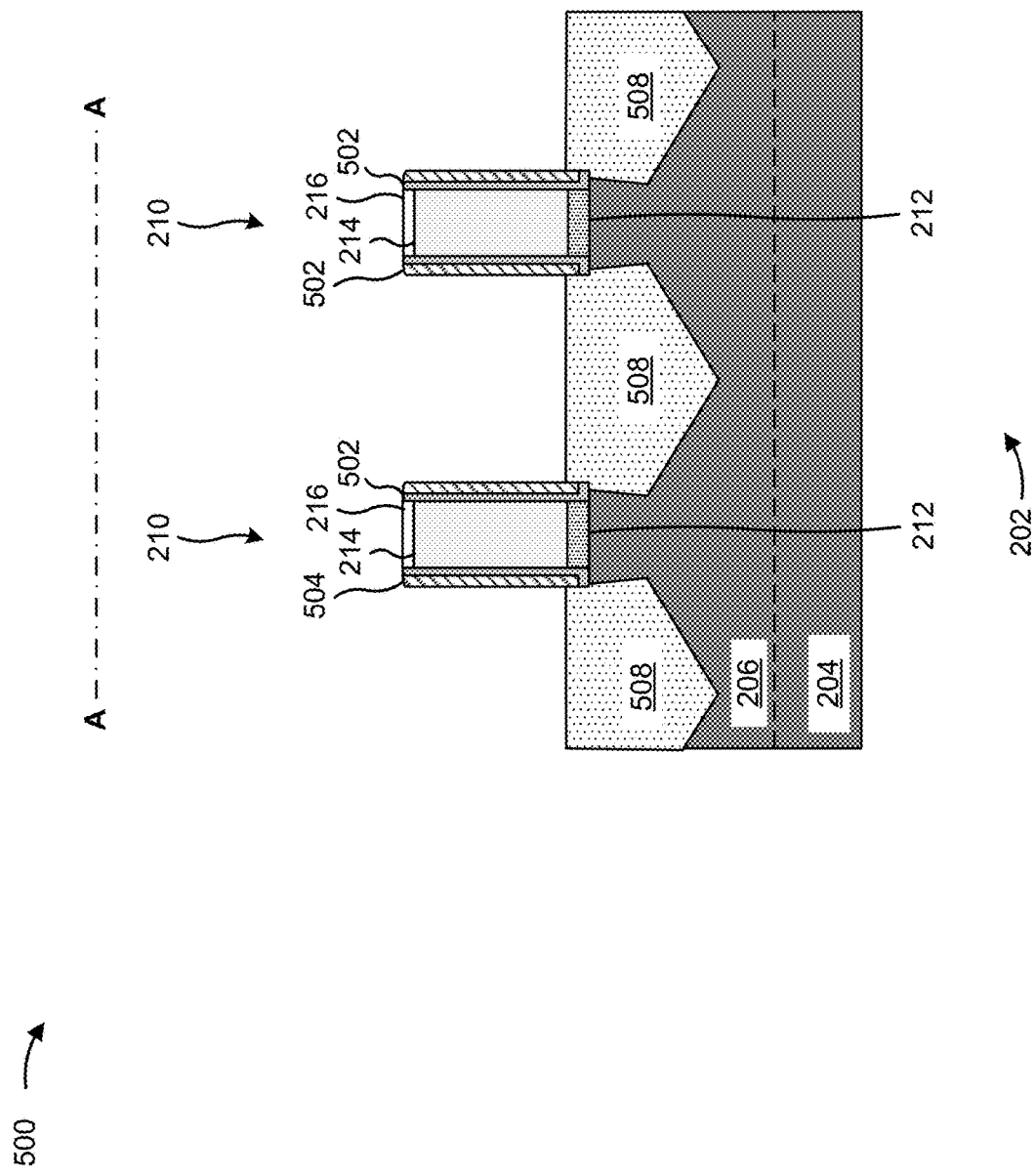

FIGS. 5A-5C are diagrams of an example implementation 500 described herein. The example implementation 500 includes an example of forming source/drain regions in the source/drain areas 218 of the device region 202 of the semiconductor device 200. FIGS. 5A-5C are illustrated from the perspective of the cross-sectional plane A-A in FIG. 2 for the device region 202. In some implementations, the operations described in connection with the example implementation 500 are performed after the dummy gate structure formation process described in connection with FIGS. 4A-4N.

As shown in FIG. 5A, seal spacer layers 502 are formed on the sidewalls of the dummy gate structures 210. The seal spacer layers 502 may be conformally deposited (e.g., by the deposition tool 102) and may include a silicon oxycarbide (SiOC), a nitrogen free SiOC, or another suitable material. The seal spacer layers 502 may be formed by an ALD operation in which various types of precursor gasses including silicon (Si) and carbon (C) are sequentially supplied in a plurality of alternating cycles to form the seal spacer layers 502, among other example deposition techniques.

As further shown in FIG. 5A, bulk spacer layers 504 may be formed on the seal spacer layers 502. The bulk spacer layers 504 may be formed of similar materials as the seal spacer layers 502. However, the bulk spacer layers 504 may formed without plasma surface treatment that is used for the seal spacer layers 502. Moreover, the bulk spacer layers 504 may be formed to a greater thickness relative to the thickness of the seal spacer layers 502.

In some implementations, the seal spacer layers 502 and the bulk spacer layers 504 are conformally deposited (e.g., by the deposition tool 102) on the dummy gate structures 210, and on the fin structures 206. The seal spacer layers 502 and the bulk spacer layers 504 are then patterned (e.g., by the deposition tool 102, the exposure tool 104, and the developer tool 106) and etched (e.g., by the etch tool 108) to remove the seal spacer layers 502 and the bulk spacer layers 504 from the tops of the dummy gate structures 210 and from the fin structures 206.

As shown in FIG. 5B, recesses 506 are formed in the fin structures 206 in the device region 202 between the dummy gate structures 210 in an etch operation. The etch operation may be referred to a first strained source/drain (SSD) etch operation, and the recesses 508 may be referred to as strained source/drain recesses. In some implementations, the first etch operation includes a plasma etch technique, a wet chemical etch technique, and/or another type of etch technique.

In some implementations, a plurality of etch operations are performed to form recesses 506 for different types of transistors. For example, a photoresist layer may be formed over and/or on a first subset of the fin structures 206 and over and/or on a first subset of the dummy gate structures 210 such that a second subset of the fin structures 206 between a second subset of the dummy gate structures 210 such that p-type source/drain regions and n-type source/drain regions may be formed in separate epitaxial operations.

As shown in FIG. 5C, source/drain regions 508 are formed in the recesses 506 in the device region 202 of the semiconductor device 200 over the substrate 204. The deposition tool 102 forms the source/drain regions 508 by an epitaxial operation, in which layers of the epitaxial material are deposited in the recesses 506 such that the layers of p-type source/drain regions and/or layers of n-type source/drain regions are formed by epitaxial growth in a particular crystalline orientation. The source/drain regions 508 are included between the dummy gate structures 210 and at least partially below and/or lower than the dummy gate structures 210. Moreover, the source/drain regions 508 at least partially extend above the top surface of the fin structures 206.

The material (e.g., silicon (Si), gallium (Ga), or another type of semiconductor material) that is used to form the source/drain regions 508 may be doped with a p-type dopant (e.g., a type of dopant that includes electron acceptor atoms that create holes in the material), with an n-type dopant (e.g., a type of dopant that includes electron donor atoms that create mobile electrons in the material), and/or with another type of dopant. The material may be doped by adding impurities (e.g., the p-type dopant, the n-type dopant) to a source gas that is used during the epitaxial operation. Examples of p-type dopants that may be used in the epitaxial operation include boron (B) or germanium (Ge), among other examples. The resulting material of p-type source/drain regions include silicon germanium ($Si_xGe_{1-x}$, where x can be in a range from approximately 0 to approximately 1) or another type of p-doped semiconductor material. Examples of n-type dopants that may be used in the epitaxial operation include phosphorous (P) or arsenic (As), among other examples. The resulting material of n-type source/drain regions include silicon phosphide ($Si_xP_y$) or another type of n-doped semiconductor material.

As indicated above, FIGS. 5A-5C are provided as an example. Other examples may differ from what is described with regard to FIGS. 5A-5C.

FIGS. 6A-6F are diagrams of an example implementation 600 described herein. The example implementation 600 includes an example dummy gate replacement process, in which the dummy gate structures 210 are replaced with high-k gate structures and/or metal gate structures. FIGS. 6A-6D are illustrated from the perspective of the cross-sectional plane A-A in FIG. 2 for the device region 202.

Figure 6A:
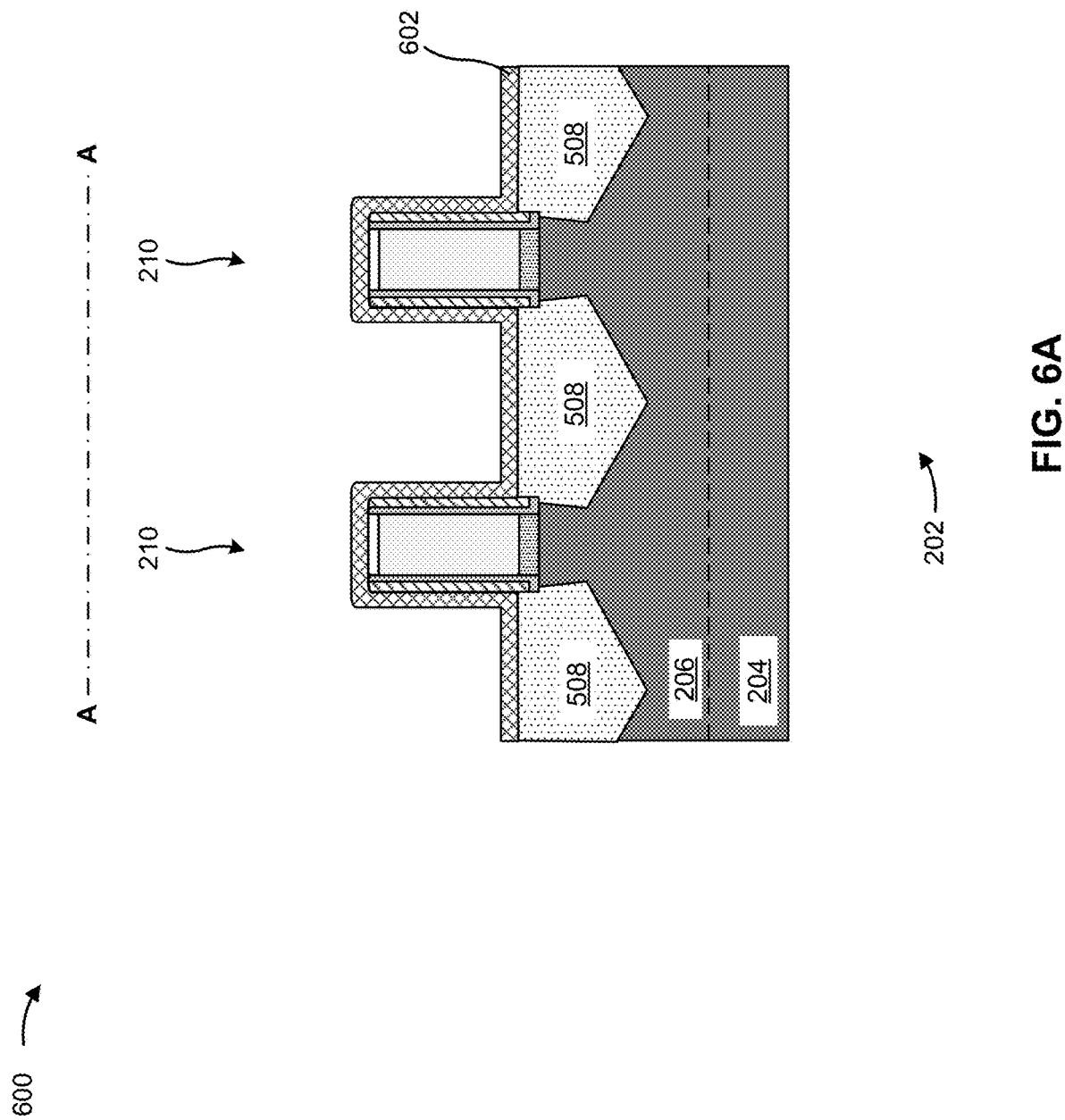

As shown in FIG. 6A, a contact etch stop layer (CESL) 602 is conformally deposited (e.g., by the deposition tool 102) over the source/drain regions 508, over the dummy gate structures 210, and on the sidewalls of the bulk spacer layers 504. The CESL 602 may provide a mechanism to stop an etch process when forming contacts or vias for the device region 202. The CESL 602 may be formed of a dielectric material having a different etch selectivity from adjacent layers or components. The CESL 602 may include or may be a nitrogen containing material, a silicon containing material, and/or a carbon containing material. Furthermore, the CESL 602 may include or may be silicon nitride ($Si_xN_y$), silicon carbon nitride (SiCN), carbon nitride (CN), silicon oxynitride (SiON), silicon carbon oxide (SiCO), or a combination thereof, among other examples. The CESL 602 may be deposited using a deposition process, such as ALD, CVD, or another deposition technique.

Figure 6B:
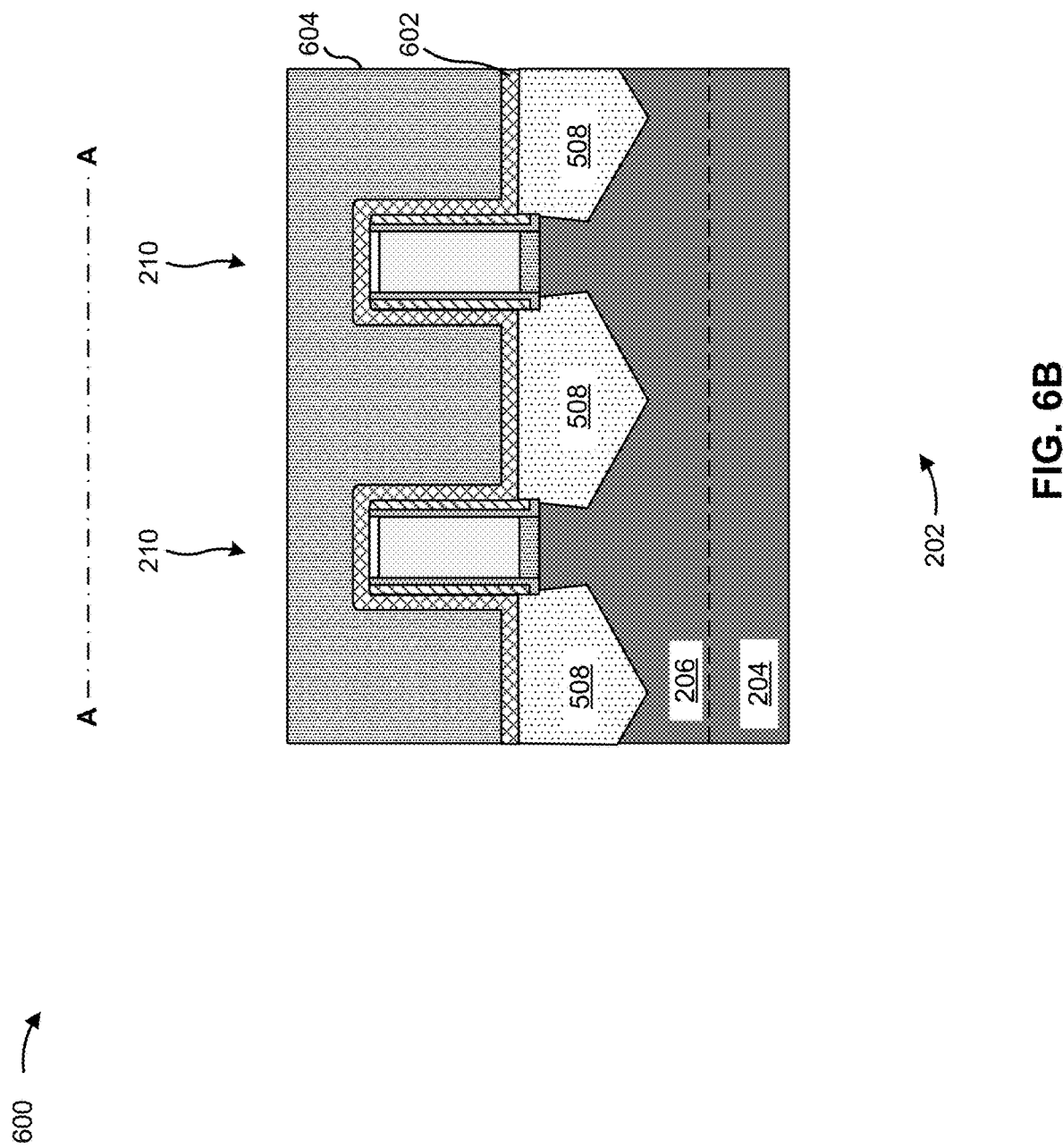

As shown in FIG. 6B, an interlayer dielectric (ILD) layer 604 is formed (e.g., by the deposition tool 102) over and/or on the CESL 602. The ILD layer 604 fills in the areas between the dummy gate structures 210 over the source/drain regions 508. The ILD layer 604 is formed to permit a replacement gate structure process to be performed in the device region 202, in which metal gate structures are formed to replace the dummy gate structures 210. The ILD layer 604 may be referred to as an ILD zero (ILD0) layer.

In some implementations, the ILD layer 604 is formed to a height (or thickness) such that the ILD layer 604 covers the dummy gate structures 210. In these implementations, a subsequent CMP operation (e.g., performed by the planarization tool 110 is performed to planarize the ILD layer 604 such that the top surfaces of the ILD layer 604 are approximately at a same height as the top surfaces of the dummy gate structures 210. The increases the uniformity of the ILD layer 04.

Figure 6C:
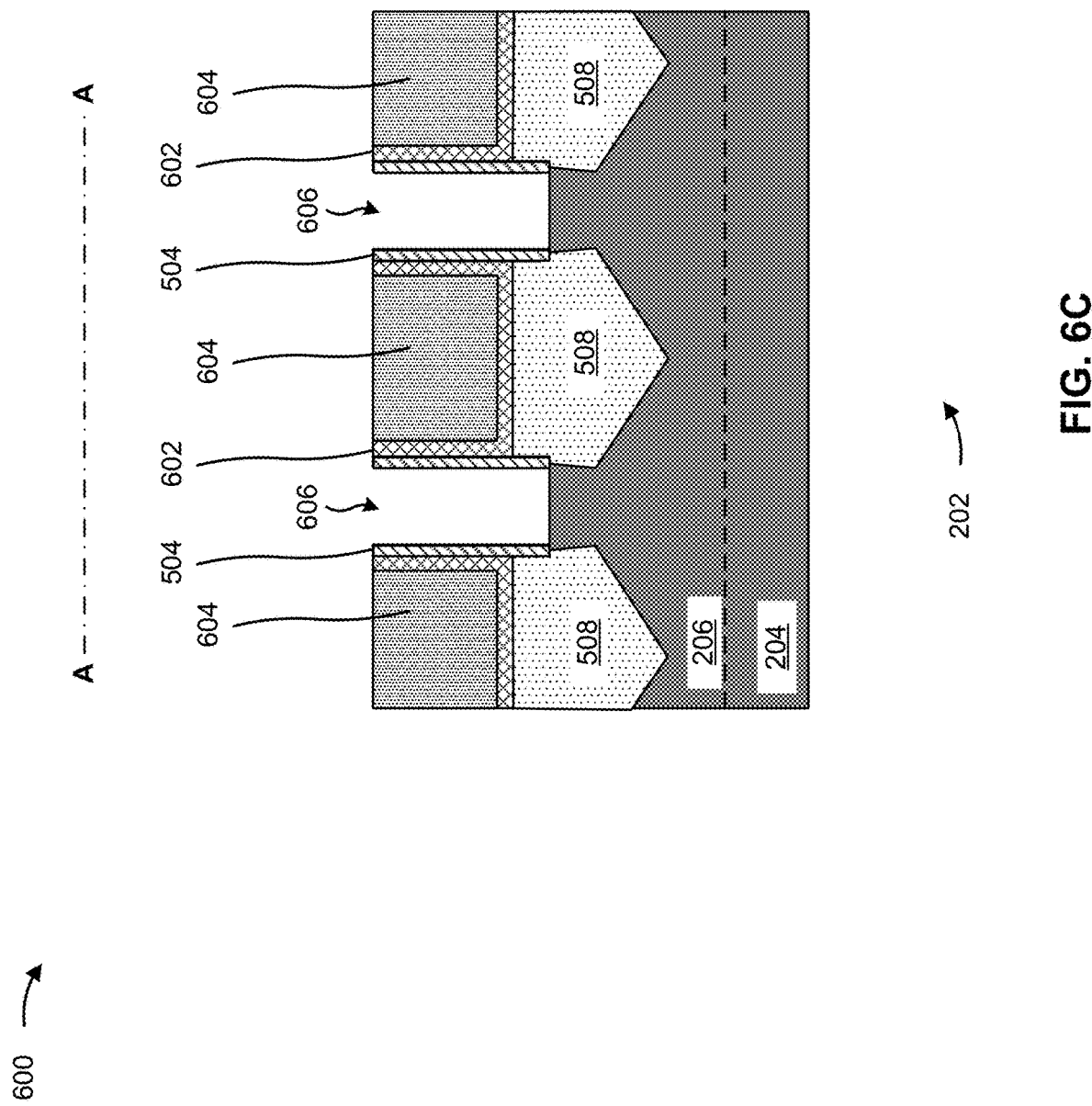

As shown in FIG. 6C, the replacement gate operation is performed (e.g., by one or more of the semiconductor processing tools 102-112) to remove the dummy gate structures 210 from the device region 202. The removal of the dummy gate structures 210 leaves behind openings (or recesses) 606 between the bulk spacer layers 504 and between the source/drain regions 508. The dummy gate structures 210 may be removed in one or more etch operations includes a plasma etch technique, which may include a wet chemical etch technique, and/or another type of etch technique.

Figure 6D:
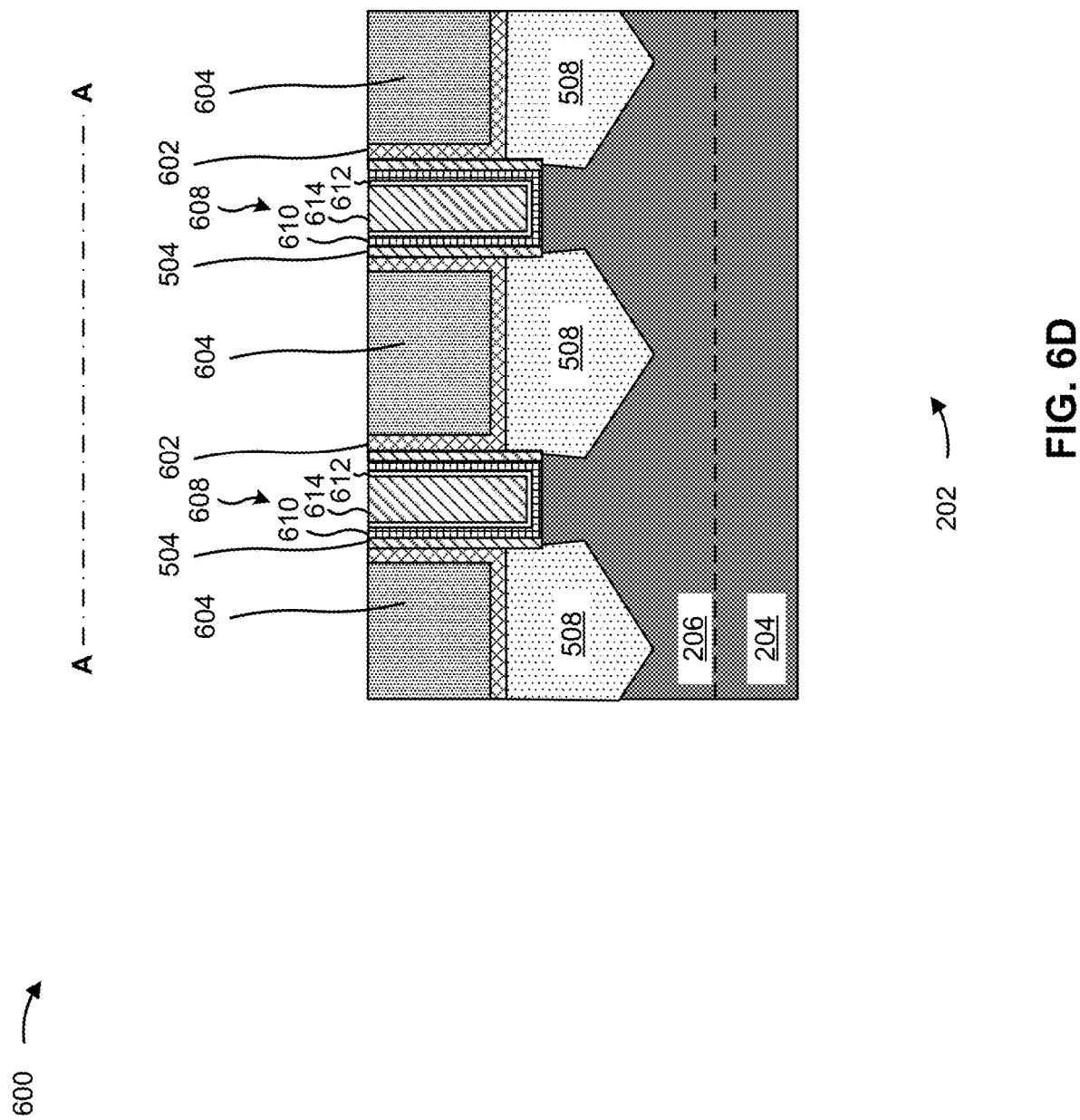

As shown in FIG. 6D, the replacement gate operation continues where deposition tool 102 and/or the plating tool 112 forms the gate structures (e.g., replacement gate structures) 508 in the openings 606 between the bulk spacer layers 504 and between the source/drain regions 508. The gate structures 608 may include metal gate structures, high-k gate structures, or other types of gate structures. The gate structures 608 may include an interfacial layer (not shown), a high-k dielectric layer 610, a work function tuning layer 612, and a metal electrode structure 614 formed therein to form a gate structure 608. In some implementations, the gate structures 608 may include other compositions of materials and/or layers.

Figure 6E:
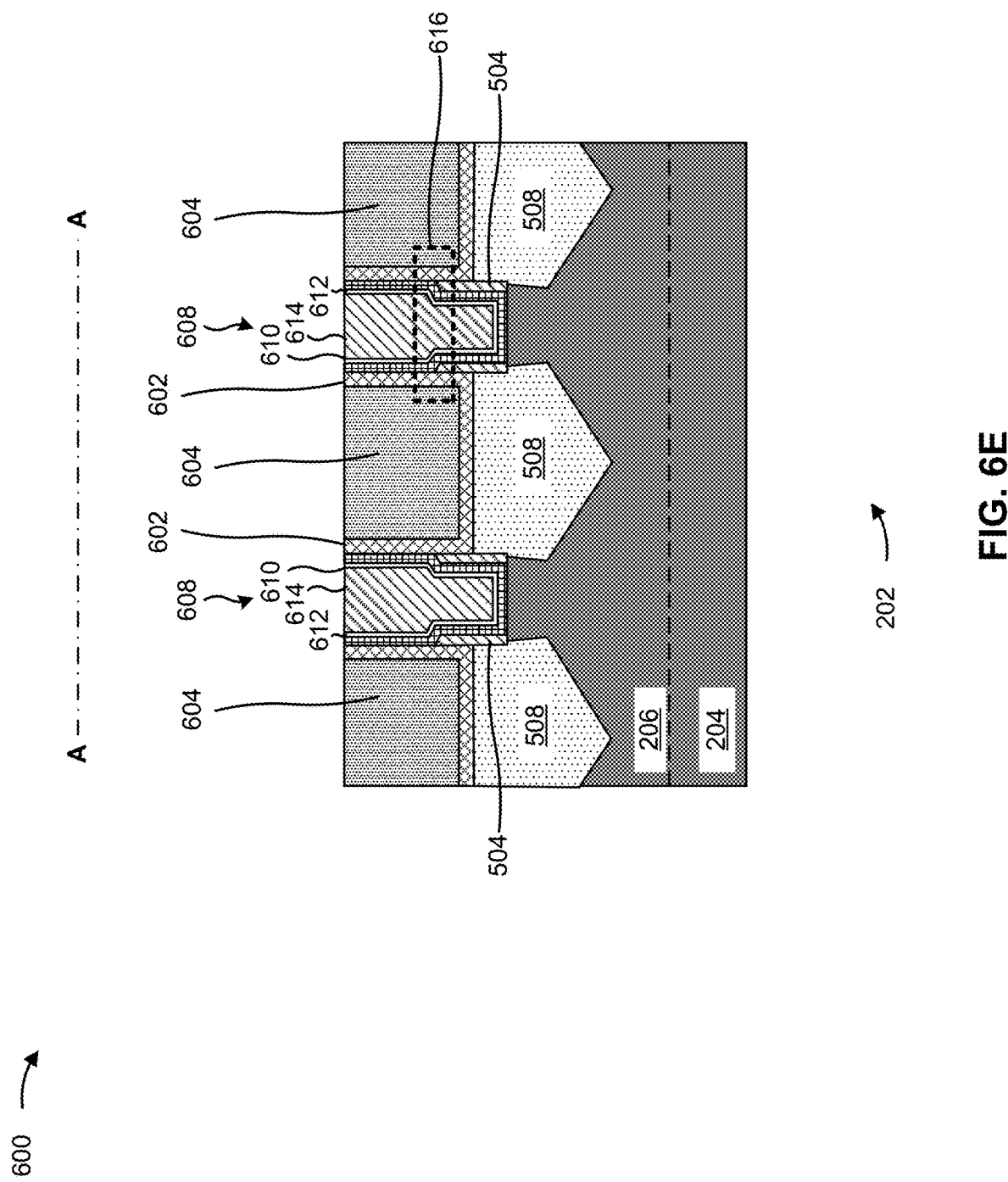

FIG. 6E illustrates an alternative implementation to the example shown in FIG. 6D. As shown in FIG. 6E, one or more of the gate structures 608 may be formed to include a tapered region 616. The tapered region 616 may occur, for example, as a result of etching of the bulk spacer layer 504 (e.g., during removal of the dummy gate structures 210). The tapered region 616 may include a transition between an upper portion of a gate structure 608 and a lower portion of the gate structure 608. The upper portion may be wider relative to the lower portion. Accordingly, the width of the gate structure 608 decreases from a top of the tapered region 616 to a bottom of the tapered region 616.

As shown in FIGS. 6D and 6E, the gate structures 608 may be free (or approximately free) of voids, seams, and/or other defects as a result of the annealing operation (described above in connection with FIG. 4E) to remove voids, seams, and/or other defects in the polysilicon layer 214 of the dummy gate structures 210. The annealing operation may enable the dummy gate structures 210 to be formed to a particular shape and/or profile that increases metal gate filling performance for the gate structures 608 and reduces the likelihood of gate-to-source/drain shorting.

Figure 6F:
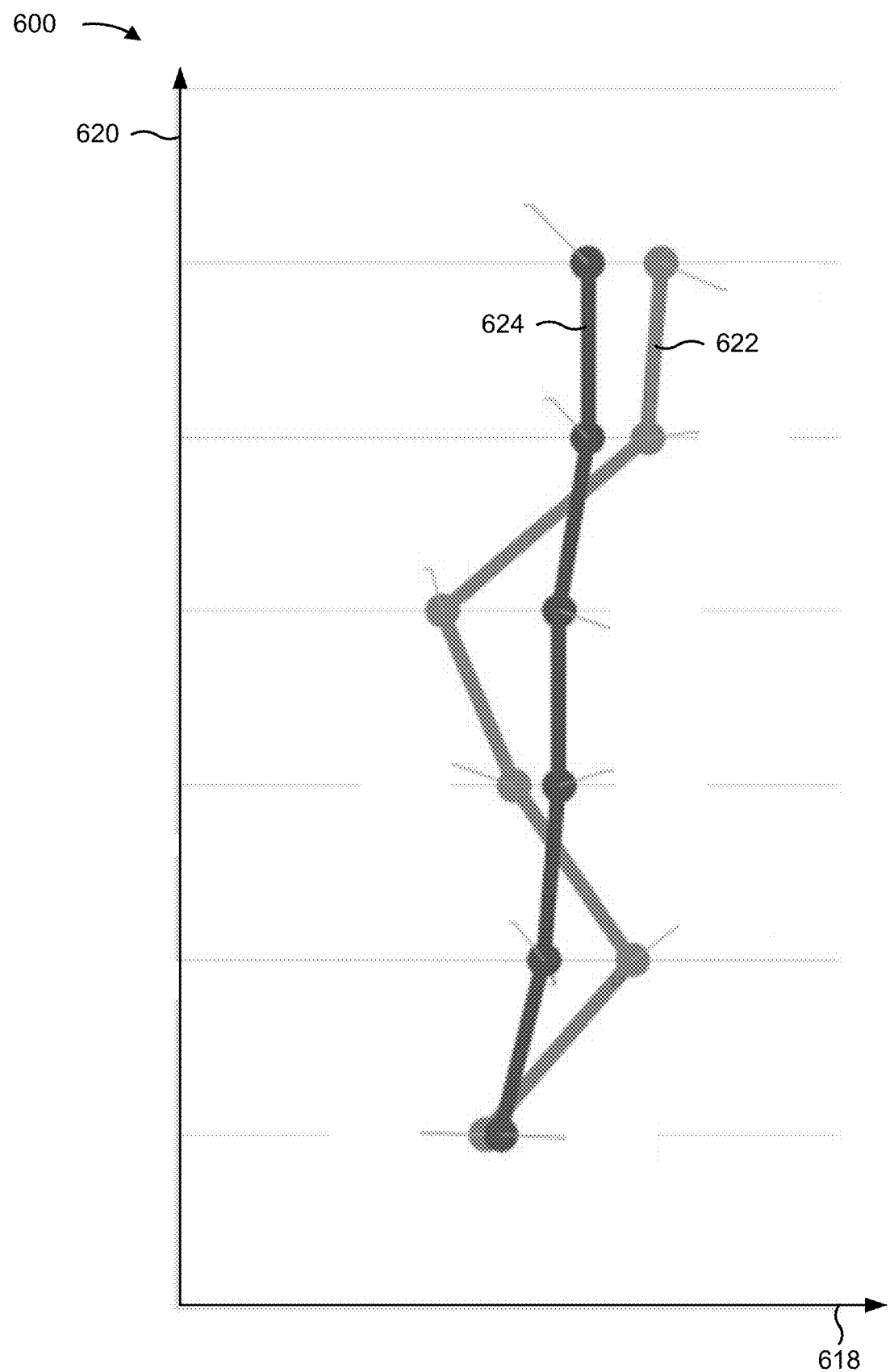

As shown in FIG. 6F, the dual RF source etch technique described herein results in reduced LWR for the gate structures 608. An example LWR for a gate structure formed using a single RF source etch technique, and an example LWR for a gate structure 608 formed using the dual RF source etch technique described herein, are illustrated as a function of metal gate critical dimension (CD) (or metal gate width) 618 along a gate height 620. FIG. 6F illustrates metal gate critical dimension variation for a single RF source etch technique (corresponding to plot line 622 in FIG. 6F) and for the dual RF source etch technique described herein (corresponding to plot line 624). As shown in FIG. 6F, the metal gate critical dimension variation for the dual RF source etch technique described herein is generally more uniform and consistent along the gate height 620 relative to the metal gate critical dimension variation for a single RF source etch technique. As an example, the 3-sigma metal gate critical dimension variation (e.g., the average variation in the metal gate critical dimension 618 per 5 nanometers of gate height 620) for the dual RF source etch technique described herein may be less than approximately 1 nanometer, whereas the 3-sigma metal gate critical dimension variation for a single RF source etch technique may be greater than approximately 1 nanometer.

As indicated above, FIGS. 6A-6F are provided as examples. Other examples may differ from what is described with regard to FIGS. 6A-6F.

Figure 7A:
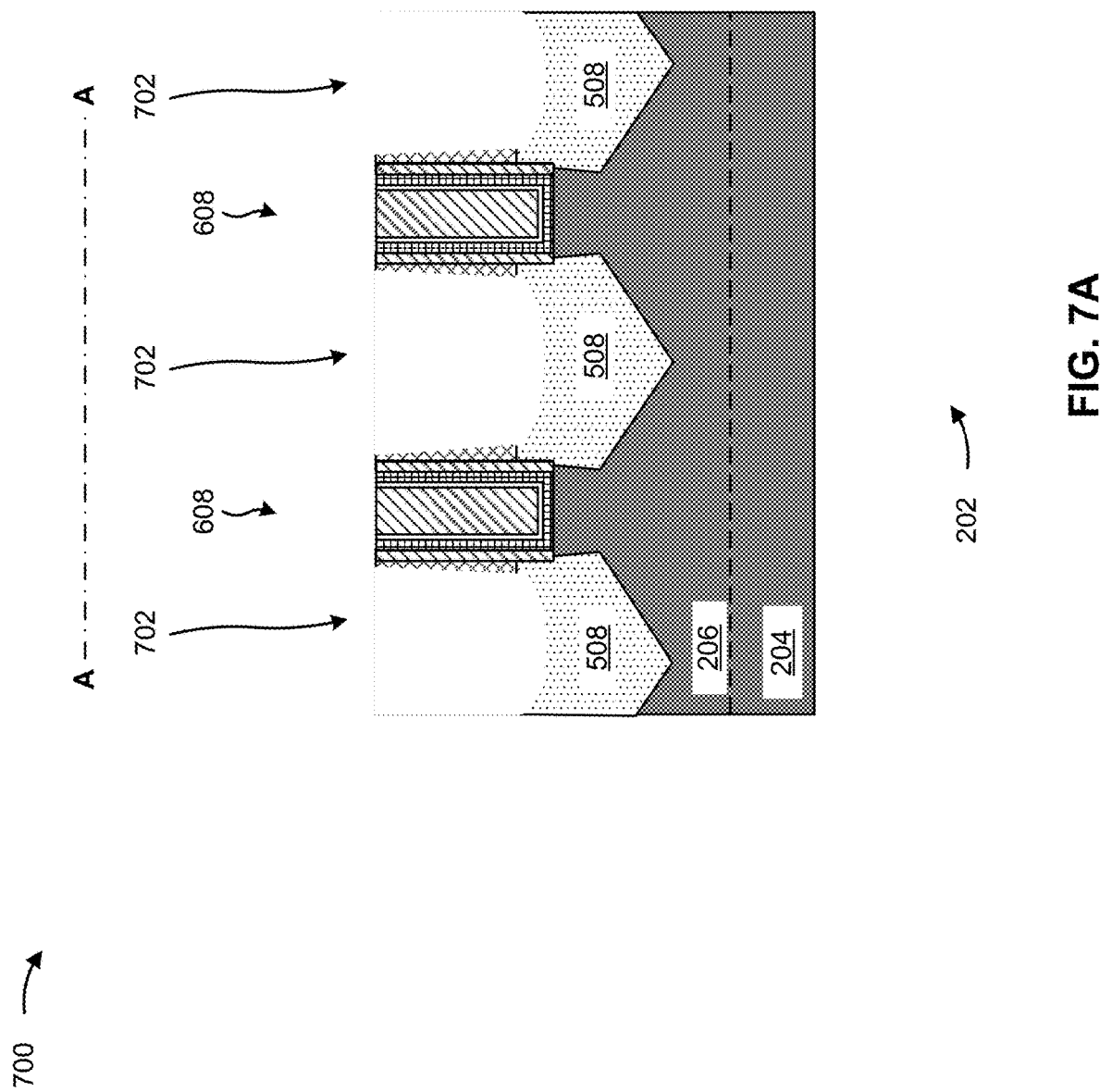
Figure 7B:
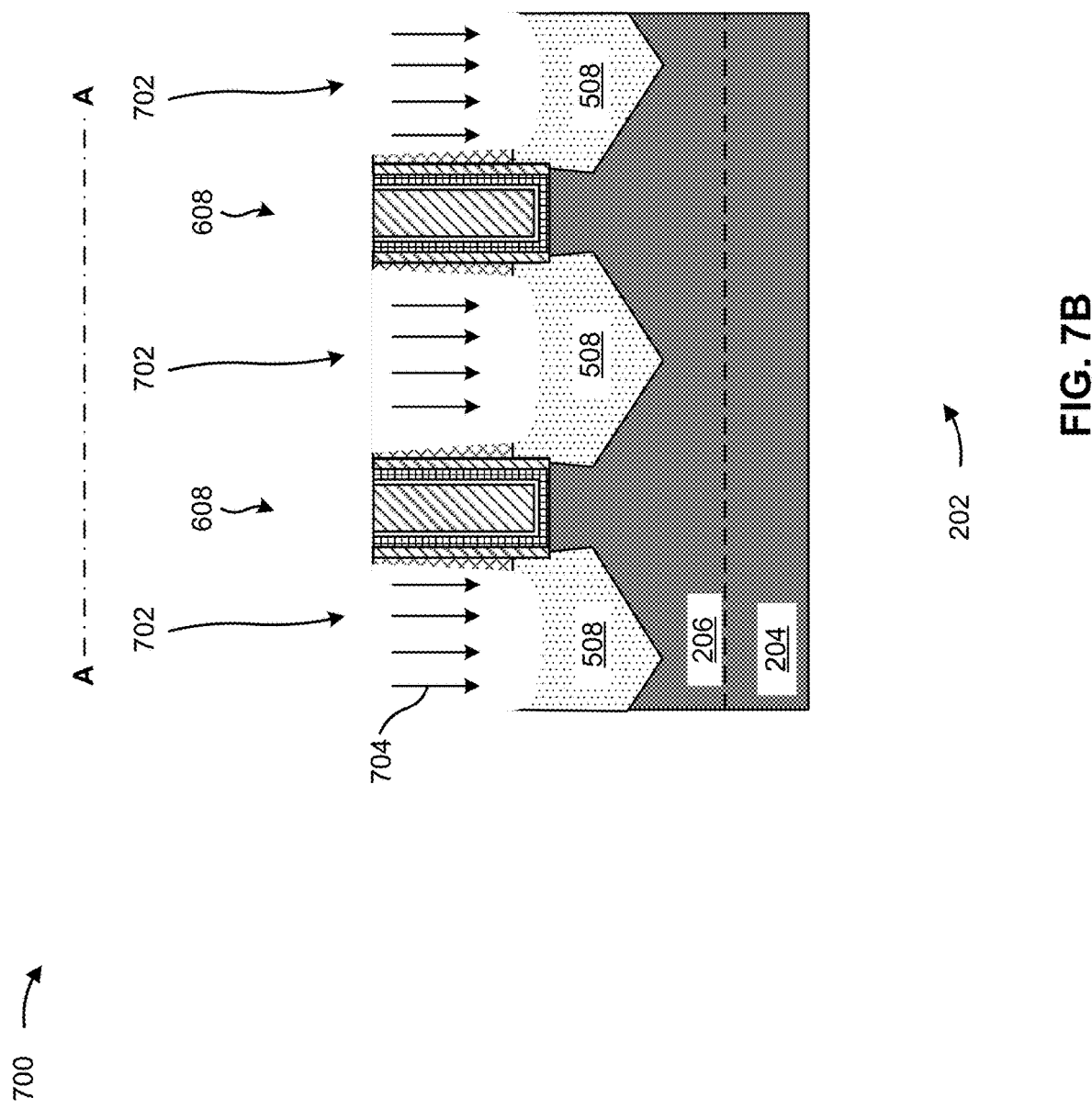
Figure 7C:
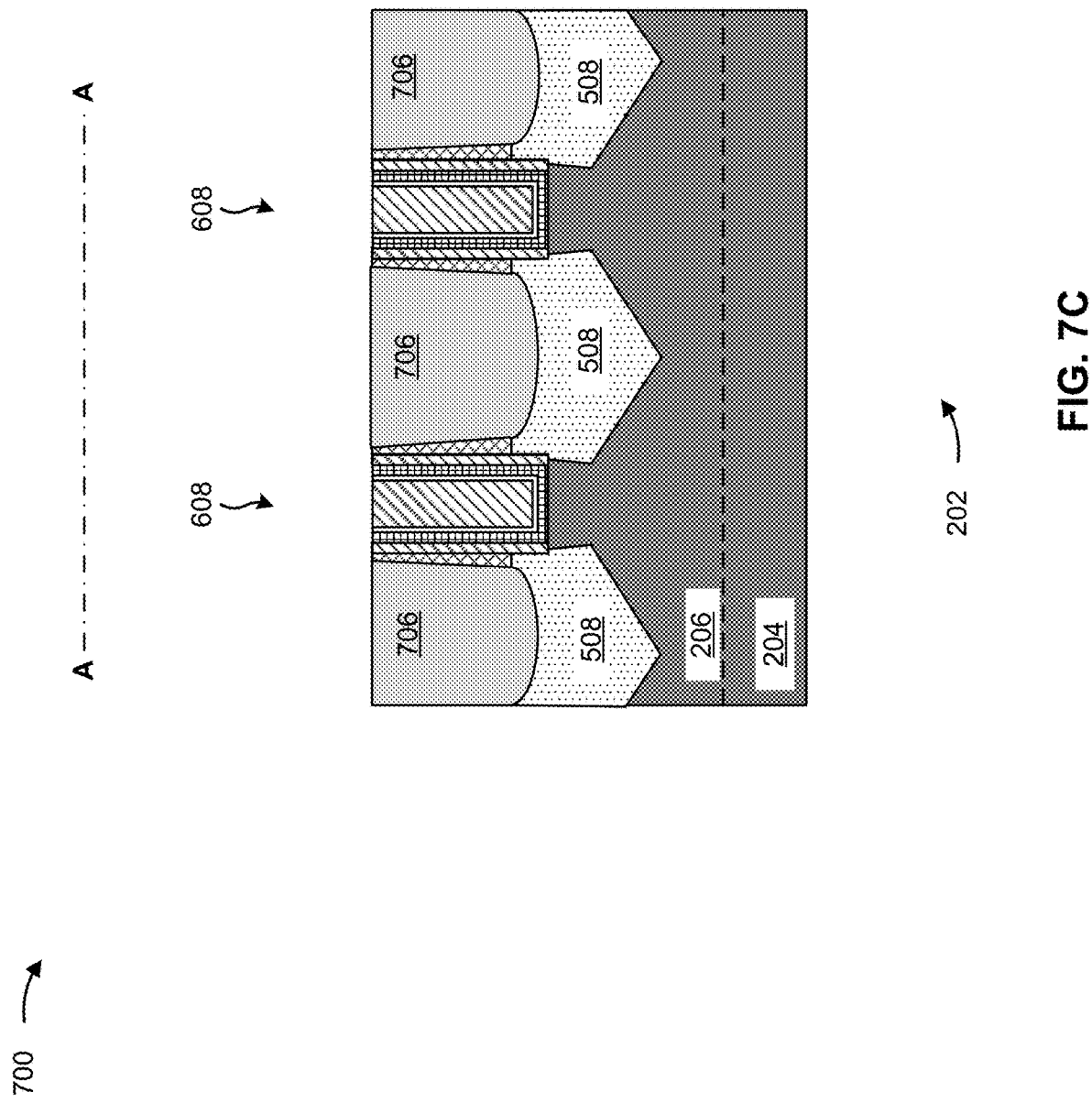

FIGS. 7A-7C are diagrams of an example implementation 700 described herein. The example implementation 700 includes an example of forming conductive structures (e.g., metal gate contacts or MDs) in the device region 202 of the semiconductor device 200. FIGS. 7A-4C are illustrated from the perspective of the cross-sectional plane A-A in FIG. 2 for the device region 202.

As shown in FIG. 7A, openings (or recesses) 702 are formed through one or more dielectric layers and to the source/drain regions 508. In particular, the CESL 602 and the ILD layer 604 between the gate structures 608 in the device region 202 are etched to form the openings 702 between the gate structures 608 and to the source/drain regions 508. In some implementations, the openings 702 are formed in a portion of the source/drain regions 508 such that recesses extend into a portion of the source/drain regions 508.

In some implementations, a pattern in a photoresist layer is used to form the openings 02. In these implementations, the deposition tool 102 forms the photoresist layer on the ILD layer 604, and on the gate structures 608. The exposure tool 104 exposes the photoresist layer to a radiation source to pattern the photoresist layer. The developer tool 106 develops and removes portions of the photoresist layer to expose the pattern. The etch tool 108 etches into the ILD layer 604 to form the openings 702. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the openings 702 based on a pattern.

As shown in FIG. 7B, a pre-clean operation is performed to clean the surfaces in the openings 702. In particular, the semiconductor device 200 may be positioned in a first processing chamber of the deposition tool 102 (e.g., a pre-clean processing chamber), the first processing chamber may be pumped down to an at least partial vacuum (e.g., pressurized to a pressure that is included in a range of approximately 5 Torr to approximately 10 Torr, or to another pressure), and the bottom surfaces and the sidewalls in the openings 702 are cleaned using a plasma-based and/or a chemical-based pre-clean agent 704. The pre-clean operation is performed to clean (e.g., remove) oxides and other contaminants or byproducts from the top surfaces source/drain regions 508 that may have formed after the formation of the openings 702.

As shown in FIG. 7C, conductive structures 706 are formed in the device region 202. In particular, conductive structures 706 are formed in the openings 702 between the gate structures 608 and over the source/drain regions 508 in the openings 702. The deposition tool 102 and/or the plating tool 112 deposits the conductive structures 706 by a CVD technique, a PVD technique, an ALD technique, an electroplating technique, another deposition technique described above in connection with FIG. 1A, and/or a deposition technique other than as described above in connection with FIG. 1A. In some implementations, one or more additional layers are formed in the openings 702 prior to formation of the conductive structures 706. As an example, a metal silicide layer (e.g., titanium nitride ($TiSi_x$) or another metal silicide layer) may be formed on the top surfaces of the source/drain regions 508 prior to formation of the conductive structures 706. As another example, one or more barrier layers may be formed on the bottom surfaces and/or on the sidewalls in the openings 702 prior to formation of the conductive structures 706. As another example, one or more adhesion layers may be formed on the bottom surfaces and/or on the sidewalls in the openings 702 prior to formation of the conductive structures 706.

As indicated above, FIGS. 7A-7C are provided as an example. Other examples may differ from what is described with regard to FIGS. 7A-7C.

Figure 8A:
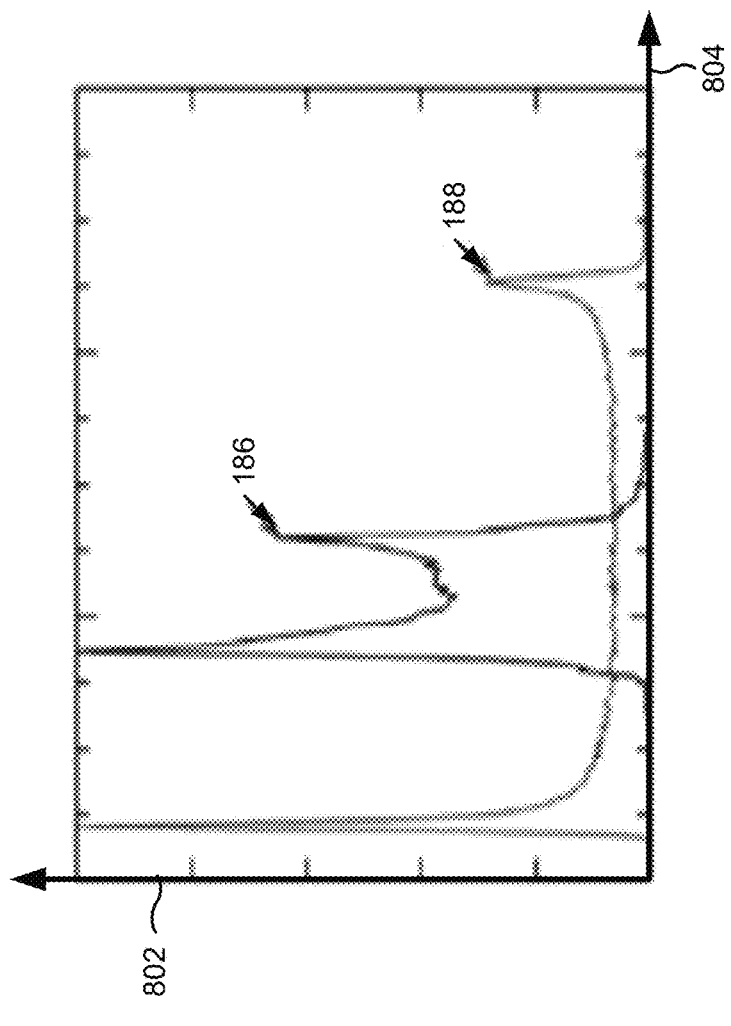
FIGS. 8A-8C are diagrams of example radio frequency (RF) source parameters for a plasma-based etch tool described herein.
Figure 8B:
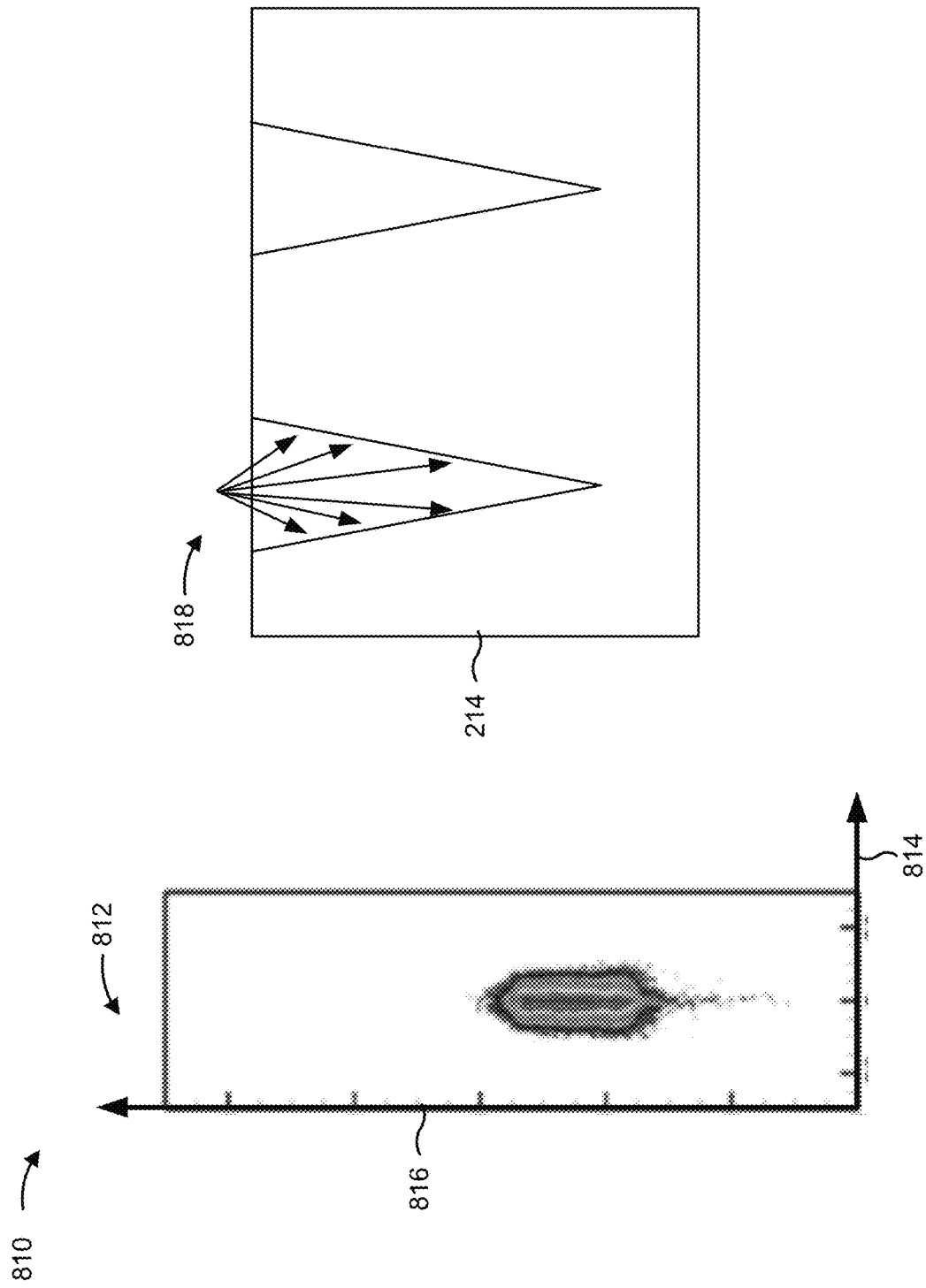
Figure 8C:
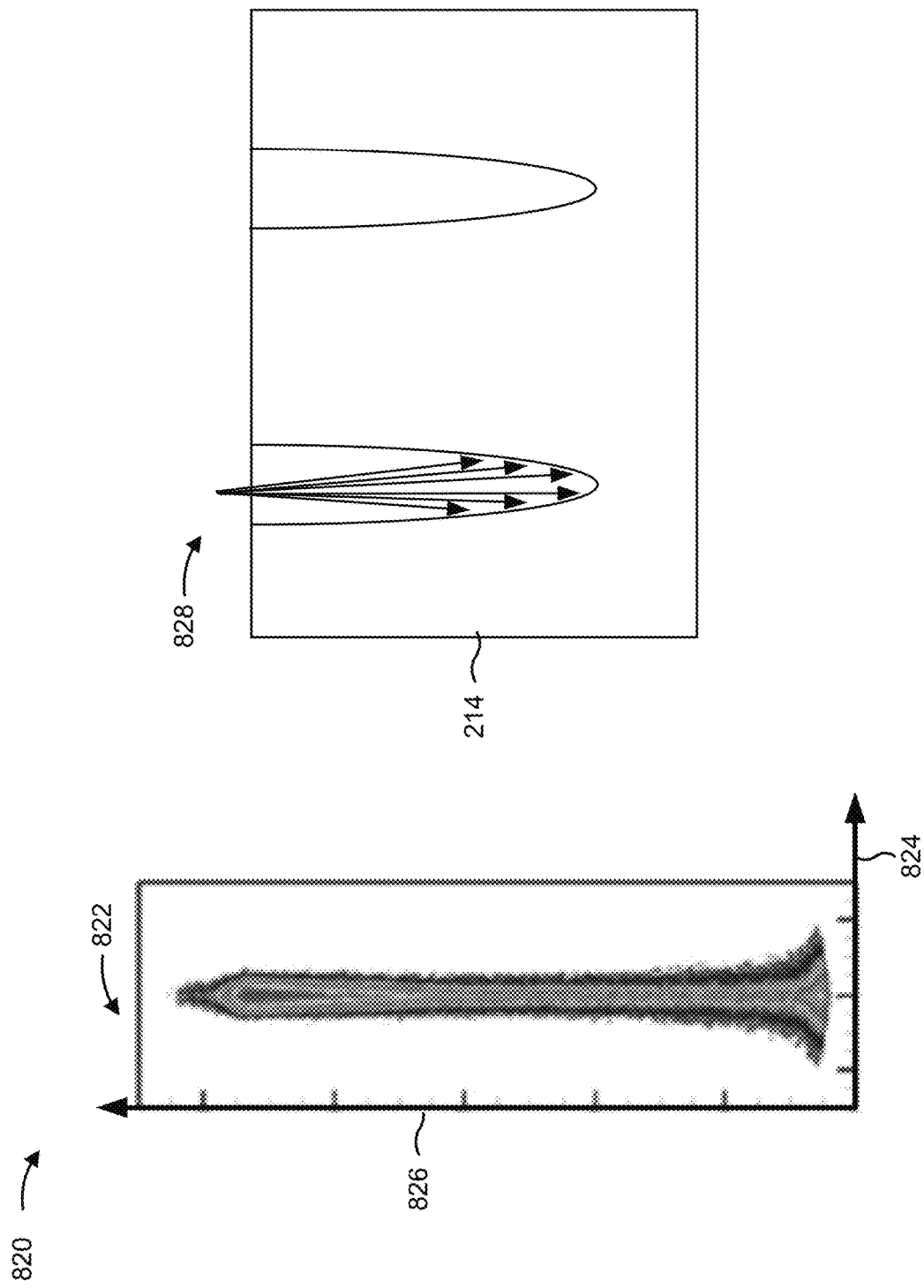

FIGS. 8A-8C are diagrams of example RF source parameters for a plasma-based etch tool described herein. The example RF source parameters include parameters that may be used in one or more plasma-based etch operations described herein, including one or more plasma-based etch operations in which a dual RF source etch technique is used to etch the polysilicon layer 214 to form a dummy gate structure 210.

FIG. 8A illustrates an example 800 of ion energy distribution function (IEDF) of ions in a plasma (e.g., in the plasma-based etch tool 108). As shown in FIG. 8A, IEDF 802 may be a function of energy 804 (e.g., in electron volts (eV)). As further shown in FIG. 8A, the IEDF 802 for ions that are controlled using the RF source 186 generally have a higher minimum IEDF relative to ions that are controlled using the RF source 188. However, the ions that are controlled using the RF source 188 have a broader energy spectrum relative to the ions that are controlled using the RF source 186.

FIG. 8B illustrates an example 810 of IADF 812 for ions that are controlled using the RF source 186. As shown in FIG. 8B, the IADF 812 may be a function of angle 814 and energy 816. The high operating frequency of the RF source 186 may provide a relatively concentrated energy distribution and a relatively wide angle distribution. As further shown in FIG. 8B, the relatively concentrated energy distribution and the relatively wide angle distribution provides a broad ion distribution 818. This increases the depth loading of the ions (e.g., a concentration of the ions is greater near the top of the polysilicon layer 214) that are controlled using the RF source 186, which provides a greater etch rate near the top of the polysilicon layer 214 and a lesser etch rate in the polysilicon layer 214.

FIG. 8C illustrates an example 820 of IADF 822 for ions that are controlled using the RF source 188. As shown in FIG. 8C, the IADF 822 may be a function of angle 824 and energy 826. The high operating frequency of the RF source 188 may provide a broad energy distribution relative to the RF source 186, and a relatively narrow angle distribution relative to the RF source 188. As further shown in FIG. 8C, the relatively broad energy distribution and the relatively narrow angle distribution provides a narrow and more directional ion distribution 828. This reduces the depth loading of the ions (e.g., a concentration of the ions is more evenly distributed into the polysilicon layer 214) that are controlled using the RF source 188, which provides a greater etch rate in the polysilicon layer 214 and a lesser etch rate at the top of the polysilicon layer 214. Accordingly, the ion distribution 828 provides a more vertical etch relative to the ion distribution 818.

As indicated above, FIGS. 8A-8C are provided as examples. Other examples may differ from what is described with regard to FIGS. 8A-8C.

Figure 9B:
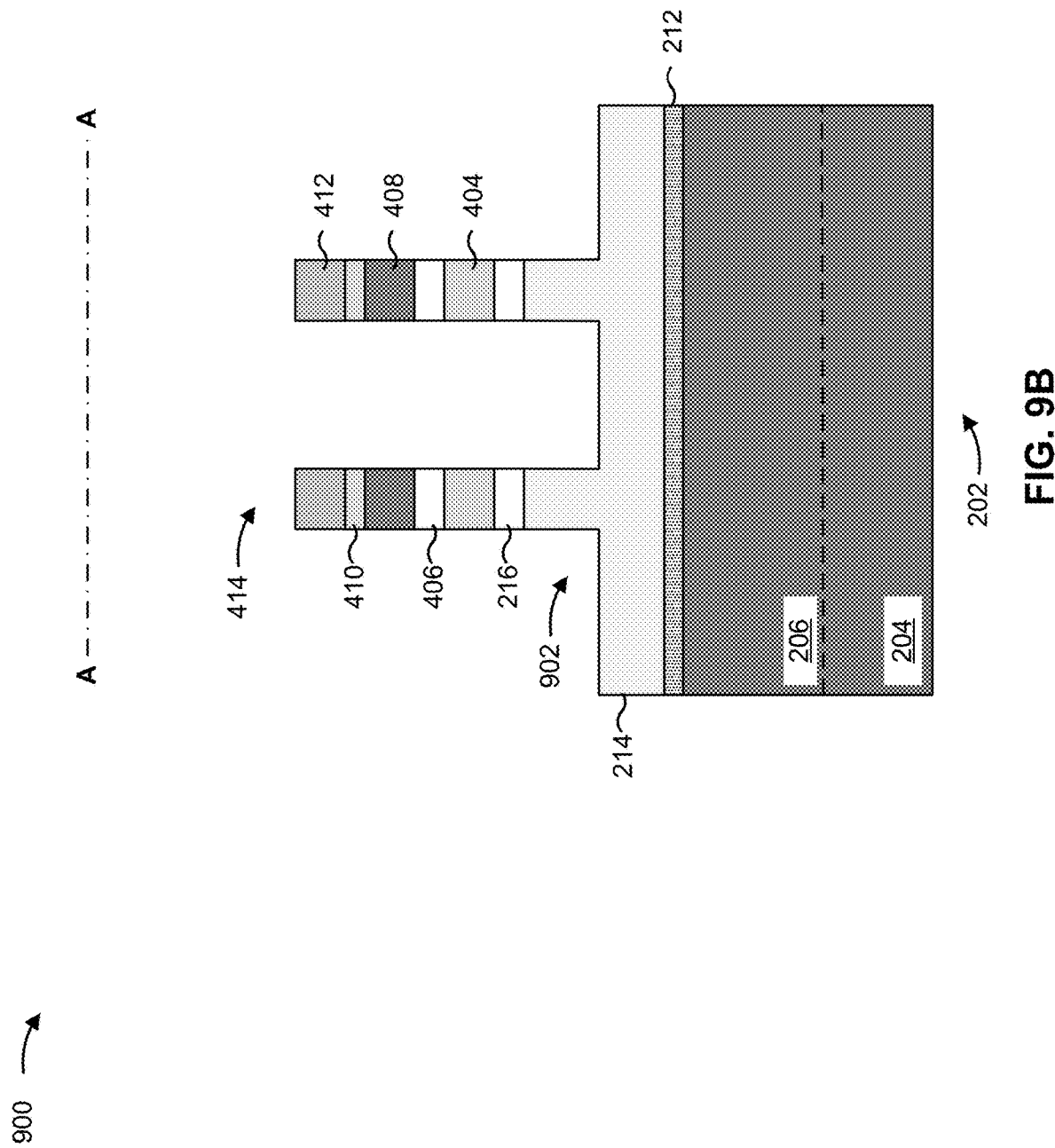
Figure 9C:
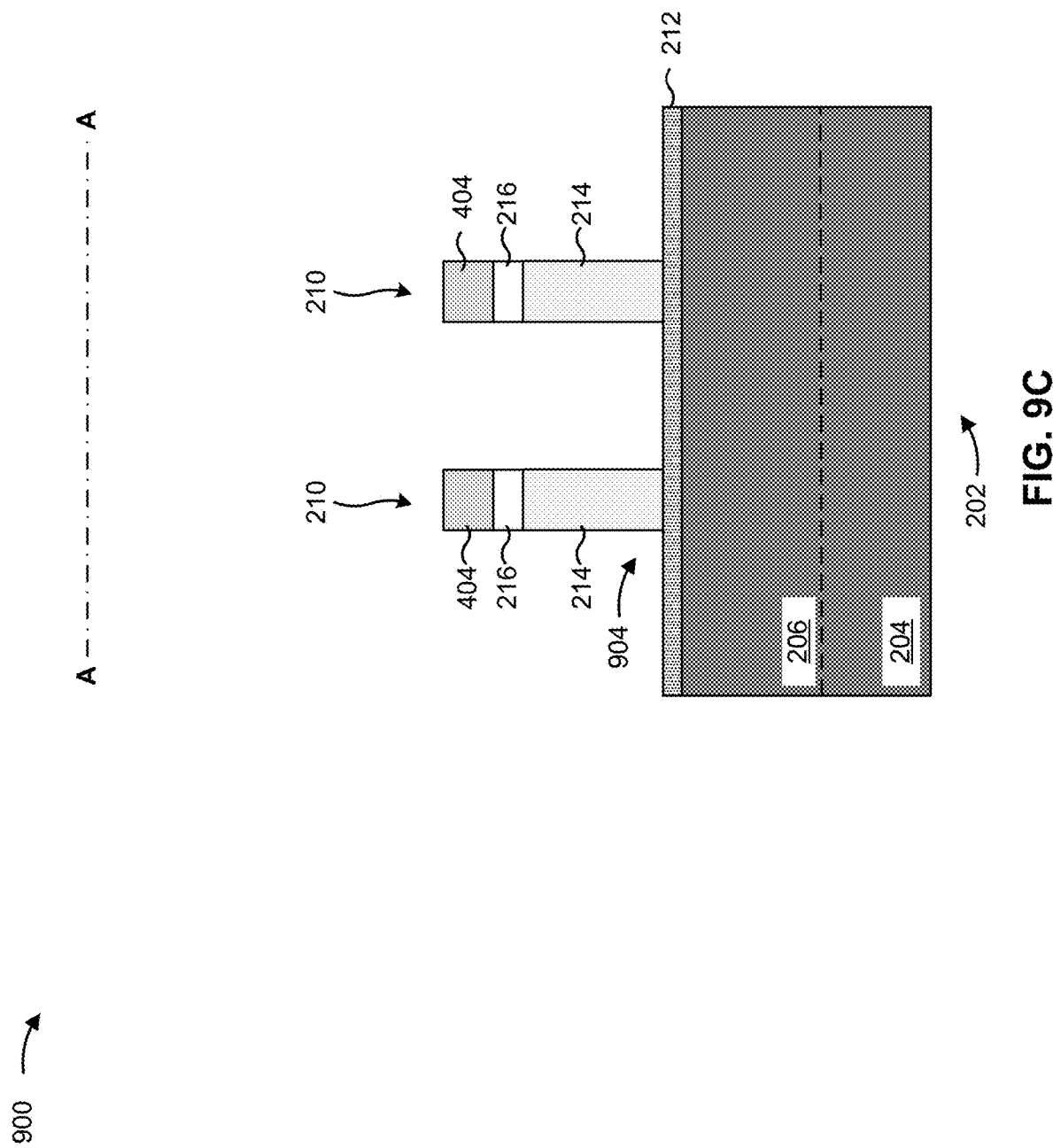

FIGS. 9A-9C are diagrams of an example implementation 900 described herein. The example implementation 900 includes another example of a dual RF source etch technique for etching the polysilicon layer 214 to form one or more dummy gate structures 210 in the device region 202 of the semiconductor device 200. FIGS. 9A-9C are illustrated from the perspective of the cross-sectional plane A-A in FIG. 2 for the device region 202.

As shown in FIG. 9A, the example dual RF source etch technique may be performed after the pattern 414 is formed in the one or more patterning layers, as described above in connection with FIGS. 4H-4J.

As shown in FIG. 9B, the plasma-based etch tool 108 may perform one or more first etch operations to remove a top portion 902 of the polysilicon layer 214. The plasma-based etch tool 108 may use the RF source 182 to generate a plasma, and the plasma-based etch tool 108 may use the RF source 186 (e.g., a high-frequency RF source) to cause ions in the plasma to bombard the semiconductor device 200 to remove the top portion 902 from the polysilicon layer 214. The use of the RF source 186 to etch the polysilicon layer 214 near the top of the polysilicon layer 214 provides a wide ion bombardment angle to shape the dummy gate structure (s) 210 that are formed from the polysilicon layer 214.

In some implementations, the one or more first etch operations may include a plurality of etch operations in which various parameters are configured for the RF source 182 and/or for the RF source 186. For example, in a first subset of the plurality of etch operations, the RF source 182 may be operated in a continuous plasma generation manner such that the RF source 182 is on and providing RF power to continuously generate the plasma. In a second subset of the plurality of etch operations, the RF source 182 may be operated in a pulsed manner such that the RF source 182 generates RF power based on a duty cycle. In some implementations, the first subset of the plurality of etch operations may occur prior to the second subset of the plurality of etch operations. In some implementations, the first subset of the plurality of etch operations may occur after the second subset of the plurality of etch operations. In some implementations, the first subset of the plurality of etch operations and the second subset of the plurality of etch operations may be performed in an alternating manner or based on another pattern.

As another example, in a first subset of the plurality of etch operations, the RF source 186 may be operated in a continuous ion bombardment manner such that the RF source 186 is on and providing RF power to cause ions to continuously bombard the semiconductor device 200. In a second subset of the plurality of etch operations, the RF source 186 may be operated in a pulsed manner such that the RF source 186 generates RF power based on a duty cycle. In some implementations, the first subset of the plurality of etch operations may occur prior to the second subset of the plurality of etch operations. In some implementations, the first subset of the plurality of etch operations may occur after the second subset of the plurality of etch operations. In some implementations, the first subset of the plurality of etch operations and the second subset of the plurality of etch operations may be performed in an alternating manner or based on another pattern.

As shown in FIG. 9C, the plasma-based etch tool 108 may perform one or more second etch operations to remove a bottom portion 904 of the polysilicon layer 214. The plasma-based etch tool 108 may use the RF source 182 to generate a plasma, and the plasma-based etch tool 108 may use the RF source 186 (e.g., a high-frequency RF source) and the RF source 188 (e.g., a low-frequency RF source) to perform a dual RF source etch technique. The dual RF source etch technique may be used to cause ions in the plasma to bombard the semiconductor device 200 to remove the bottom portion 904 from the polysilicon layer 214. The use of the RF source 186 and the RF source 188 enabled the plasma-based etch tool 108 to achieve a more directional etch (e.g., more vertical and narrower ion bombardment angle), which achieves straighter sidewalls for the dummy gate structure(s) 210 and enables the dummy gate structure(s) 210 to be formed to a greater aspect ratio (e.g., a ratio of the height of the dummy gate structure(s) 210 to the width of the dummy gate structure(s) 210).

In some implementations, the one or more second etch operations may include a plurality of etch operations in which various parameters are configured for the RF source 186 and/or for the RF source 188. For example, in the RF source 186 and/or the RF source 188 may be operated in a continuous manner in a subset of etch operations, and may be operated in a pulsed manner in another subset of etch operations. As another example, the on durations for the RF source 186 and the on durations for the RF source 188 may staggered and alternated such that the on durations for the RF source 186 and the on durations for the RF source 188 are non-overlapping on durations.

In other implementations, additional portions of the polysilicon layer 214 (e.g., other than the top portion 902 and the bottom portion 904) are etched to form the dummy gate structure(s) 210. In some implementations, the polysilicon layer 214 may be etched in 10 to 20 etch operations or greater to form the dummy gate structure(s) 210, where the dual RF source etch technique is used to etch the polysilicon layer 214 in at least a subset of the etch operations.

As indicated above, FIGS. 9A-9C are provided as an example. Other examples may differ from what is described with regard to FIGS. 9A-9C.

Figure 10:
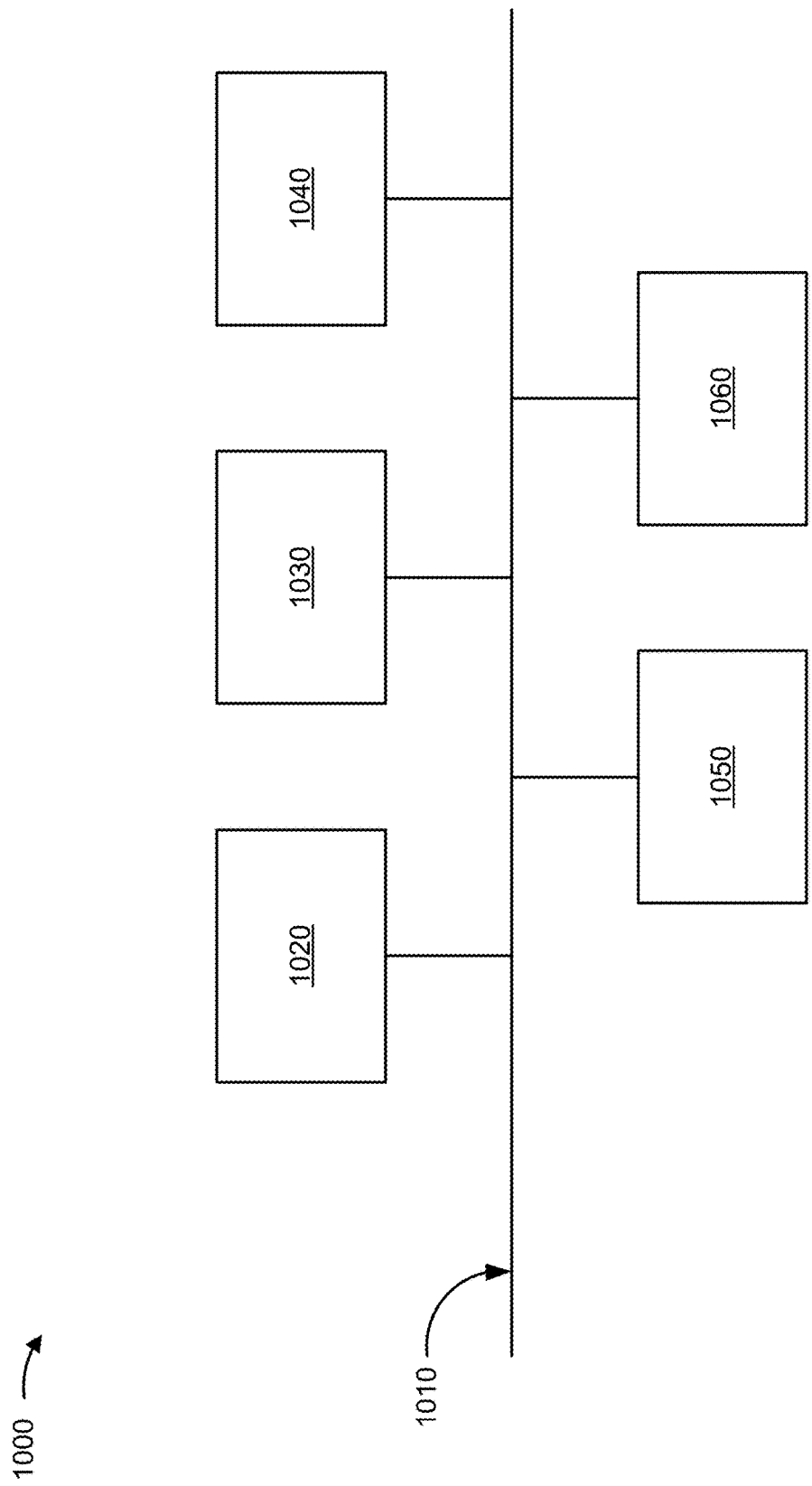
FIG. 10 is a diagram of example components of one or more devices described herein.

FIG. 10 is a diagram of example components of a device 1000, which may correspond to one or more of the semiconductor processing tools 102-114, the wafer/die transport tool 116, and/or the controller 192. In some implementations, one or more of the semiconductor processing tools 102-114, the wafer/die transport tool 116, and/or the controller 192 include one or more devices 1000 and/or one or more components of device 1000. As shown in FIG. 10, device 1000 may include a bus 1010, a processor 1020, a memory 1030, an input component 1040, an output component 1050, and a communication component 1060.

Bus 1010 includes one or more components that enable wired and/or wireless communication among the components of device 1000. Bus 1010 may couple together two or more components of FIG. 10, such as via operative coupling, communicative coupling, electronic coupling, and/or electric coupling. Processor 1020 includes a central processing unit, a graphics processing unit, a microprocessor, a controller, a microcontroller, a digital signal processor, a field-programmable gate array, an application-specific integrated circuit, and/or another type of processing component. Processor 1020 is implemented in hardware, firmware, or a combination of hardware and software. In some implementations, processor 1020 includes one or more processors capable of being programmed to perform one or more operations or processes described elsewhere herein.

Memory 1030 includes volatile and/or nonvolatile memory. For example, memory 1030 may include random access memory (RAM), read only memory (ROM), a hard disk drive, and/or another type of memory (e.g., a flash memory, a magnetic memory, and/or an optical memory). Memory 1030 may include internal memory (e.g., RAM, ROM, or a hard disk drive) and/or removable memory (e.g., removable via a universal serial bus connection). Memory 1030 may be a non-transitory computer-readable medium. Memory 1030 stores information, instructions, and/or software (e.g., one or more software applications) related to the operation of device 1000. In some implementations, memory 1030 includes one or more memories that are coupled to one or more processors (e.g., processor 1020), such as via bus 1010.

Input component 1040 enables device 1000 to receive input, such as user input and/or sensed input. For example, input component 1040 may include a touch screen, a keyboard, a keypad, a mouse, a button, a microphone, a switch, a sensor, a global positioning system sensor, an accelerometer, a gyroscope, and/or an actuator. Output component 1050 enables device 1000 to provide output, such as via a display, a speaker, and/or a light-emitting diode. Communication component 1060 enables device 1000 to communicate with other devices via a wired connection and/or a wireless connection. For example, communication component 1060 may include a receiver, a transmitter, a transceiver, a modem, a network interface card, and/or an antenna.

Device 1000 may perform one or more operations or processes described herein. For example, a non-transitory computer-readable medium (e.g., memory 1030) may store a set of instructions (e.g., one or more instructions or code) for execution by processor 1020. Processor 1020 may execute the set of instructions to perform one or more operations or processes described herein. In some implementations, execution of the set of instructions, by one or more processors 1020, causes the one or more processors 1020 and/or the device 1000 to perform one or more operations or processes described herein. In some implementations, hardwired circuitry is used instead of or in combination with the instructions to perform one or more operations or processes described herein. Additionally, or alternatively, processor 1020 may be configured to perform one or more operations or processes described herein. Thus, implementations described herein are not limited to any specific combination of hardware circuitry and software.

The number and arrangement of components shown in FIG. 10 are provided as an example. Device 1000 may include additional components, fewer components, different components, or differently arranged components than those shown in FIG. 10. Additionally, or alternatively, a set of components (e.g., one or more components) of device 1000 may perform one or more functions described as being performed by another set of components of device 1000.

Figure 11:
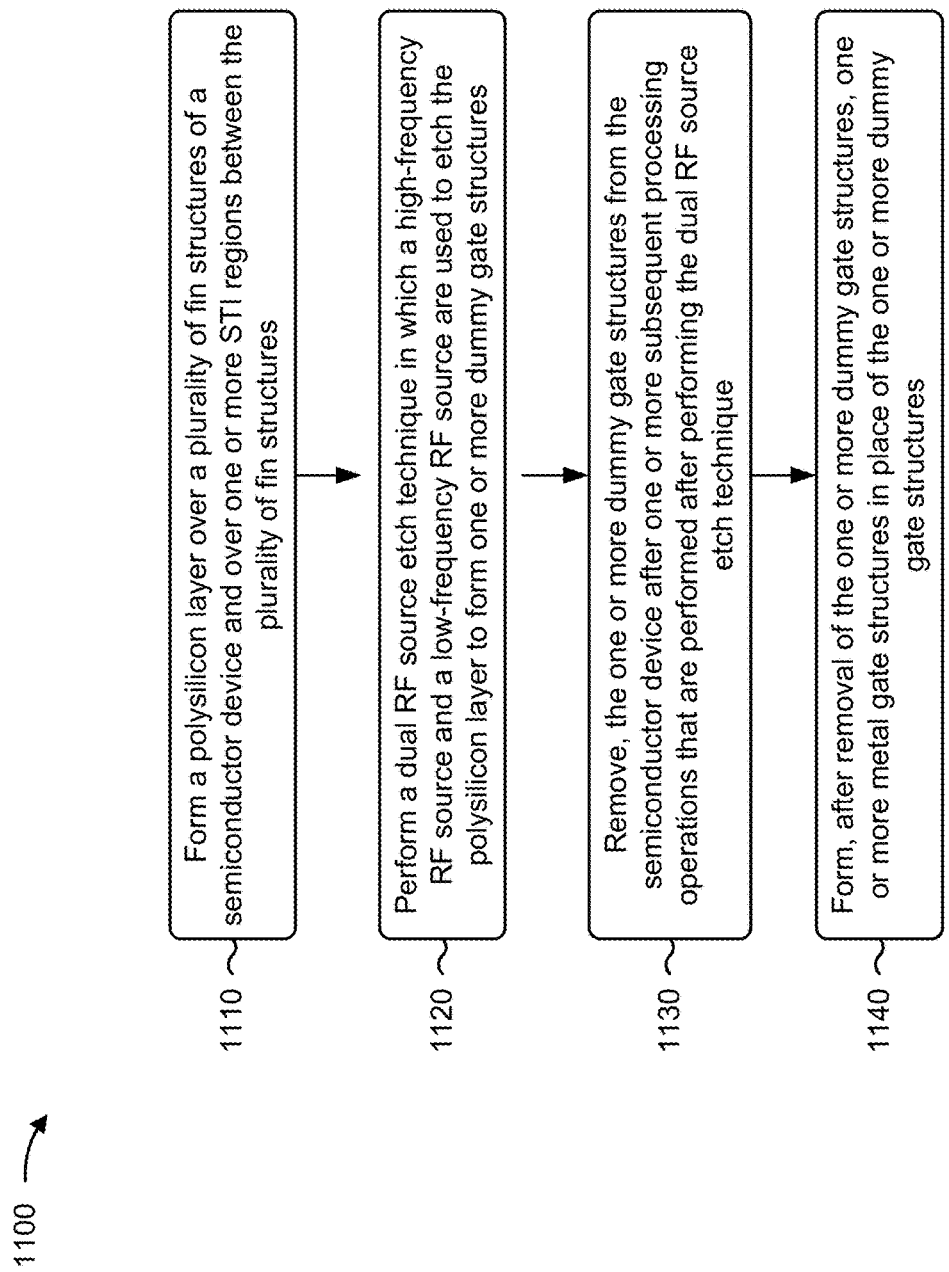

FIG. 11 is a flowchart of an example process 1100 associated with forming a semiconductor device. In some implementations, one or more process blocks of FIG. 11 are performed by one or more semiconductor tools (e.g., one or more of the semiconductor tools 102-114). Additionally, or alternatively, one or more process blocks of FIG. 11 may be performed by one or more components of device 1000, such as processor 1020, memory 1030, input component 1040, output component 1050, and/or communication component 1060.

As shown in FIG. 11, process 1100 may include forming a polysilicon layer over a plurality of fin structures of a semiconductor device and over one or more STI regions between the plurality of fin structures (block 1110). For example, one or more of the semiconductor tools 102-114 may form a polysilicon layer 214 over a plurality of fin structures 206 of a semiconductor device 200 and over one or more STI regions 208 between the plurality of fin structures 206, as described herein.

As further shown in FIG. 11, process 1100 may include performing a dual RF source etch technique in which a high-frequency RF source and a low-frequency RF source are used to etch the polysilicon layer to form one or more dummy gate structures (block 1120). For example, one or more of the semiconductor tools 102-114, such as a plasma-based etch tool 108, may perform a dual RF source etch technique in which a high-frequency RF source (e.g., the RF source 186) and a low-frequency RF source (e.g., the RF source 188) are used to etch the polysilicon layer 214 to form one or more dummy gate structures 210, as described herein.

As further shown in FIG. 11, process 1100 may include removing the one or more dummy gate structures from the semiconductor device after one or more subsequent processing operations that are performed after performing the dual RF source etch technique (block 1130). For example, one or more of the semiconductor tools 102-114 may remove the one or more dummy gate structures 210 from the semiconductor device 200 after one or more subsequent processing operations that are performed after performing the dual RF source etch technique, as described herein.

As further shown in FIG. 11, process 1100 may include forming, after removal of the one or more dummy gate structures, one or more metal gate structures in place of the one or more dummy gate structures (block 1140). For example, one or more of the semiconductor tools 102-114 may form, after removal of the one or more dummy gate structures 210, one or more metal gate structures (e.g., gate structures 608) in place of the one or more dummy gate structures 210, as described above.

Process 1100 may include additional implementations, such as any single implementation or any combination of implementations described below and/or in connection with one or more other processes described elsewhere herein.

In a first implementation, forming the polysilicon layer 214 includes performing one or more deposition-etch-deposition cycles that each includes performing a first deposition operation to form a first portion of the polysilicon layer 214, performing an etch operation to trim the first portion of the polysilicon layer 214, and performing a second etch operation to form a second portion of the polysilicon layer 214 over the first portion. In a second implementation, alone or in combination with the first implementation, forming the polysilicon layer 214 includes forming a layer of amorphous polysilicon material, and performing an annealing operation to remove defects from the layer of amorphous polysilicon material. In a third implementation, alone or in combination with one or more of the first and second implementations, performing the annealing operation includes performing the annealing operation at a temperature that is in a range of approximately 700 degrees Celsius to less than approximately 1410 degrees Celsius.

In a fourth implementation, alone or in combination with one or more of the first through third implementations, the annealing operation results in the layer of amorphous polysilicon material being transformed into a layer of crystallized polysilicon material having a plurality of grain boundaries, where the dual RF source etch technique promotes uniformity of an etch rate through the plurality of grain boundaries. In a fifth implementation, alone or in combination with one or more of the first through fourth implementations, the dual RF source etch technique reduces LWR for the one or more dummy gate structures 210 and for the one or more metal gate structures 608. In a sixth implementation, alone or in combination with one or more of the first through fifth implementations, process 1100 includes forming a plurality of patterning layers (e.g., one or more of the hard mask layers 216, 404, 406, 408, and/or 410, and/or the photoresist layer 412) over the polysilicon layer 214, and forming, using an EUV lithography system (e.g., an EUV exposure tool 104), a pattern 414 in the plurality of patterning layers, where performing the dual RF source etch technique includes performing the dual RF source etch technique to etch the polysilicon layer 214 to form the one or more dummy gate structures 210 based on the pattern 414.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

Figure 12:
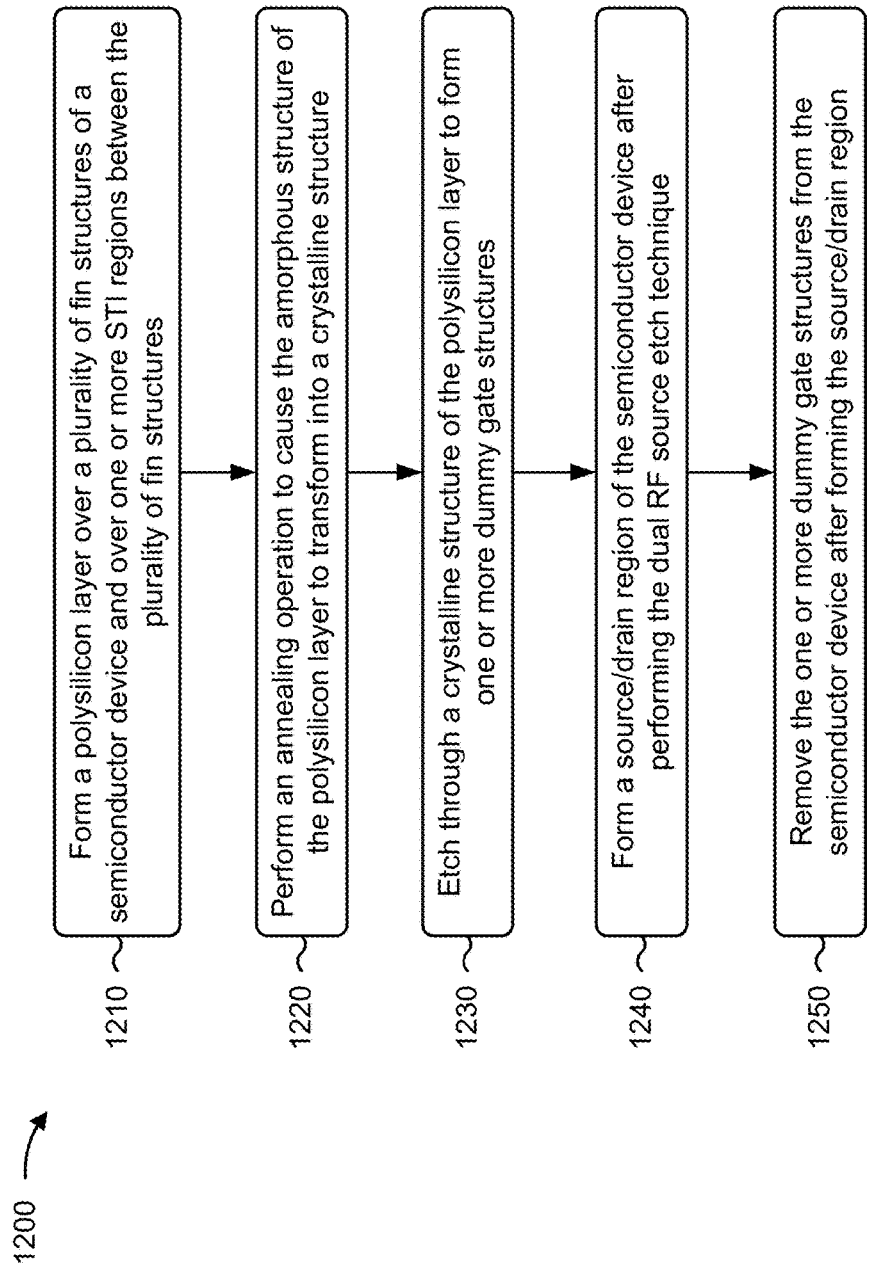

FIG. 12 is a flowchart of an example process 1200 associated with forming a semiconductor device. In some implementations, one or more process blocks of FIG. 12 are performed by one or more semiconductor tools (e.g., one or more of the semiconductor tools 102-114). Additionally, or alternatively, one or more process blocks of FIG. 12 may be performed by one or more components of device 1000, such as processor 1020, memory 1030, input component 1040, output component 1050, and/or communication component 1060.

As shown in FIG. 12, process 1200 may include forming a polysilicon layer over a plurality of fin structures of a semiconductor device and over one or more STI regions between the plurality of fin structures (block 1210). For example, one or more of the semiconductor tools 102-114 may form a polysilicon layer 214 over a plurality of fin structures 206 of a semiconductor device 200 and over one or more STI regions 208 between the plurality of fin structures 206, as described herein. In some implementations, the polysilicon layer includes an amorphous structure.

As further shown in FIG. 12, process 1200 may include performing an annealing operation to cause the amorphous structure of the polysilicon layer to transform into a crystalline structure (block 1220). For example, one or more of the semiconductor tools 102-114 may perform an annealing operation to cause the amorphous structure of the polysilicon layer 214 to transform into a crystalline structure, as described herein.

As further shown in FIG. 12, process 1200 may include etching through the crystalline structure of the polysilicon layer to form one or more dummy gate structures (block 1230). For example, one or more of the semiconductor tools 102-114, such as a plasma-based etch tool 108, may etch through the crystalline structure of the polysilicon layer 214 to form one or more dummy gate structures 210, as described herein.

As further shown in FIG. 12, process 1200 may include forming a source/drain region of the semiconductor device after performing the dual RF source etch technique (block 1240). For example, the one or more of the semiconductor tools 102-114 may form a source/drain region of the semiconductor device after performing the dual RF source etch technique, as described herein.

As further shown in FIG. 12, process 1200 may include removing the one or more dummy gate structures from the semiconductor device after forming the source/drain region (block 1250). For example, one or more of the semiconductor tools 102-114 may remove the one or more dummy gate structures 210 from the semiconductor device 200 after forming the source/drain region 508, as described herein.

Process 1200 may include additional implementations, such as any single implementation or any combination of implementations described below and/or in connection with one or more other processes described elsewhere herein.

In a first implementation, forming the polysilicon layer 214 includes forming a first layer of amorphous polysilicon material, performing the annealing operation includes performing a first annealing operation to remove defects from the first layer of amorphous polysilicon material, where the first annealing operation results in the first layer of amorphous polysilicon material being transformed into a first layer of crystallized polysilicon material, forming the polysilicon layer 214 includes forming a second layer of amorphous polysilicon material on the first layer of crystallized polysilicon material, and performing the annealing operation includes performing a second annealing operation to remove defects from the second layer of amorphous polysilicon material, where the second annealing operation results in the second layer of amorphous polysilicon material being transformed into a second layer of crystallized polysilicon material.

In a second implementation, alone or in combination with the first implementation, etching through the crystalline structure of the polysilicon layer 214 includes performing a dual RF source etch technique in which a high-frequency RF source (e.g., the RF source 186) and a low-frequency RF source (e.g., the RF source 188) are used to etch through the crystalline structure of the polysilicon layer 214. In a third implementation, alone or in combination with one or more of the first and second implementations, performing the dual RF source etch technique includes pulsing the low-frequency RF source (e.g., the RF source 188) to enable etching byproducts to be removed during off durations of the low-frequency RF source. In a fourth implementation, alone or in combination with one or more of the first through third implementations, performing the dual RF source etch technique includes generating a plasma using an RF source (e.g., the RF source 182), and using at least one of the high-frequency RF source (e.g., the RF source 186) or the low-frequency RF source (e.g., the RF source 188) to promote a flow of ions from the plasma toward the semiconductor device 200, where the RF source and at least one of the high-frequency RF source or the low-frequency RF source are phase delayed to reduce instability of the plasma.

In a fifth implementation, alone or in combination with one or more of the first through fourth implementations, performing the dual RF source etch technique includes etching, using the high-frequency RF source (e.g., the RF source 186), a top portion 902 of the polysilicon layer 214, and etching, using the low-frequency RF source (e.g., the RF source 188), a bottom portion 904 of the polysilicon layer 214 after etching the top portion 902. In a sixth implementation, alone or in combination with one or more of the first through fifth implementations, performing the dual RF source etch technique includes etching, using the high-frequency RF source (e.g., the RF source 186), a top portion 902 of the polysilicon layer 214, and etching, using the high-frequency RF source and the low-frequency RF source (e.g., the RF source 188), a bottom portion 904 of the polysilicon layer 214 after etching the top portion 902.

Although FIG. 12 shows example blocks of process 1200, in some implementations, process 1200 includes additional blocks, fewer blocks, different blocks, or differently arranged blocks than those depicted in FIG. 12. Additionally, or alternatively, two or more of the blocks of process 1200 may be performed in parallel.

FIG. 13 is a flowchart of an example process 1300 associated with forming a semiconductor device. In some implementations, one or more process blocks of FIG. 13 are performed by a one or more of the semiconductor tools 102-114 (e.g., one or more of the semiconductor tools 102-114). Additionally, or alternatively, one or more process blocks of FIG. 13 may be performed by one or more components of device 1000, such as processor 1020, memory 1030, input component 1040, output component 1050, and/or communication component 1060.

As shown in FIG. 13, process 1300 may include forming a fin structure of a semiconductor device (block 1310). For example, one or more of the semiconductor tools 102-114 may form a fin structure 206 of a semiconductor device 200, as described herein.

As further shown in FIG. 13, process 1300 may include forming a polysilicon layer over the fin structure, wherein the polysilicon layer wraps around at least three sides of the fin structure (block 1320). For example, one or more of the semiconductor tools 102-114 may form a polysilicon layer 214 over the fin structure 206, as described herein. In some implementations, the polysilicon layer 214 wraps around at least three sides of the fin structure 206.

As further shown in FIG. 13, process 1300 may include forming one or more patterning layers over the polysilicon layer (block 1330). For example, one or more of the semiconductor tools 102-114 may form one or more patterning layers (e.g., one or more of the hard mask layers 216, 404, 406, 408, 410, and/or the photoresist layer 412) over the polysilicon layer 214, as described herein.

As further shown in FIG. 13, process 1300 may include forming a pattern in the one or more patterning layers (block 1340). For example, one or more of the semiconductor tools 102-114 may form a pattern 414 in the one or more patterning layers, as described herein.

As further shown in FIG. 13, process 1300 may include performing a dual RF source etch technique in which a high-frequency RF source and a low-frequency RF source are used to etch the polysilicon layer to form one or more dummy gate structures based on the pattern (block 1350). For example, one or more of the semiconductor tools 102-114, such as a plasma-based etch tool 108, may perform a dual RF source etch technique in which a high-frequency RF source (e.g., the RF source 186) and a low-frequency RF source (e.g., the RF source 188) are used to etch the polysilicon layer 214 to form one or more dummy gate structures 210 based on the pattern 414, as described herein.

Process 1300 may include additional implementations, such as any single implementation or any combination of implementations described below and/or in connection with one or more other processes described elsewhere herein.

In a first implementation, the low-frequency RF source (e.g., the RF source 188) is operated in a frequency range of approximately 400 kilohertz to approximately 2 megahertz in the dual RF source etch technique. In a second implementation, alone or in combination with the first implementation, process 1300 includes removing the one or more dummy gate structures 210 from the semiconductor device 200 after one or more subsequent processing operations that are performed after performing the dual RF source etch technique, and forming, after removal of the one or more dummy gate structures 210, one or more metal gate structures (e.g., gate structure(s) 608) in place of the one or more dummy gate structures 210, where the dual RF source etch technique enables a metal gate structure of the one or more metal gate structures to be formed to a ratio, of a height of the metal gate structure to a width of the metal gate structure, that is in a range of approximately 18:1 to approximately 19:1. In a third implementation, alone or in combination with one or more of the first and second implementations, forming the one or more metal gate structures includes forming the metal gate structure to include a tapered region 616.

In a fourth implementation, alone or in combination with one or more of the first through third implementations, forming the pattern 414 in the one or more patterning layers includes forming, using an EUV lithography system (e.g., an EUV exposure tool 104, the pattern 414 in a photoresist layer 412 of the one or more patterning layers, and forming, based on the photoresist layer 412, the pattern 414 into one or more hard mask layers (e.g., one or more of the hard mask layers 216, 404, 408, 410, and/or 412), of the one or more patterning layers, below the photoresist layer. In a fifth implementation, alone or in combination with one or more of the first through fourth implementations, process 1300 includes performing an annealing operation to remove defects from the polysilicon layer 214, where performing the dual RF source etch technique includes performing the dual RF source etch technique after performing the annealing operation.

Although FIG. 13 shows example blocks of process 1300, in some implementations, process 1300 includes additional blocks, fewer blocks, different blocks, or differently arranged blocks than those depicted in FIG. 13. Additionally, or alternatively, two or more of the blocks of process 1300 may be performed in parallel.

In this way, the techniques described herein enable forming a dummy gate structure in a manner that reduces the likelihood of defect formation in the dummy gate structure. The reduced likelihood of defect formation in the dummy gate structure, in turn, reduces the likelihood of defect formation in a metal gate structure that replaces the dummy gate structure. As described herein, a dummy gate structure may be formed for a semiconductor device. The dummy gate structure may be formed from an amorphous polysilicon layer. The amorphous polysilicon layer may be deposited in a blanket deposition operation. An annealing operation is performed for the semiconductor device to remove voids, seams, and/or other defects from the amorphous polysilicon layer. The annealing operation may cause the amorphous polysilicon layer to crystallize, thereby resulting in the amorphous polysilicon layer transitioning into a crystallized polysilicon layer. A dual RF source etch technique may be performed to increase the directionality of ions and radicals in a plasma that is used to etch the crystallized polysilicon layer to form the dummy gate structure. The increased directionality of the ions increases the effectiveness of the ions in etching through the different crystal grain boundaries which increases the etch rate uniformity across the crystallized polysilicon layer. The increased etch rate uniformity enables the dummy gate structure to be formed with a low LWR, which reduces the likelihood of defect formation (e.g., gate-to-source/drain shorts) in a metal gate structure that replaces the dummy gate structure.

As described in greater detail above, some implementations described herein provide a method. The method includes forming a polysilicon layer over a plurality of fin structures of a semiconductor device and over one or more STI regions between the plurality of fin structures. The method includes performing, using a plasma-based etch tool, a dual RF source etch technique in which a high-frequency RF source and a low-frequency RF source are used to etch the polysilicon layer to form one or more dummy gate structures. The method includes removing, the one or more dummy gate structures from the semiconductor device after one or more subsequent processing operations that are performed after performing the dual RF source etch technique. The method includes forming, after removal of the one or more dummy gate structures, one or more metal gate structures in place of the one or more dummy gate structures.

As described in greater detail above, some implementations described herein provide a method. The method includes forming a polysilicon layer over a plurality of fin structures of a semiconductor device and over one or more STI regions between the plurality of fin structures. The polysilicon layer includes an amorphous structure. The method includes performing an annealing operation to cause the amorphous structure of the polysilicon layer to transform into a crystalline structure. The method includes etching through the crystalline structure of the polysilicon layer to form one or more dummy gate structures. The method includes forming a source/drain region of the semiconductor device after performing the dual RF source etch technique. The method includes removing the one or more dummy gate structures from the semiconductor device after forming the source/drain region.

As described in greater detail above, some implementations described herein provide a method. The method includes forming a fin structure of a semiconductor device. The method includes forming a polysilicon layer over the fin structure, where the polysilicon layer wraps around at least three sides of the fin structure. The method includes forming one or more patterning layers over the polysilicon layer. The method includes forming a pattern in the one or more patterning layers. The method includes performing, using a plasma-based etch tool, a dual RF source etch technique in which a high-frequency RF source and a low-frequency RF source are used to etch the polysilicon layer to form one or more dummy gate structures based on the pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a polysilicon layer over a plurality of fin structures of a semiconductor device and over one or more shallow trench isolation (STI) regions between the plurality of fin structures;
   performing, using a plasma-based etch tool, a dual radio frequency (RF) source etch technique in which a high-frequency RF source and a low-frequency RF source are used to selectively etch a top portion and a bottom portion of the polysilicon layer to form one or more dummy gate structures;
   removing, the one or more dummy gate structures from the semiconductor device after one or more subsequent processing operations that are performed after performing the dual RF source etch technique; and
   forming, after removal of the one or more dummy gate structures, one or more metal gate structures in place of the one or more dummy gate structures.

2. The method of claim 1, wherein forming the polysilicon layer comprises:

performing one or more deposition-etch-deposition cycles that each includes:
  performing a first deposition operation to form a first portion of the polysilicon layer;
  performing an etch operation to trim the first portion of the polysilicon layer; and
  performing a second deposition operation to form a second portion of the polysilicon layer over the first portion.

3. The method of claim 1, wherein forming the polysilicon layer comprises:
  forming a layer of amorphous polysilicon material; and
  performing an annealing operation to remove defects from the layer of amorphous polysilicon material.

4. The method of claim 3, wherein performing the annealing operation comprises:
  performing the annealing operation at a temperature that is in a range of approximately 700 degrees Celsius to less than approximately 1410 degrees Celsius.

5. The method of claim 3, wherein the annealing operation results in the layer of amorphous polysilicon material being transformed into a layer of crystallized polysilicon material having a plurality of grain boundaries,
  wherein the dual RF source etch technique promotes uniformity of an etch rate through the plurality of grain boundaries.

6. The method of claim 1, wherein the dual RF source etch technique reduces line width roughness (LWR) for the one or more dummy gate structures and for the one or more metal gate structures.

7. The method of claim 1, further comprising:
  forming a plurality of patterning layers over the polysilicon layer; and
  forming, using an extreme ultraviolet (EUV) lithography system, a pattern in the plurality of patterning layers,
    wherein performing the dual RF source etch technique comprises:
      performing the dual RF source etch technique to etch the polysilicon layer to form the one or more dummy gate structures based on the pattern.

8. A method, comprising:
  forming a polysilicon layer over a plurality of fin structures of a semiconductor device and over one or more shallow trench isolation (STI) regions between the plurality of fin structures,
    wherein the polysilicon layer comprises an amorphous structure;
  performing an annealing operation to cause the amorphous structure of the polysilicon layer to transform into a crystalline structure of the polysilicon layer;
  etching, using a high-frequency radio frequency (RF) source, a top portion of the polysilicon layer;
  etching, using a low-frequency RF source, a bottom portion of the polysilicon layer after etching the top portion, wherein etching the top portion and the bottom portion of the polysilicon layer forms one or more dummy gate structures;
  forming a source/drain region of the semiconductor device after forming the one or more dummy gate structures; and
  removing the one or more dummy gate structures from the semiconductor device after forming the source/drain region.

9. The method of claim 8, wherein forming the polysilicon layer comprises:
  forming a first layer of amorphous polysilicon material;
  wherein performing the annealing operation comprises:
    performing a first annealing operation to remove defects from the first layer of amorphous polysilicon material,
      wherein the first annealing operation results in the first layer of amorphous polysilicon material being transformed into a first layer of crystallized polysilicon material;
  wherein forming the polysilicon layer further comprises:
    forming a second layer of amorphous polysilicon material on the first layer of crystallized polysilicon material; and
  wherein performing the annealing operation further comprises:
    performing a second annealing operation to remove defects from the second layer of amorphous polysilicon material,
      wherein the second annealing operation results in the second layer of amorphous polysilicon material being transformed into a second layer of crystallized polysilicon material.

10. The method of claim 8, wherein the top portion and the bottom portion of the polysilicon layer are etched using a plasma-based etch tool.

11. The method of claim 10, wherein etching the bottom portion of the polysilicon layer comprises:
  pulsing the low-frequency RF source to etch the bottom portion of the polysilicon layer and to enable etching byproducts to be removed during off durations of the low-frequency RF source.

12. The method of claim 10, further comprising:
  generating a plasma using an RF source; and
  using at least one of the high-frequency RF source or the low-frequency RF source to promote a flow of ions from the plasma toward the semiconductor device,
    wherein the RF source and at least one of the high-frequency RF source or the low-frequency RF source are phase delayed to reduce instability of the plasma.

13. The method of claim 10, wherein the bottom portion of the polysilicon layer is etched using the high frequency RF source and the low frequency RF source.

14. A method, comprising:
  forming a fin structure of a semiconductor device;
  forming a polysilicon layer over the fin structure,
    wherein the polysilicon layer wraps around at least three sides of the fin structure;
  forming one or more patterning layers over the polysilicon layer;
  forming a pattern in the one or more patterning layers; and
  performing, using a plasma-based etch tool, a dual radio frequency (RF) source etch technique in which a high-frequency RF source and a low-frequency RF source are selectively used to etch a top portion and a bottom portion of the polysilicon layer to form one or more dummy gate structures based on the pattern.

15. The method of claim 14, wherein the low-frequency RF source is operated in a frequency range of approximately 400 kilohertz to approximately 2 megahertz in the dual RF source etch technique.

16. The method of claim 14, wherein the pattern in the one or more patterning layer is formed using an extreme ultraviolet (EUV) lithography system, and the method further comprising:
  removing the one or more dummy gate structures from the semiconductor device after one or more subsequent processing operations that are performed after performing the dual RF source etch technique; and forming, after removal of the one or more dummy gate structures, one or more metal gate structures in place of the one or more dummy gate structures,
   wherein the dual RF source etch technique enables a metal gate structure of the one or more metal gate structures to be formed to a ratio, of a height of the metal gate structure to a width of the metal gate structure, that is in a range of approximately 18:1 to approximately 19:1.

17. The method of claim 16, wherein forming the one or more metal gate structures comprises:
   forming the metal gate structure to include a tapered region.

18. The method of claim 14, wherein forming the pattern in the one or more patterning layers comprises:
   forming, using an extreme ultraviolet (EUV) lithography system, the pattern in a photoresist layer of the one or more patterning layers; and
   forming, based on the photoresist layer, the pattern into one or more hard mask layers, of the one or more patterning layers, below the photoresist layer.

19. The method of claim 14, further comprising:
   performing an annealing operation to remove defects from the polysilicon layer,
   wherein performing the dual RF source etch technique comprises:
      performing the dual RF source etch technique after performing the annealing operation.

20. The method of claim 14, wherein forming the polysilicon layer comprises:
   forming a layer of amorphous polysilicon material; and
   performing an annealing operation to remove defects from the layer of amorphous polysilicon material.

* * * * *